(12) United States Patent
Masuoka et al.

(10) Patent No.: US 8,564,034 B2
(45) Date of Patent: Oct. 22, 2013

(54) SOLID-STATE IMAGING DEVICE

(75) Inventors: Fujio Masuoka, Tokyo (JP); Nozomu Harada, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

(21) Appl. No.: 13/606,823

(22) Filed: Sep. 7, 2012

(65) Prior Publication Data

US 2013/0062673 A1    Mar. 14, 2013

Related U.S. Application Data

(60) Provisional application No. 61/532,297, filed on Sep. 8, 2011.

(30) Foreign Application Priority Data

Sep. 8, 2011  (WO) .................. PCT/JP2011/070534

(51) Int. Cl.
*H01L 31/062* (2012.01)

(52) U.S. Cl.
USPC ...................... 257/291; 250/208.1; 250/214.1

(58) Field of Classification Search
USPC .......................... 257/223–225, 229, 291, 292; 250/208.1, 214.1
See application file for complete search history.

(56) References Cited

U.S. PATENT DOCUMENTS

| | | | |
|---|---|---|---|
| 5,017,977 A | 5/1991 | Richardson | |
| 5,258,635 A | 11/1993 | Nitayama et al. | |
| 5,308,782 A | 5/1994 | Mazure et al. | |
| 5,312,767 A | 5/1994 | Shimizu et al. | |
| 5,382,816 A | 1/1995 | Mitsui | |
| 5,416,350 A | 5/1995 | Watanabe | |
| 5,480,838 A | 1/1996 | Mitsui | |
| 5,627,390 A | 5/1997 | Maeda et al. | |

(Continued)

FOREIGN PATENT DOCUMENTS

| | | |
|---|---|---|
| CN | 1507035 | 6/2004 |
| CN | 1610126 A | 4/2005 |

(Continued)

OTHER PUBLICATIONS

Machine translation, Florian WO0122494 translated and compiled Jun. 18, 2013.*

(Continued)

*Primary Examiner* — Ha Tran T Nguyen
*Assistant Examiner* — Jordan Klein
(74) *Attorney, Agent, or Firm* — Brinks Hofer Gilson & Lione

(57) ABSTRACT

In a solid-state imaging device, a pixel has a first island-shaped semiconductor (P11) formed on a substrate (1) and a drive output circuit has second island-shaped semiconductors (4a to 4c) formed on the substrate at the same height as that of the first island-shaped semiconductor (P11). The first island-shaped semiconductor (P11) has a first gate insulating layer (6b) formed on an outer periphery thereof and a first gate conductor layer (105a) surrounding the first gate insulating layer (6b). The second island-shaped semiconductors (4a to 4c) have a second gate insulating layer (6a) formed on an outer periphery thereof and a second gate conductor layer (7a) surrounding the second gate insulating layer (6a). The first gate conductor layer (105a) and the second gate conductor layer (7a) have bottom portions located on the same plane.

9 Claims, 38 Drawing Sheets

(56) References Cited

U.S. PATENT DOCUMENTS

| | | |
|---|---|---|
| 5,656,842 A | 8/1997 | Iwamatsu et al. |
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,373,099 B1 | 4/2002 | Kikuchi et al. |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,891,225 B2 | 5/2005 | Horiguchi et al. |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 | 11/2009 | Horii |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,154,076 B2 | 4/2012 | Takaishi |
| 8,188,537 B2 | 5/2012 | Masuoka et al. |
| 8,227,305 B2 | 7/2012 | Forbes |
| 8,378,400 B2 | 2/2013 | Masuoka et al. |
| 8,482,047 B2 | 7/2013 | Abbott et al. |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 | 4/2009 | Takaishi |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1* | 8/2010 | Masuoka et al. ........... 250/208.1 |
| 2010/0200913 A1 | 8/2010 | Masuoka et al. |
| 2010/0207172 A1 | 8/2010 | Masuoka et al. |
| 2010/0207201 A1 | 8/2010 | Masuoka et al. |
| 2010/0207213 A1 | 8/2010 | Masuoka et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 | 4/1995 |
| JP | 07-321228 | 12/1995 |
| JP | 08-078533 A | 3/1996 |
| JP | 09-008295 | 1/1997 |

(56) References Cited

FOREIGN PATENT DOCUMENTS

| | | |
|---|---|---|
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Chen, Yijian et al., "Vertical integrated-gate CMOS for ultra-dense IC", *Microelectronic Engineering*, vol. 83, 2006, pp. 1745-1748.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Extended European Search Report for European Application No. 10009574.4, dated May 15, 2012, 6 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Search Report for International Application No. PCT/JP2007/071052, dated Jan. 29, 2008, 6 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Written Opinion of the International Searching Authority for International Application No. PCT/JP2007/071052, dated Jan. 29, 2008, 9 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Wu et al., "High Performance 22/20nm FinFET CMOS Devices with Advanced High-K/Metal Gate Scheme", IEEE, pp. 27.1.1-27.1.4, 2010.
Notice of Allowance for U.S. Appl. No. 13/043,081, dated Mar. 18, 2013, 6 pages.

(56) References Cited

OTHER PUBLICATIONS

Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
Choi, Yang-Kyu et al., "FinFET Process Refinements for Improved Mobility and Gate Work Function Engineering," IEEE, 2002, 4 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 12001395.8, dated Apr. 26, 2012, 7 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2008/051300, dated May 13, 2008, 4 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Nakamura, Jun-ichi et al., "Nondestructive Readout Mode Static Induction Transistor (SIT) Photo Sensors," IEEE Transactions on Electron Devices, 1993, vol. 40, pp. 334-341.
Non-Certified Partial Translation of Office Action from counterpart Korean Application No. 10-2010-7018204, dated Mar. 29, 2012, 1 page.
Notice of Allowance for U.S. Appl. No. 12/700,294, dated Oct. 5, 2012, 7 pages.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Office Action from co-pending U.S. Appl. No. 12/704,935, dated Nov. 18, 2011, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.

Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2008/051300, dated Aug. 30, 2010, 8 pages.
Written Opinion of the International Searching Authority for International Application No. PCT/JP2008/058412, dated Jun. 10, 2008, 4 pages.
Written Opinion of the International Searching Authority for International Application No. PCT/JP2009/058629, dated Jun. 2, 2009, 4 pages.
Written Opinion of the International Searching Authority for International Application No. PCT/JP2009/051459, dated Aug. 30, 2010, 8 pages.
Wuu, S.G. et al., "A Leading-Edge 0.9 μm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuites Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Office Action for U.S. Appl. No. 13/917,040 dated Aug. 6, 2013, 5 pages.
Notice of Allowance for U.S. Appl. No. 12/704,935, dated May 16, 2013, 10 pages.
Notice of Allowance for U.S. Appl. No. 13/046,113, dated May 13, 2013, 10 pages.
Notice of Allowance for U.S. Appl. No. 13/412,959, dated May 8, 2013, 9 pages.
Notice of Allowance for U.S. Appl. No. 12/894,923, dated Jul. 2, 2013, 9 pages.
Office Action for U.S. Appl. No. 13/116,506, dated Jul. 18, 2013, 12 pages.
English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.

* cited by examiner

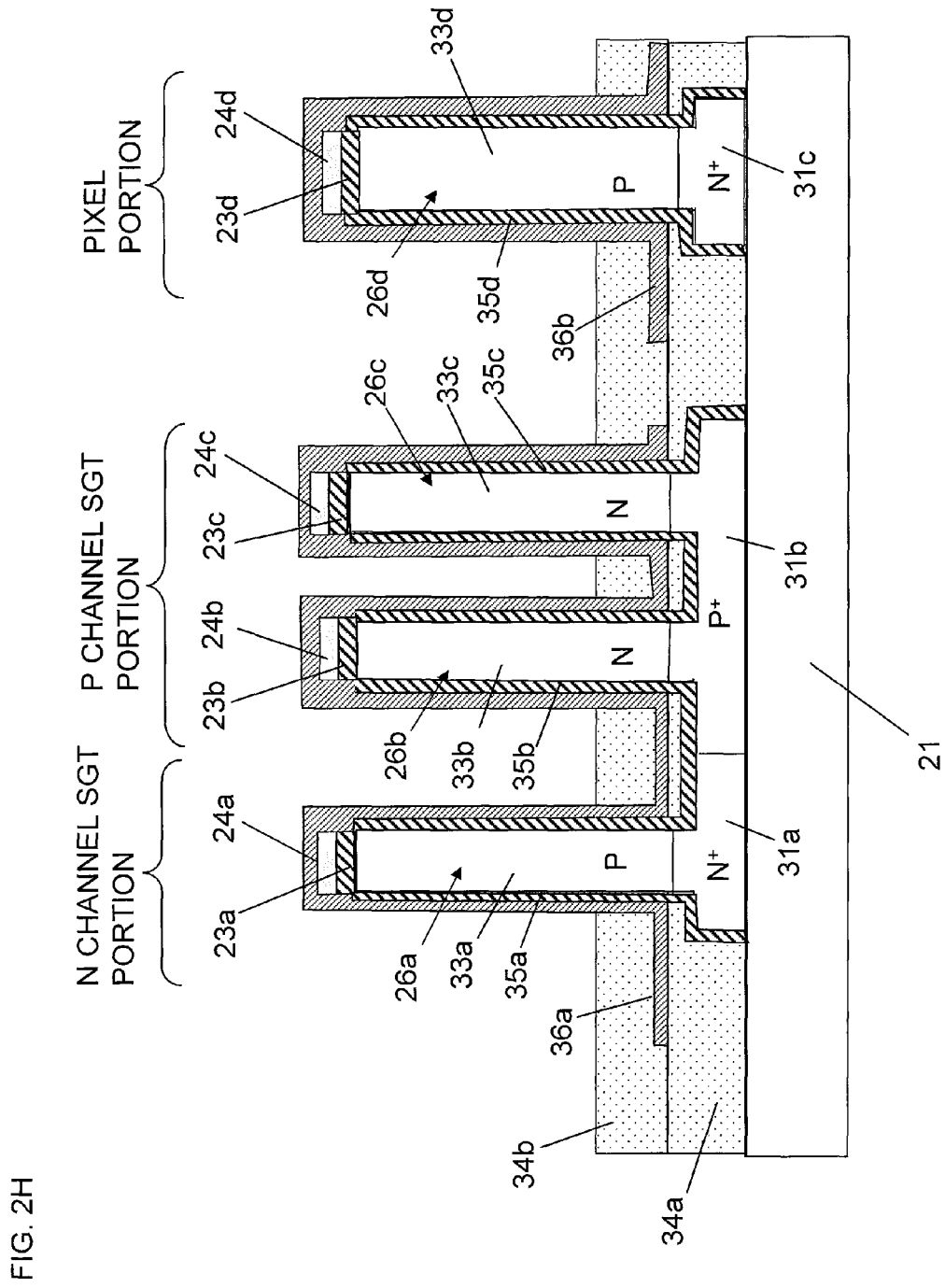

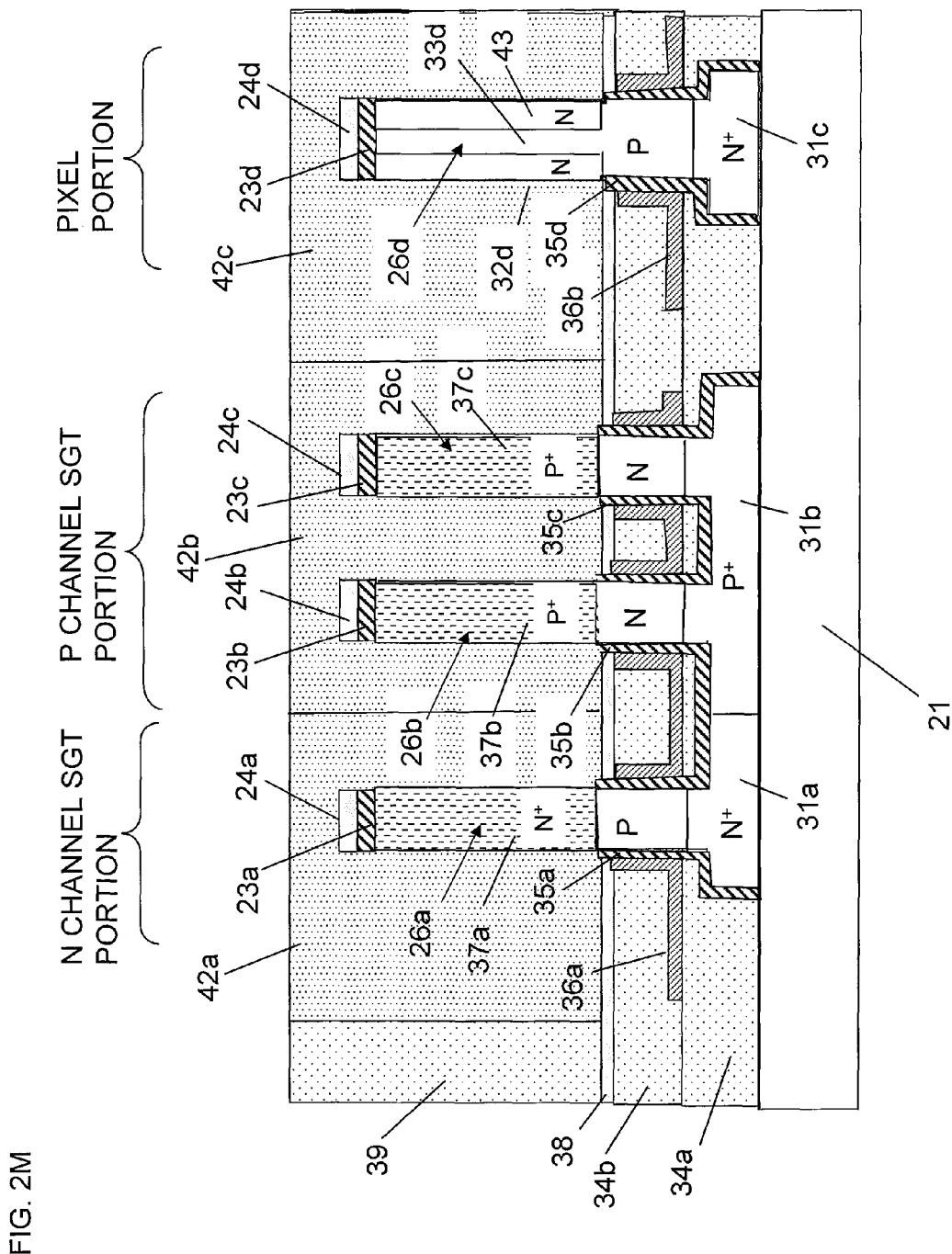

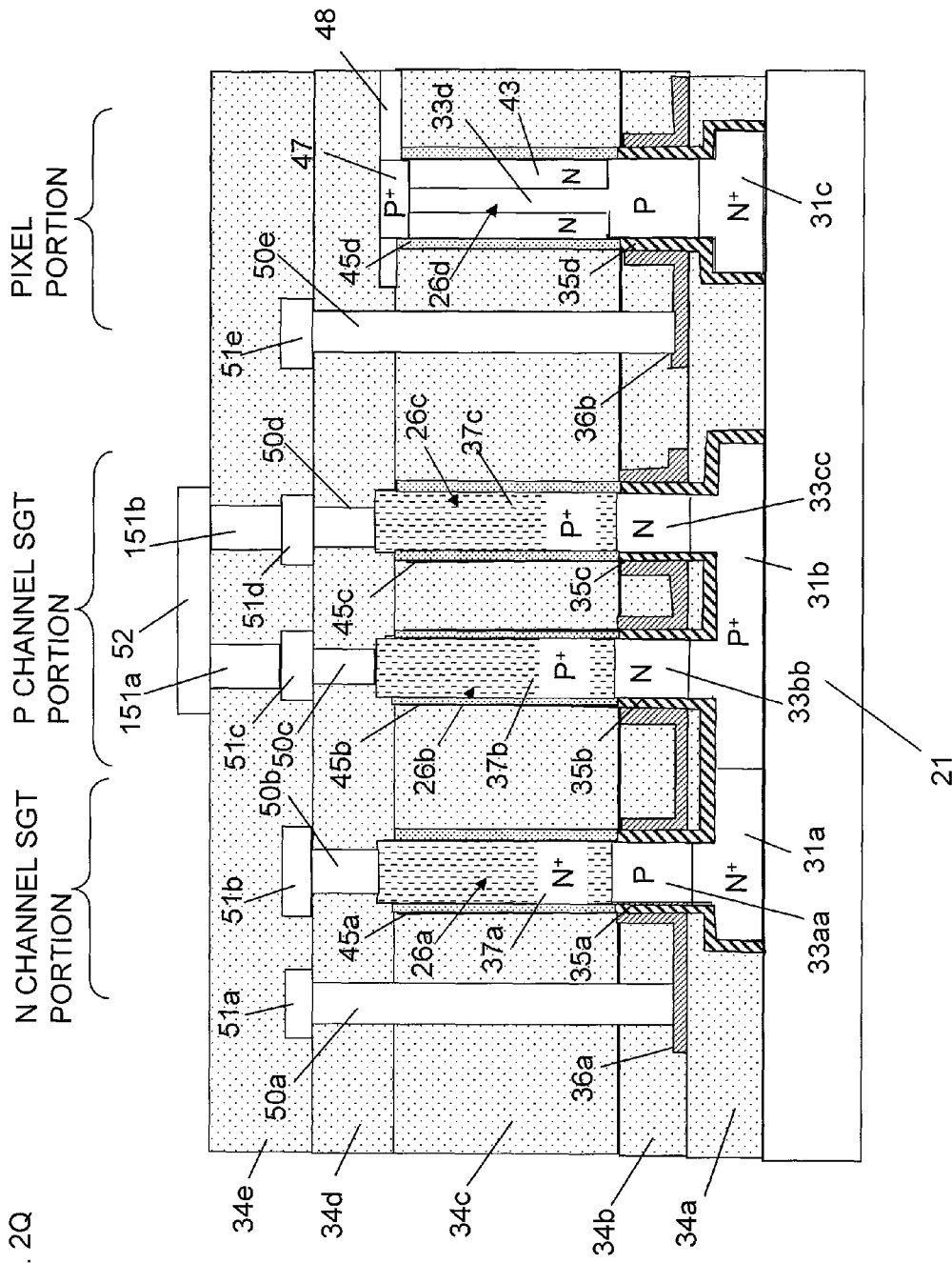

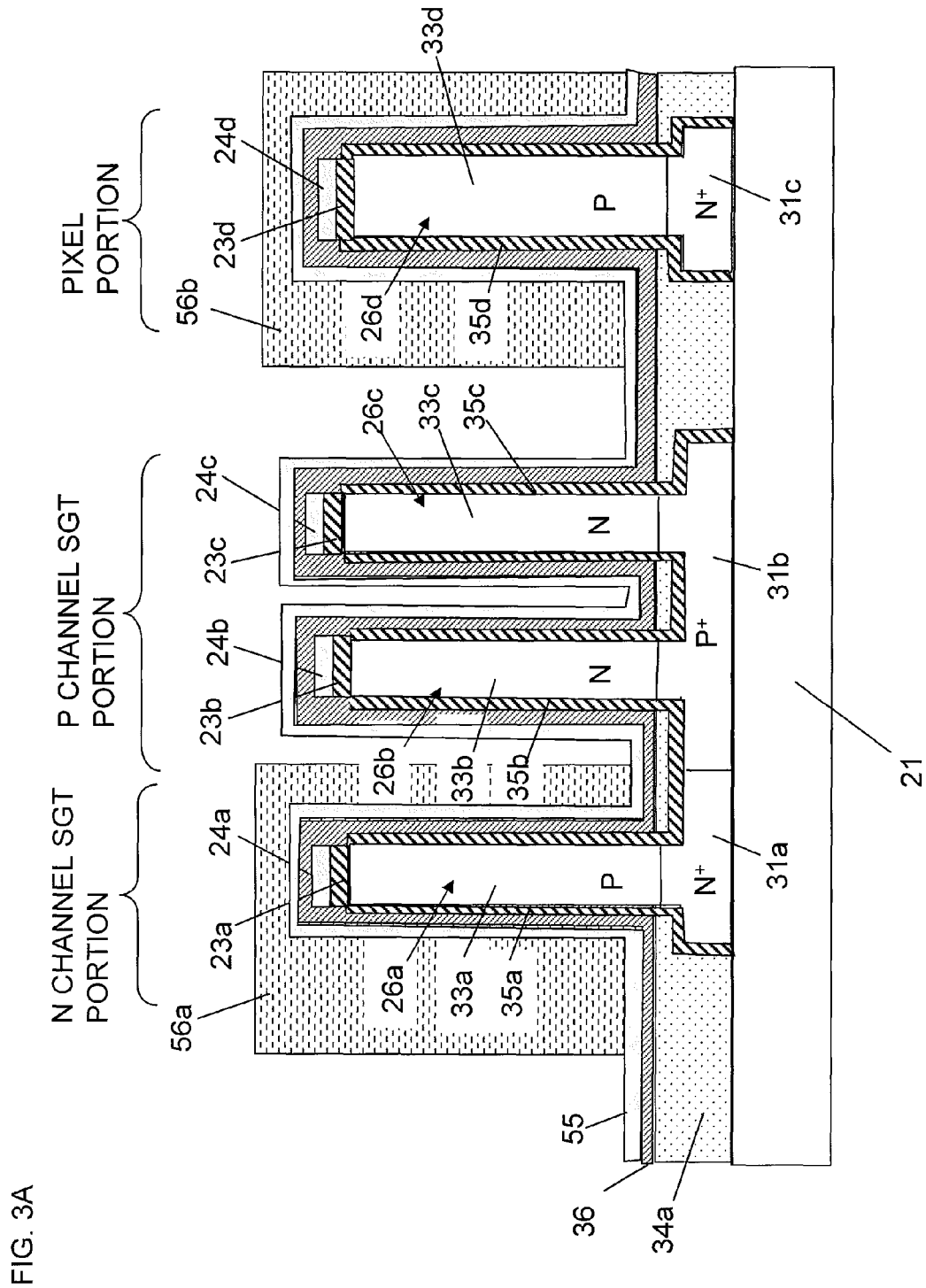

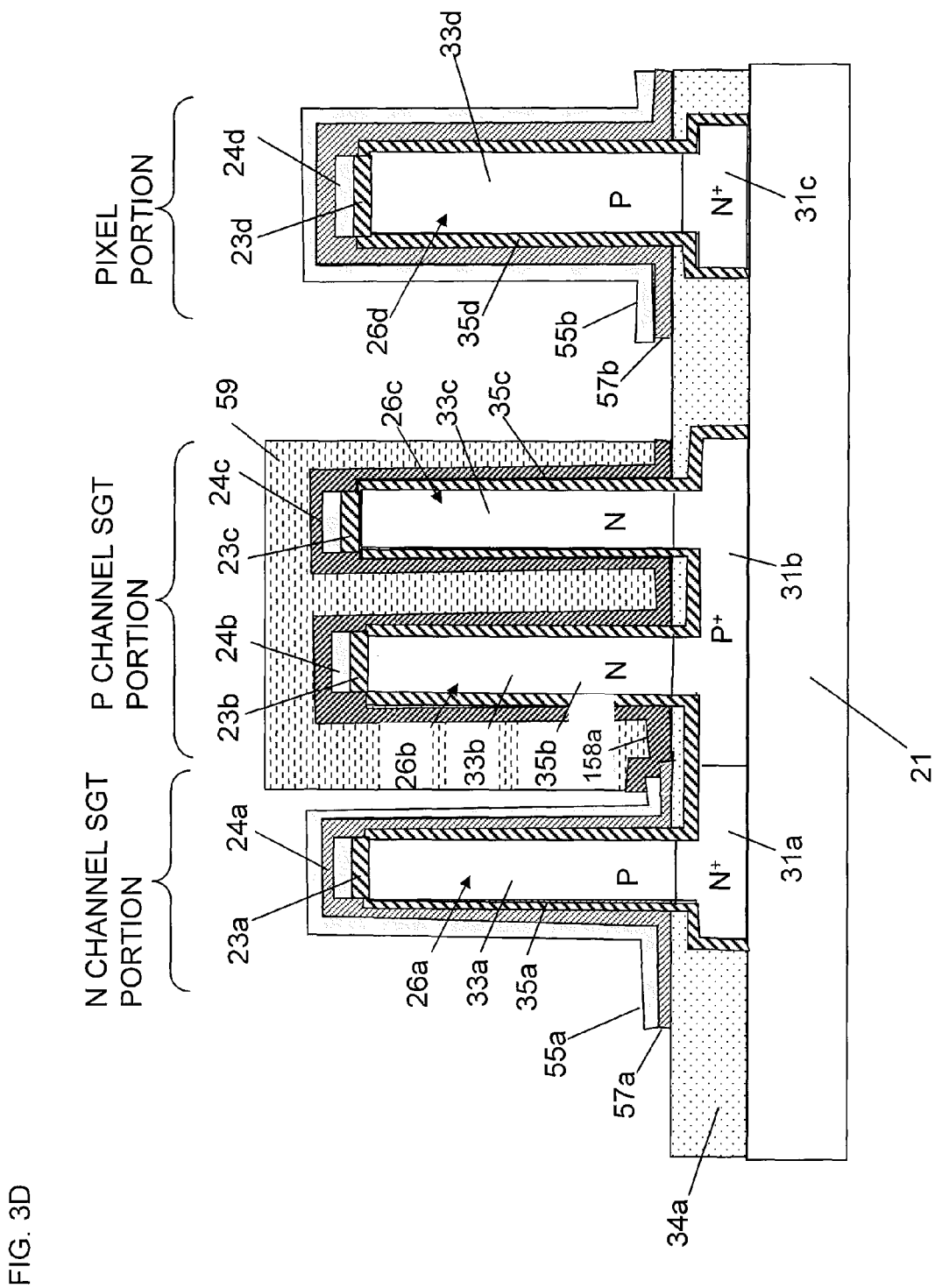

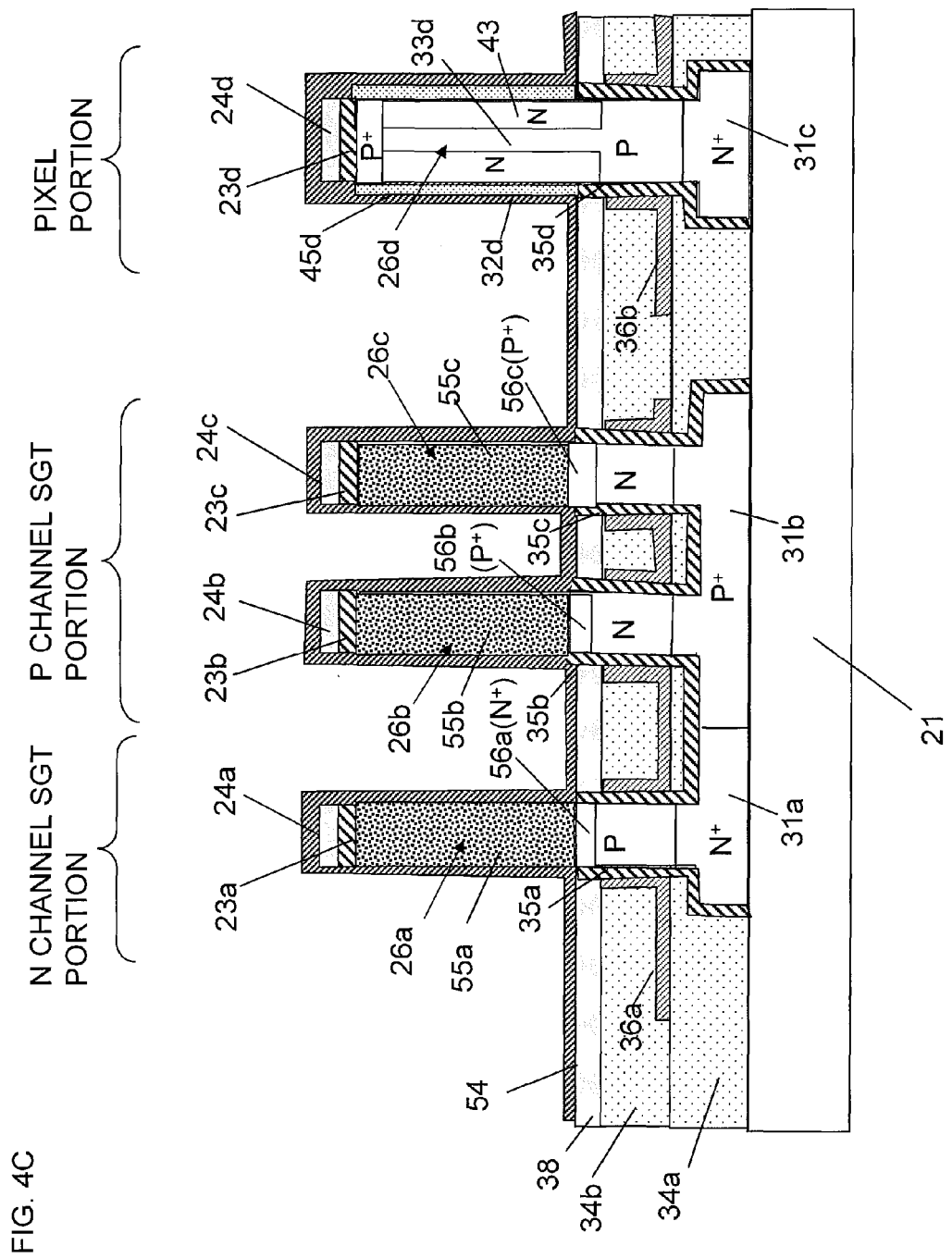

US 8,564,034 B2

SOLID-STATE IMAGING DEVICE

RELATED APPLICATIONS

Pursuant to 35 U.S.C. §119(e), this application claims the benefit of the filing date of Provisional U.S. Patent Application Ser. No. 61/532,297 filed on Sep. 8, 2011. This application also claims priority under 35 U.S.C. §365(a) to PCT/JP2011/070534 filed on Sep. 8, 2011. The entire contents of these applications are hereby incorporated by reference.

BACKGROUND OF THE INVENTION

1. Field of the Invention

The present invention relates to a solid-state imaging device that includes a SGT (surrounding gate transistor) in which a channel region is formed in a semiconductor having an island-shaped semiconductor structure and to a solid-state imaging device that has pixels and a drive output circuit.

2. Description of the Related Art

Currently, CMOS solid-state imaging devices are widely used in video cameras, still cameras, etc. These solid-state imaging devices are constituted by pixels and a drive output circuit connected to the pixel. Improvements of performances of solid-state imaging devices, such as increasing the pixel density, increasing the resolution, decreasing mixing of colors in color imaging, and increasing the sensitivity, have always been demanded. To meet this demand, in order to increase resolution of solid-state imaging devices, technical innovations are achieved by increasing the pixel density.

A solid-state imaging device according to a known example is shown in FIGS. 8A to 8D.

FIG. 8A is a cross-sectional structural diagram of a solid-state imaging device of a known example, in which one pixel is constituted by one island-shaped semiconductor 100 (for example, refer to International Publication No. 2009/034623).

As shown in FIG. 8A, in this island-shaped semiconductor 100 constituting the pixel, a signal line $N^+$ region 102 (hereinafter, an "$N^+$ region" means a semiconductor region containing a donor impurity in large amounts) is formed on a substrate 101. A P region 103 (hereinafter a semiconductor region containing an acceptor impurity is referred to as a "P region") is formed on the signal line $N^+$ region 102, an insulating layer 104 is formed on an outer peripheral portion of the P region 103, and a gate conductor layer 105 is formed so that the insulating layer 104 is interposed. An N region (hereinafter a semiconductor region containing a donor impurity is referred to as an "N region") 106 is formed in an outer peripheral portion of the P region 103 at a position above the gate conductor layer 105. A $P^+$ region (hereinafter, a semiconductor region containing an acceptor impurity in a large amount is referred to as a "$P^+$ region") 107 is formed on the N region 106 and the P region 103 and in the upper portion of the island-shaped semiconductor 100. The $P^+$ region 107 is connected to a pixel selection line conductor layer 108. The insulating layer 104 is formed so as to be continuous and surrounds the outer peripheral portion of the island-shaped semiconductor 100. Similarly, the gate conductor layer 105 is also formed so as to be continuous and surrounds the outer peripheral portion of the island-shaped semiconductor 100.

In this solid-state imaging device, incoming light is applied from the $P^+$ region 107 side at the top surface of the island-shaped semiconductor 100. A photodiode region constituted by the P region 103 and the N region 106 is formed inside the island-shaped semiconductor 100, and signal charges (free electrons here) are generated in a photoelectric conversion region in the photodiode region by application of light. The signal charges are accumulated in the N region 106 of the photodiode region. In the island-shaped semiconductor 100, a junction transistor that uses the N region 106 as a gate, the $P^+$ region 107 as a source, and the P region 103 near the signal line $N^+$ region 102 as a drain is constructed. A drain-source current (output signal) of the junction transistor changes in response to the signal charge amount accumulated in the N region 106, is output from the signal line $N^+$ region 102 to outside, and is read out. Moreover, in the island-shaped semiconductor 100, a reset MOS transistor that uses the N region 106 of the photodiode region as a source, the gate conductor layer 105 as a reset gate, the signal line $N^+$ region 102 as a drain, and the P region 103 between the N region 106 and the signal line $N^+$ region 102 as a channel is formed (hereinafter, this gate conductor layer is referred to as "reset gate conductor layer"). The signal charges accumulated in the N region 106 are discharged to the signal line $N^+$ region 102 when a plus ON voltage is applied to the reset gate conductor layer 105 of the reset MOS transistor.

Imaging operation of this solid-state imaging device is constituted by the following operations. That is, the imaging operation is constituted by a signal charge accumulating operation of accumulating signal charges, which are generated in a photoelectric conversion region (photodiode region) due to application of a light beam entering from the top surface of the island-shaped semiconductor 100, in the N region 106 while a ground voltage (0V) is being applied to the signal line $N^+$ region 102, the reset gate conductor layer 105, and the $P^+$ region 107; signal charge read-out operation of reading out, as a signal current, a source-drain current of a junction transistor modulated by a potential of the N region 106 changing in response to the accumulated signal charge amount while a ground voltage is being applied to the signal line $N^+$ region 102 and the reset gate conductor layer 105 and a plus voltage is being applied to the $P^+$ region 107; and a reset operation of discharging the signal charges accumulated in the N region 106 to the signal line $N^+$ region 102 while a ground voltage is being applied to the $P^+$ region 107 and a plus voltage is being applied to the gate conductor layer 105 and the signal line $N^+$ region 102 after the signal charge read-out operation.

FIG. 8B is a schematic plan view of a solid-state imaging device that has a drive output circuit around a pixel region in which island-shaped semiconductors P11 to P33 (corresponding to the island-shaped semiconductor 100 in FIG. 8A) constituting pixels are arranged in a two-dimensional array (for example, refer to Japanese Unexamined Patent Application Publication No. 2009-182317).

As shown in FIG. 8B, the island-shaped semiconductors P11 to P33 constituting the pixels are formed on signal line $N^+$ regions 102a, 102b, and 102c (corresponding to 102 in FIG. 8A). Pixel selection line conductor layers 108a, 108b, and 108c (corresponding to 108 in FIG. 8A) are formed for horizontal rows of the pixel island-shaped semiconductors P11 to P33 so as to be connected, and are connected to a pixel selection line vertical scanning circuit 110 provided near the pixel region. Similarly, reset gate conductor layers 105a, 105b, and 105c (corresponding to the gate conductor layer 105 in FIG. 8A) are formed for horizontal rows of the island-shaped semiconductors P11 to P33 so as to be connected, and are connected to a reset line vertical scanning circuit 112 provided near the pixel region. The reset line vertical scanning circuit 112 is constituted by CMOS inverter circuits 113a, 113b, and 113c constituted by SGTs connected to the reset gate conductor layers 105a, 105b, and 105c and a shift register 114 connected to the CMOS inverter circuits 113a, 113b, and 113c. The CMOS inverter circuits 113a, 113b, and 113c are configured such that two P channel SGTs and one N channel SGT are used. When a low-level voltage is applied from the shift register 114 to input terminals of the CMOS inverter circuits 113a, 113b, and 113c, a reset ON voltage $V_{RH}$ is applied from the output terminal to the reset gate conductor layers 105a, 105b, and 105c; in contrast, when a high-level voltage is applied, a reset OFF voltage $V_{RL}$ is applied from the output terminal to the reset gate conductor layers 105a, 105b, and 105c. Lower portions of the signal line $N^+$ regions 102a, 102b, and 102c are connected to switch SGTs 115a, 115b, and 115c, and the gates of the switch SGTs 115a, 115b, and 115c are connected to a signal line horizontal scanning circuit 116. The drains of the switch SGTs 115a, 115b, and 115c are connected to an output circuit 117. Switch circuits 118a, 118b, and 118c to which a ground voltage (0 V) is applied during the signal charge accumulating operation, floating is applied during the signal charge read-out operation, and a reset voltage $V_{RD}$ is applied during the signal charge discharge operation are formed so as to be connected to upper portions of the signal line $N^+$ regions 102a, 102b, and 102c.

Here, SGT (surrounding gate transistor) refers to a transistor having a structure in which a gate conductor layer is formed on the outer periphery of a silicon pillar with a gate insulating layer therebetween.

The signal charge accumulating operation is carried out in a state in which an OFF voltage is applied from the signal line horizontal scanning circuit 116 to the gates of the switch SGTs 115a, 115b, and 115c and the switch circuits 118a, 118b, and 118c are switched to the ground voltage side so that the signal line $N^+$ regions 102a, 102b, and 102c are at the ground voltage, in a state in which a reset OFF voltage $V_{RL}$ is applied to the reset gate conductor layers 105a, 105b, and 105c, and in a state in which a ground voltage is applied to the pixel selection line conductor layers 108a, 108b, and 108c.

The signal charge read-out operation is carried out when a source-drain current of the junction transistor of a pixel to be read out is captured by the output circuit 117 in a state in which a reset OFF voltage $V_{RL}$ is applied to the reset gate conductor layers 105a, 105b, and 105c, a high-level voltage is applied to the pixel selection line conductor layers 108a, 108b, and 108c of the pixel to be read, an ON voltage is applied to the gates of the switch SGTs 115a, 115b, and 115c connected to the signal line $N^+$ regions 102a, 102b, and 102c of the pixel to be read, the output terminals of the switch circuits 118a, 118b, and 118c are floating, and the input terminal of the output circuit 117 is at a low-level voltage.

The signal charge discharge operation is carried out by applying a reset-ON voltage to the reset gate conductor layers 105a, 105b, and 105c connected to the island-shaped semiconductors P11 to P33 of the pixel from which the accumulated signal charges are to be removed so that the output terminals of the switch circuits 118a, 118b, and 118c are at the reset voltage $V_{RD}$ while all the pixel selection line conductor layers 108a, 108b, and 108c are at the ground voltage and all the switch SGTs 115a, 115b, and 115c are OFF.

FIG. 8C is a schematic plan view of a region A surrounded by two-dot chain line in FIG. 8B. The island-shaped semiconductor P11 constituting a pixel is formed on the signal line $N^+$ region 102a, an island-shaped semiconductor 119a constituting the N channel SGT of the CMOS inverter circuit 113a is formed on a first semiconductor layer 120a, and island-shaped semiconductors 119b and 119c constituting the P-channel SGTs are formed on a second semiconductor layer 120b. A P well region 121a is formed on (overwrapping in the drawing) the first semiconductor layer 120a so as to be connected to the lower portion of the island-shaped semiconductor 119a constituting the N-channel SGT. An N well region 121b is formed on (overwrapping in the drawing) the second semiconductor layer 120b so as to be connected to lower portions of the island-shaped semiconductors 119b and 119c constituting the P-channel SGTs. The lower portion of the island-shaped semiconductor 119a constituting the N channel SGT and an $N^+$ region 122a connected to the lower portion are formed in the P well region 121a. The lower portions of the island-shaped semiconductors 119b and 119c constituting the P channel SGT and a $P^+$ region 122b connected to the lower portions are formed in the N well region 121b. A drain $N^+$ region 123a of the N channel SGT is formed in the upper portion of the island-shaped semiconductor 119a for the N channel and this drain $N^+$ region 123a is connected to a first metal wiring layer 125a (illustrated by a one-dot chain line), to which a reset OFF voltage $V_{RL}$ is applied, via a contact hole 124a.

Drain $P^+$ regions 123b and 123c of the P channel SGTs are formed in the upper portions of the island-shaped semiconductors 119b and 119c for the P channels, and these drain $P^+$ regions 123b and 123c are connected to a first metal wiring layer 125b (illustrated by a one-dot chain line), to which a reset ON voltage $V_{RH}$ is applied, via contact holes 124b and 124c. The N channel SGT-P channel SGT gate conductor layer 126 is formed so as to be continuous, and this gate conductor layer 126 is connected to a first metal wiring layer 125c (illustrated by a one-dot chain line) connected to the shift register 114 via a contact hole 127a. The reset gate conductor layer 105a of the island-shaped semiconductor P11 constituting a pixel is connected to the drain $P^+$ region 122b of the P channel SGT via a first metal wiring layer 125e (illustrated by a one-dot chain line) and contact holes 127e and 127f. The source $N^+$ region 122b of the P channel SGT is connected to the drain $N^+$ region 122a of the N channel SGT via the first metal wiring layer 125b (illustrated by a one-dot chain line) and contact holes 127b and 127d. The P well region 121a is connected to a second metal wiring layer 128a (illustrated by a chain line) on the first metal wiring layers 125a, 125b, 125c, 125d, and 125e via a contact hole 127c. The N well region 121b is connected to a second metal wiring layer 128b (illustrated by a chain line) on the first metal wiring layers 125a, 125b, 125c, 125d, and 125e via the contact hole 127e.

FIG. 8D is a cross-sectional structural diagram taken along line B-B' in FIG. 8C. The cross-sectional structure of the island-shaped semiconductor P11 constituting a pixel is the same as that shown in FIG. 8A. The signal line $N^+$ region 102a of the pixel, the first semiconductor layer 120a, and the second semiconductor layer 120b are formed on the substrate 100 (e.g., $SiO_2$ layer). The island-shaped semiconductor P11 constituting the pixel is formed on the signal line $N^+$ region 102a, the island-shaped semiconductor 119a constituting an N channel SGT is formed on the first semiconductor layer 120a, and the island-shaped semiconductors 119b and 119c constituting P channel SGTs are formed on the second semiconductor layer 120b. The P well region 121a is formed in the upper portion of the first semiconductor layer 120a, and the N well region 121b is formed in the upper portion of the second semiconductor layer 120b. The source $N^+$ region 122a is formed in the upper portion of the P well region 121a and below the island-shaped semiconductor 119a constituting the N channel SGT. The source $P^+$ region 122b is formed in the upper portion of the N well region 121b and below the island-shaped semiconductors 119b and 119c constituting the P channel SGTs. The drain $N^+$ region 123a is formed in the upper portion of the island-shaped semiconductor 119a constituting the N channel SGT. The drain P+ regions 123b and 123c are formed in the upper portions of the island-shaped semiconductors 119b and 119c constituting the P channel SGTs. The channel of the N channel SGT between the source and drain N+ regions 122a and 123a of the island-shaped semiconductor 119a constituting the N channel SGT is a P region 131a, and the channels of the P channel SGT between the source and drain P+ regions 122b and 123b and 123c of the island-shaped semiconductors constituting the P channel SGTs are the N regions 131b and 131c. An N channel SGT gate insulating layer 129a is formed on the outer peripheral portion of the island-shaped semiconductor 119a constituting the N channel SGT, and an insulating layer 132a is formed on the outer periphery of the first semiconductor layer 120a so as to connect to this N channel SGT gate insulating layer 129a.

P-channel SGT gate insulating layers 129b and 129c are formed on outer peripheral portions of the island-shaped semiconductors 119a and 119c constituting the P channel SGTs, and an insulating layer 132b is formed on the outer peripheral portion of the second semiconductor layer 120b connected to the P-channel SGT gate insulating layers 129b and 129c constituting the P channel SGTs. The reset gate conductor layer 105a of the reset MOS transistor connected to the outer peripheral portion of the island-shaped semiconductor P11 constituting the pixel is connected to the first metal wiring layer 125e via the contact hole 127f, and the first metal wiring layer 125e is connected to, via the contact hole 127b, the source P+ region 122b connected to the lower portions of the island-shaped semiconductors 119b and 119c constituting the P channel SGTs. The N channel SGT-P channel SGT gate conductor layer 126 is connected between the island-shaped semiconductor 119a constituting the N channel SGT and the island-shaped semiconductors 119b and 119c constituting the P channel SGTs and to the outer peripheries of the P-channel SGT gate insulating layers 129b and 129c and is connected to, via the contact hole 127a, the first metal wiring layer 125c connected to the shift register circuit.

The drain N+ region 123a is connected to the first metal wiring layer 125a, to which a reset OFF voltage $V_{RL}$ is applied, via the contact hole 124a. The drain P+ regions 123b and 123c of the P channel SGTs are connected to the first metal wiring layer 125b, to which a reset ON voltage $V_{RH}$ is applied, via the contact holes 124b and 124c. A first interlayer insulating layer 130a, a second interlayer insulating layer 130b, a third interlayer insulating layer 130c, a fourth interlayer insulating layer 130d, and a fifth interlayer insulating layer 130e are formed on the substrate 100 and between the first semiconductor layer 120a, the second semiconductor layer 120b, the signal line N+ region 102a, the island-shaped semiconductor 119a constituting the N channel SGT, the island-shaped semiconductors 119b and 119c constituting the P channel SGTs, and the island-shaped semiconductor P11 constituting the pixel. The reset gate conductor layer 105a of the pixel is wired on the first interlayer insulating layer 130a, the P channel-N channel SGT gate conductor layer 126 is wired on the second interlayer insulating layer 130b, the pixel selection line conductor layer 108a is wired on the third interlayer insulating layer 130c, the first metal wiring layers 125a, 125b, 125c, and 125e are formed on the fourth interlayer insulating layer 130d, and the second metal wiring layer 128a connected to the P well region 121a and the second metal wiring layer 128b connected to the N well region 121b are formed on the fifth interlayer insulating layer 130e.

As shown in the cross-sectional structural diagram of FIG. 8D, whereas the reset gate conductor layer 105a of the reset MOS transistor in the island-shaped semiconductor P11 constituting the pixel is located at the bottom portion of the island-shaped semiconductor P11 constituting the pixel, the SGT gate conductor layer 126 of the CMOS inverter circuit 113a is located at the bottom portions of the island-shaped semiconductors 119a, 119b, and 119c constituting the SGTs on the first and second semiconductor layers 120a and 120b. The photodiode region of the island-shaped semiconductor P11 constituting the pixel is required to have a height of 2.5 to 3 μm in order to efficiently absorb light incident from the upper surface of the island-shaped semiconductor P11 constituting the pixel (refer to G. Agranov, R. Mauritzson, J. Ladd, A. Dokoutchaev, X. Fan, X. Li, Z. Yin, R. Johnson, V. Lenchenkov, S. Nagaraja, W. Gazeley, J. Bai, H. Lee, Yoshinori Takizawa; "Pixel size reduction of CMOS image sensors and comparison of characteristics", The Institute of Image Information and television Engineers (ITE) Technical Report Vol. 33, No. 38, pp. 9-12 (September 2009)).

In contrast, the height of the reset gate conductor layer 105a and the SGT gate conductor layer 126 is about 0.1 μm or may be less. Usually, semiconductor layers 120a and 120b having the same thickness as the total thickness of the signal line N+ region 102a and the island-shaped semiconductor P11 constituting the pixel are first formed in the drive output circuit region including the CMOS inverter circuit 113a, and then an island-shaped semiconductor P11 constituting the pixel and island-shaped semiconductors 119a and 119b constituting the SGTs are formed. Accordingly, a height difference substantially equal to the height of the island-shaped semiconductor P11 constituting the pixel is inevitably generated at the height-direction position of the reset gate conductor layer 105a of the island-shaped semiconductor P11 constituting the pixel and the SGT gate conductor layer 126. Since the reset gate conductor layer 105a is formed on the first interlayer insulating layer 130a and the SGT gate conductor layer 126 is formed on the second interlayer insulating layer 130b, the reset gate conductor layer 105a and the SGT gate conductor layer 126 must be formed separately. Likewise, the signal line N+ region 102a and the N+ region 122a of the N channel SGT must be formed separately. Accordingly, production of this solid-state imaging device requires a step of forming SGTs constituting the drive output circuit in addition to the step of forming the structure of the island-shaped semiconductor P11 constituting the pixel. This leads to a decrease in yield and an increase in cost of the solid-state imaging device.

In FIGS. 8C and 8D, the P well region 121a and the N well region 121b are formed on the first and second semiconductor layers 120a and 120b. Because of the presence of the P well region 121a and the N well region 121b, an electric current generated by leaking light incident on the first and second semiconductor layers 120a and 120b is prevented from flowing into the source N+ region 122a of the N channel SGT and the source P+ region 122b of the P channel SGT, thereby suppressing malfunctions of the CMOS inverter circuit 113a. Moreover, when, for example, a ground voltage is applied to the second metal wiring layers 128a and 128b connected to the P well region 121a and the N well region 121b via the contact holes 127c and 127e, the source N+ region 122a of the N channel SGT and the source P+ region 122b of the P channel SGT are separated from the electrically floating first and second semiconductor layers 120a and 120b, thereby enabling more stable operation of the CMOS inverter circuit 113a.

The N channel and P channel SGTs are also formed in drive output circuits other than the CMOS inverter circuit 113a, i.e., the shift register 114 of the reset line vertical scanning circuit 112, the selection line vertical scanning circuit 110, the horizontal scanning circuit 116, the output circuit 117, the switch SGTs 115a, 115b, and 115c, and the switch circuits 118a, 118b, and 118c; hence, problems leading to a decrease in yield and an increase in cost of the solid-state imaging device will arise.

In the solid-state imaging device of a known example, the reset gate conductor layer 105a of the reset MOS transistor of the island-shaped semiconductor P11 constituting the pixel is in the bottom portion of the island-shaped semiconductor P11 constituting the pixel whereas the SGT gate conductor layer 126 of the drive output circuit is located on the island-shaped semiconductors 119a and 119b that constitute the SGTs on the first and second semiconductor layers 120a and 120b and lie at substantially the same height as the upper surface of the island-shaped semiconductor P11 constituting the pixel. The height difference between the gate conductor layer 105 of the reset MOS transistor and the SGT gate conductor layer 126 of the drive output circuit is as large as 2.5 to 3 μm which is required as the photodiode region of the island-shaped semiconductor P11 constituting the pixel. Moreover, the reset gate conductor layer 105a of the reset MOS transistor and the SGT gate conductor layer 126 of the drive output circuit are formed on the different interlayer insulating layers 130a and 130b. Thus, inevitably, the reset gate conductor layer 105a of the reset MOS transistor and the SGT gate conductor layer 126 of the drive output circuit must be formed separately. Similarly, the signal line $N^+$ region 102a and the source $N^+$ region 122a of the N channel SGT must be formed separately. Accordingly, production of the solid-state imaging device requires a step of forming SGTs in the drive output circuit in addition to the step of forming the island-shaped semiconductor P11 constituting the pixel. This leads to a decrease in yield and an increase in cost of the solid-state imaging device. To address this, a solid-state imaging device in which the island-shaped semiconductor P11 constituting the pixel and the SGTs constituting the drive output circuit are formed on the same substrate 100 and which can suppress the decrease in yield and the increase in cost is desirable.

SUMMARY OF THE INVENTION

The present invention has been made under the above-described circumstances and aims to realize a solid-state imaging device that can suppress the decrease in yield and the increase in cost.

To achieve the object a solid-state imaging device of the present invention includes pixels arranged in a two-dimensional array and a drive output circuit that drives the pixels and reads out signals from the pixels, the pixels including a first island-shaped semiconductor formed on a substrate, the drive output circuit including at least one second island-shaped semiconductor formed on the substrate so as to be at the same height as the first island-shaped semiconductor, the first island-shaped semiconductor including a first semiconductor region formed in a bottom portion of the first island-shaped semiconductor, a second semiconductor region formed on the first semiconductor region and composed of a semiconductor having a conductivity type opposite to that of the first semiconductor region or an intrinsic semiconductor, a first gate insulating layer formed on an outer periphery of and on a lower portion of the second semiconductor region, a first gate conductor layer formed so as to surround the first gate insulating layer, a third semiconductor region formed in an outer peripheral portion of the second semiconductor region adjacent to the first gate conductor layer, the third semiconductor region being formed of a semiconductor having the same conductivity type as the first semiconductor region, and a fourth semiconductor region formed on the third semiconductor region and the second semiconductor region and composed of a semiconductor having a conductivity type opposite to that of the first semiconductor region, the second island-shaped semiconductor including a fifth semiconductor region formed in a lower portion of the second island-shaped semiconductor, a sixth semiconductor region formed on the fifth semiconductor region and composed of a semiconductor having a conductivity type opposite to that of the fifth semiconductor region or an intrinsic semiconductor, a second gate conductor layer formed so as to surround a second gate insulating layer formed on an outer periphery of the sixth semiconductor region, and a seventh semiconductor region formed on the sixth semiconductor region so as to be adjacent to the second gate conductor layer and be positioned above the second semiconductor region, wherein the first gate conductor layer and the second gate conductor layer have bottom portions located on the same plane.

The first gate conductor layer and the second gate conductor layer may have the same height.

The second gate conductor layer may include a third gate conductor layer formed so as to surround some of the second island-shaped semiconductors among a plurality of the second island-shaped semiconductors described above and a fourth gate conductor layer that is composed of a material different from that of the third gate conductor layer and formed so as to surround the second island-shaped semiconductors different from the second island-shaped semiconductors surrounded by the third gate conductor layer among the second island-shaped semiconductors.

The third gate conductor layer and the fourth gate conductor layer may have heights different from each other.

The third gate conductor layer and the fourth gate conductor layer may have the same height.

In the second island-shaped semiconductor, the seventh semiconductor region may be formed on the sixth semiconductor region and a conductor layer formed of a silicide layer or a metal layer may be formed on the seventh semiconductor region.

In the second island-shaped semiconductor, a metal layer may be provided so as to surround the sixth semiconductor region.

The solid-state imaging device may include the first island-shaped semiconductor, the second island-shaped semiconductor, and a third island-shaped semiconductor formed at the same height as the first and second island-shaped semiconductors, at least one of the first gate conductor layer formed so as to surround the first island-shaped semiconductor and the second gate conductor layer formed so as to surround the second island-shaped semiconductor may extend so as to surround the third island-shaped semiconductor, and at least one of the first gate conductor layer and the second gate conductor layer may be electrically connected to a conductor layer formed inside the third island-shaped semiconductor and at a lower portion of the third island-shaped semiconductor.

A conductor layer formed inside the third island-shaped semiconductor may be connected, at a lower portion of the third island-shaped semiconductor, to at least one of the first semiconductor region and the fifth semiconductor region.

According to the present invention, a solid-state imaging device that enables higher pixel integration, higher sensitivity, and cost reduction can be provided.

BRIEF DESCRIPTION OF THE DRAWINGS

FIG. 2H is a cross-sectional structural diagram illustrating a production method for a pixel and a CMOS inverter circuit of a solid-state imaging device according to the first embodiment;

FIG. 2I is a cross-sectional structural diagram illustrating a production method for a pixel and a CMOS inverter circuit of a solid-state imaging device according to the first embodiment;

FIG. 2M is a cross-sectional structural diagram illustrating a production method for a pixel and a CMOS inverter circuit of a solid-state imaging device according to the first embodiment;

FIG. 2Q is a cross-sectional structural diagram illustrating a production method for a pixel and a CMOS inverter circuit of a solid-state imaging device according to the first embodiment;

FIG. 3A is a cross-sectional structural diagram illustrating a production method for a pixel and a CMOS inverter circuit of a solid-state imaging device according to a second embodiment of the present invention;

FIG. 3D is a cross-sectional structural diagram illustrating a production method for a pixel and a CMOS inverter circuit of a solid-state imaging device according to the second embodiment;

FIG. 4C is a cross-sectional structural diagram illustrating a production method for a pixel and a CMOS inverter circuit of a solid-state imaging device according to the third embodiment;

DETAILED DESCRIPTION OF THE PREFERRED EMBODIMENTS

Solid-state imaging devices according to embodiments of the present invention are described below with reference to the drawings.

First Embodiment

A solid-state imaging device according to a first embodiment of the present invention is described below with reference to FIGS. 1A to 1C.

Figure 8A:
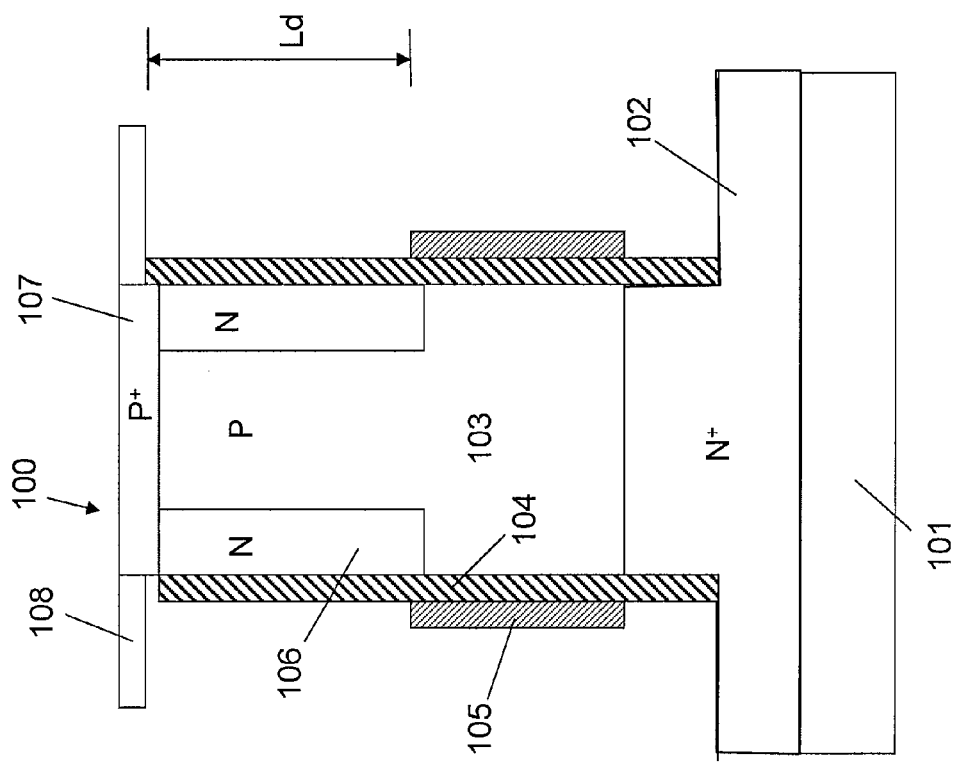
FIG. 8A is a pixel cross-sectional structural diagram of a solid-state imaging device of a known example.
Figure 8B:
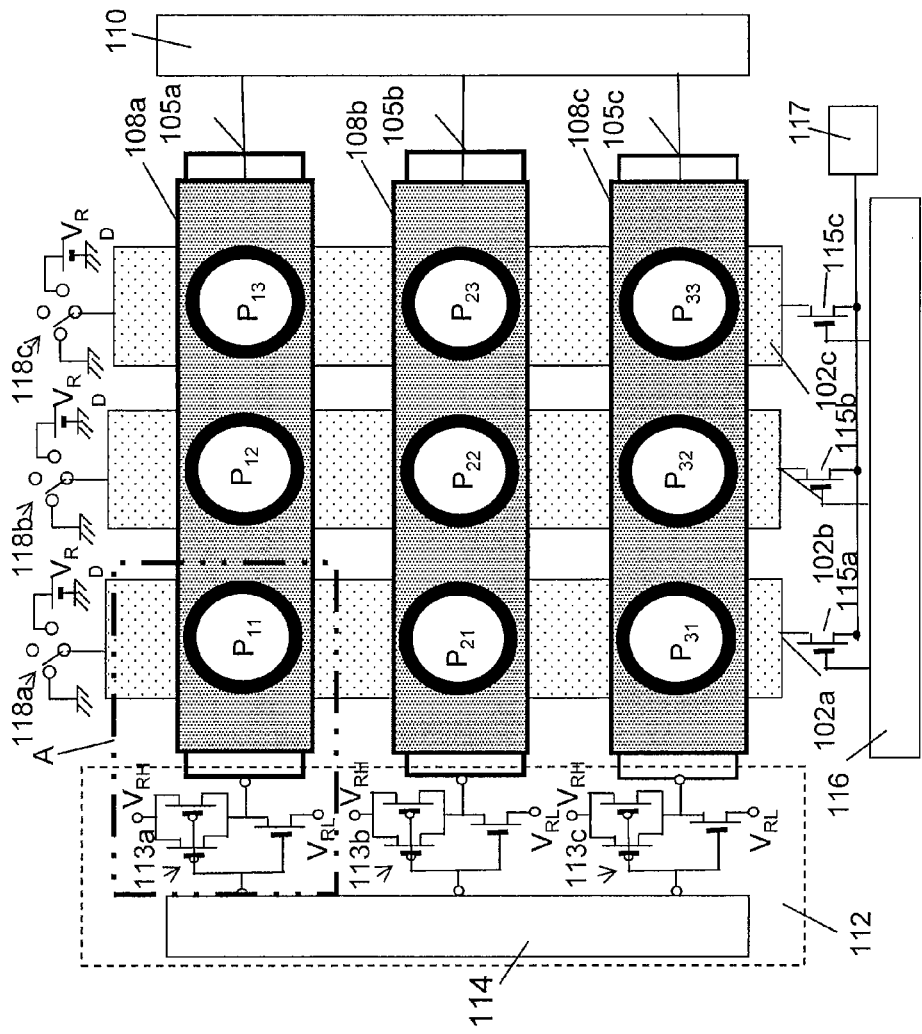
FIG. 8B is a schematic plan view of a solid-state imaging device of a known example.
Figure 8C:
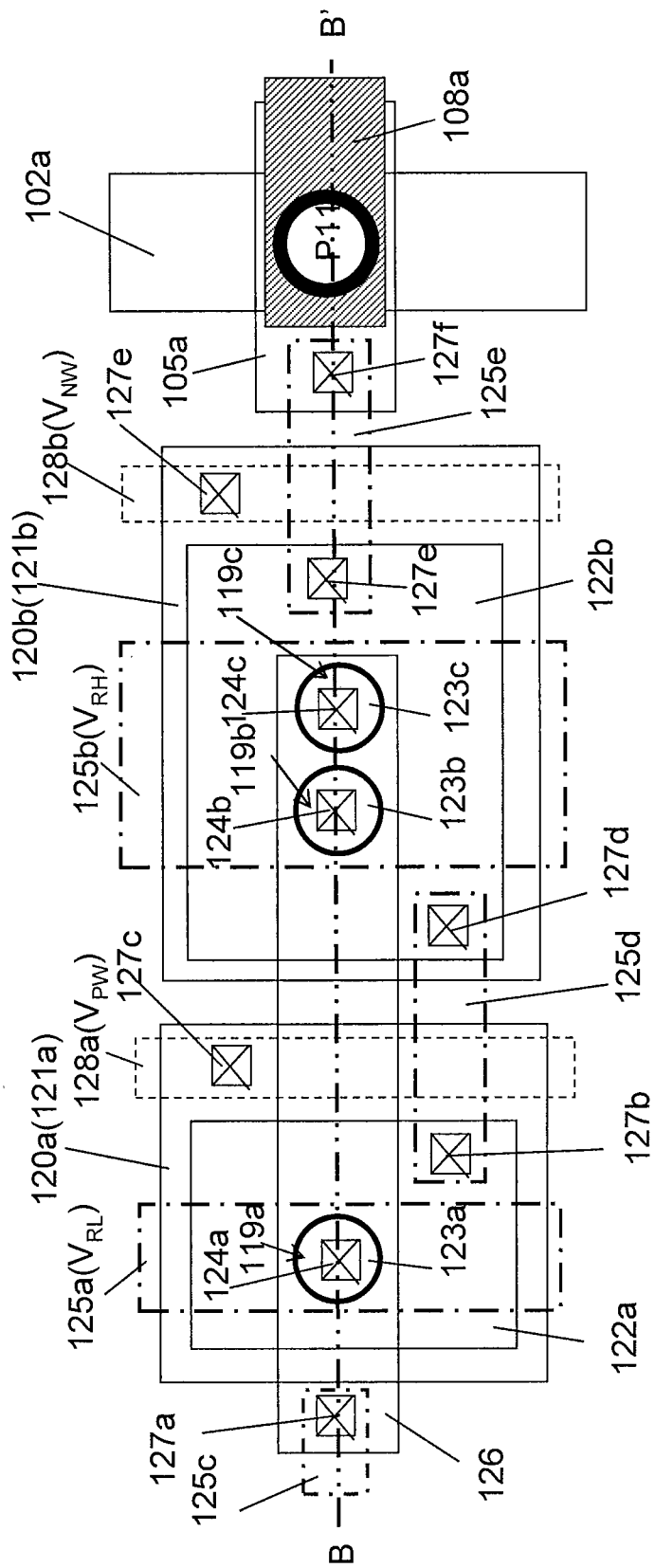
FIG. 8C is a schematic plan view of pixel and a CMOS inverter circuit of a solid-state imaging device of a known example.

A schematic plan view of the solid-state imaging device of this embodiment is the same as one shown in FIG. 8B. FIG. 1A shows a schematic circuit diagram of a region A surrounded by two-dot chain line in the schematic plan view of the solid-state imaging device shown in FIG. 8B. A reset gate conductor layer 105a is connected to a CMOS inverter circuit 113a constituted by two P channel SGTs 4aa and 4bb and one N channel SGT 4cc, and the CMOS inverter circuit 113a is connected to a shift register 114.

When a low-level voltage is applied to the input terminal of the CMOS inverter circuit 113a from the shift register 114, a reset ON voltage $V_{RH}$ is applied from the output terminal to the reset gate conductor layer 105a. When a high-level voltage is applied from the shift register 114 to the input terminal of the CMOS inverter circuit 113a, a reset OFF voltage $V_{RL}$ is applied from the output terminal to the reset gate conductor layer 105a.

Figure 1A:
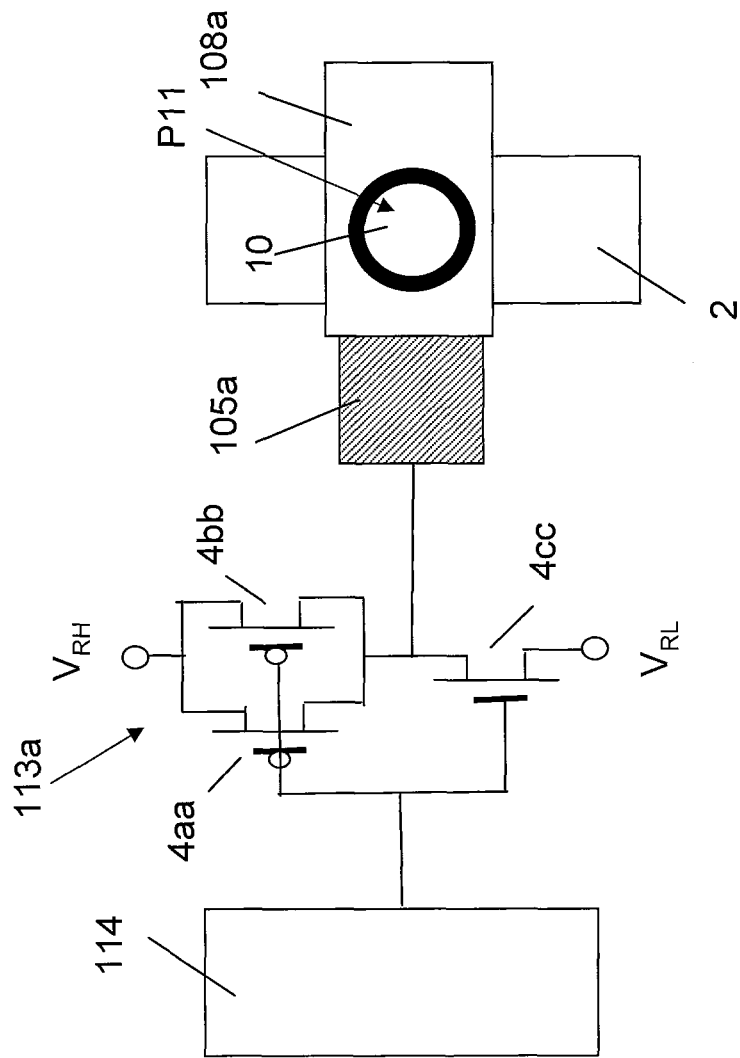
FIG. 1A is a schematic circuit diagram illustrating a pixel and a CMOS inverter circuit of a solid-state imaging device according to a first embodiment of the present invention.
Figure 1B:
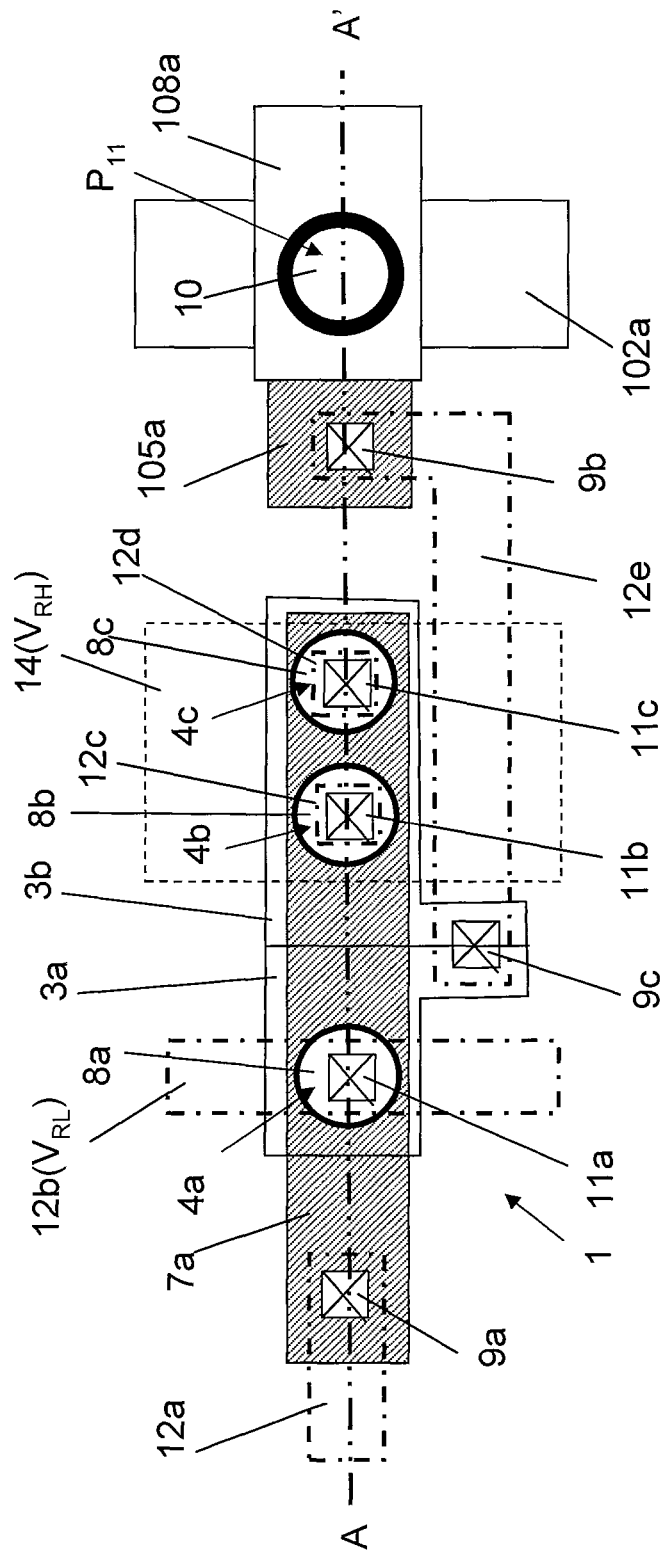
FIG. 1B is a schematic plan view illustrating a pixel and a CMOS inverter circuit of a solid-state imaging device according to the first embodiment.

FIG. 1B is a schematic plan view of FIG. 1A. A signal line $N^+$ region 102a in a pixel region, a plate-shaped $N^+$ region 3a for the source of the N channel SGT 4cc in the CMOS inverter circuit 113a region, and a plate-shaped $P^+$ region 3b for the sources of the P channel SGTs 4aa and 4bb are formed on a silicon oxide substrate ($SiO_2$ substrate) 1. An island-shaped semiconductor P11 constituting a pixel is formed on the signal line $N^+$ region 102a, an island-shaped semiconductor 4a constituting the N channel SGT 4cc is formed on the plate-shaped $N^+$ region 3a for the source, and island-shaped semiconductors 4b and 4c constituting the P channel SGTs 4aa and 4bb are formed on the plate-shaped $P^+$ region 3b for the sources of the P channel SGTs 4aa and 4bb. A continuous gate conductor layer 7a is formed so as to surround the island-shaped semiconductors constituting the N channel SGT 4cc and the P channel SGTs 4aa and 4bb and the reset gate conductor layer 105a that surrounds the island-shaped semiconductor P11 constituting a pixel and is connected in a horizontal direction is formed.

A contact hole 9a is formed on the gate conductor layer 7a, and the gate conductor layer 7a is connected, via the contact hole 9a, to a first metal wiring layer 12a (one-dot chain line) connected to the shift register 114. A contact hole 9b is formed on the reset gate conductor layer 105a, and the reset gate conductor layer 105a is connected to a first metal wiring layer 12e (one-dot chain line) via the contact hole 9b. A contact hole 9c is formed on the border between the plate-shaped $N^+$ region 3a for the source of the N channel SGT 4cc and the plate-shaped $P^+$ region 3b for the sources of the P channel SGTs 4aa and 4bb, and the plate-shaped $N^+$ region 3a for the source of the N channel SGT 4cc and the plate-shaped $P^+$ region 3b for the sources of the P channel SGTs 4aa and 4bb are connected to the first metal wiring layer 12e (one-dot chain line) via the contact hole 9c. A contact hole 11a is formed on a drain $N^+$ region 8a in the upper portion of the island-shaped semiconductor 4a constituting the N channel SGT 4cc, and contact holes 11b and 11c are formed on $P^+$ regions 8b and 8c in the upper portions of the island-shaped semiconductors 4b and 4c constituting the P channel SGTs 4aa and 4bb. The drain $N^+$ region 8a is connected, via the contact hole 11a, to a first metal wiring layer 12b (one-dot chain line) to which a reset low-level voltage $V_{RL}$ is applied, and the drain $P^+$ regions 8b and 8c are connected, via the contact holes 11b and 11c, to first metal wiring layers 12c and 12d (one-dot chain line) to which a reset high-level voltage $V_{RH}$ is applied. The first metal wiring layers 12c and 12d are connected to a second metal wiring layer 14 (chain line) to which a reset ON voltage $V_{RH}$ is applied.

Figure 1C:
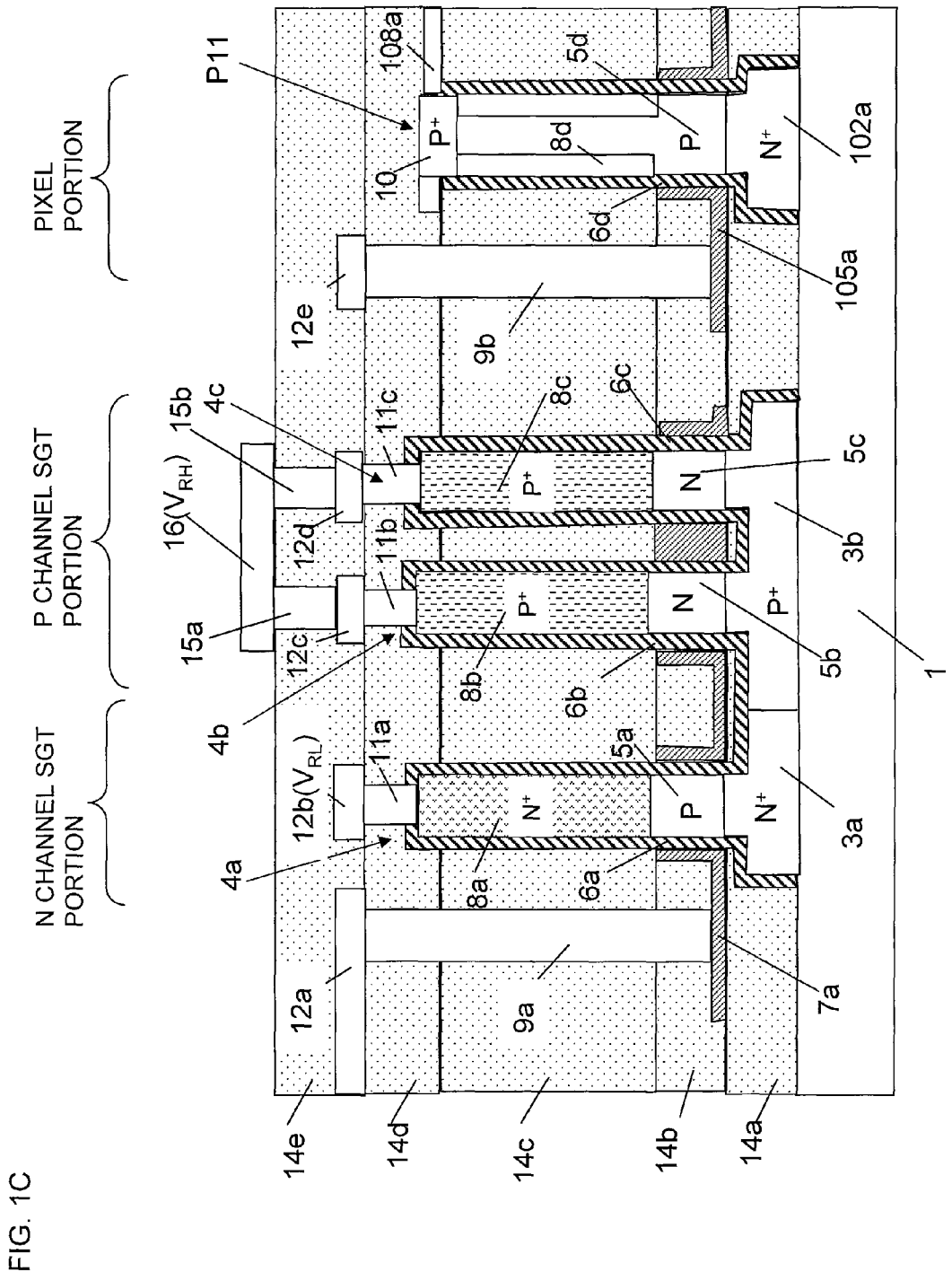
FIG. 1C is a cross-sectional structural diagram illustrating a pixel and a CMOS inverter circuit of a solid-state imaging device according to the first embodiment.
Figure 8D:
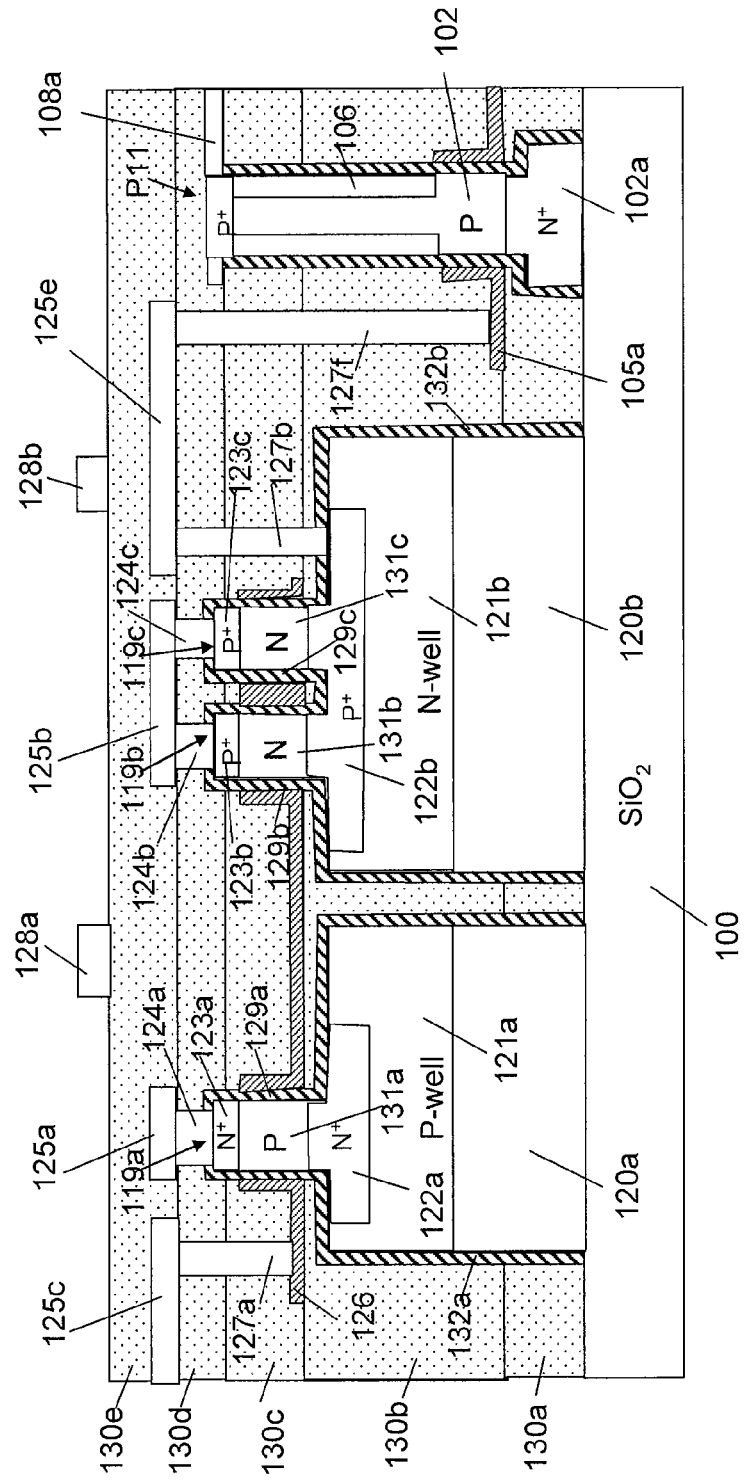
FIG. 8D is a cross-sectional structural diagram of a pixel and a CMOS inverter circuit in a solid-state imaging device of a known example.

FIG. 1C is a cross-sectional structural diagram taken along line A-A' in FIG. 1B. The cross-sectional structure of the island-shaped semiconductor P11 constituting the pixel is the same as one shown in FIG. 8D. The signal line $N^+$ region 102a of the pixel, the source $N^+$ region 3a of the N channel SGT 4cc, and the source $P^+$ region 3b of the P channel SGTs 4aa and 4bb are formed on a substrate 1 (for example, $SiO_2$). The island-shaped semiconductor P11 constituting the pixel is formed on the signal line $N^+$ region 102a, the island-shaped semiconductor 4a constituting the N channel SGT 4cc is formed on the source semiconductor layer $N^+$ region 3a, and the island-shaped semiconductors 4b and 4c constituting the P channel SGTs 4aa and 4bb are formed on the source $P^+$ region 3b. The source $N^+$ region 3a connects to the lower portion of the island-shaped semiconductor 4a constituting the N channel SGT 4cc, and the source $P^+$ region 3b connects to lower portions of the island-shaped semiconductors 4b and 4c constituting the P channel SGTs 4aa and 4bb. A channel P region 5a of the N channel SGT 4cc is connected to the source $N^+$ region 3a, channel N regions 5b and 5c of the P channel SGTs 4aa and 4bb are connected to the source $P^+$ region 3b, a P region 5d that serves as a channel of the reset MOS transistor and a drain of the junction transistor is connected to the signal line $N^+$ region 102a of the pixel (these channel semiconductor regions 5a, 5b, and 5c, and the P region 5d of the island-shaped semiconductor P11 constituting the pixel may be of an intrinsic type). A gate insulating layer 6a of the N channel SGT 4cc is formed on the outer peripheral portion of the island-shaped semiconductor 4a constituting the N channel SGT 4cc connected to the source $N^+$ region 3a, and gate insulating layers 6b and 6c of the P channel SGTs 4aa and 4bb are formed on the outer peripheral portions of the island-shaped semiconductors 4b and 4c constituting the P channel SGTs 4aa and 4bb connected to the source $P^+$ region 3b. A reset MOS gate insulating film 6d is formed on the outer peripheral portion of the island-shaped semiconductor P11 constituting the pixel and being connected to the signal line $N^+$ region 102a of the pixel.

The continuous gate conductor layer 7a of the N channel and P channel SGTs 4aa, 4bb, and 4cc is formed to a first interlayer insulating layer 14a formed on the substrate 1 including the outer peripheral portions of the gate insulating layer 6a of the N channel SGT 4cc and the gate insulating layers 6b and 6c of the P channel SGTs 4aa and 4bb. Similarly, the continuous reset gate conductor layer 105a of the pixel is formed on the first interlayer insulating layer 14a including the outer peripheral portion of the reset MOS gate insulating film 6d. The drain $N^+$ region 8a is formed in the island-shaped semiconductor 4a constituting the N channel SGT 4cc adjacent to the upper portion of the N channel SGT 4cc gate conductor layer 7a; similarly, the drain $P^+$ regions 8b and 8c are formed in the island-shaped semiconductors 4b and 4c constituting the P channel SGTs 4aa and 4bb adjacent to the upper portion of the P channel SGT 4aa and 4bb gate conductor layer 7a. A photodiode region including the P region 5d and an N region 8d formed so as to surround the P region 5d is formed in the island-shaped semiconductor P11 constituting the pixel adjacent to the upper portion of the reset gate conductor layer 105a of the pixel. The drain N⁺ region 8a of the N channel SGT 4cc and the drain P⁺ regions 8b and 8c of the P channel SGTs 4aa and 4bb are formed so as to be connected up to the upper surfaces of the island-shaped semiconductors 4a, 4b, and 4c constituting the SGTs. A pixel selection P⁺ region 10 is formed on the upper surface of the island-shaped semiconductor P11 constituting the pixel. The pixel selection P⁺ region 10 is connected to the pixel selection line conductor layer 108a formed on a third interlayer insulating layer 14c on a second interlayer insulating layer 14b.

The gate conductor layer 7a of the N channel and P channel SGTs 4aa, 4bb, and 4cc is connected, via the contact hole 9a, to the first metal wiring layer 12a formed on the fourth interlayer insulating layer 14d connected to the shift register. The drain N⁺ region 8a in the upper portion of the island-shaped semiconductor 4a constituting the N channel SGT 4cc is connected, via the contact hole 11a, to the first metal wiring layer 12b to which the reset OFF voltage $V_{RL}$ is applied. The drain P⁺ regions 8b and 8c in the upper portions of the island-shaped semiconductors 4b and 4c constituting the P channel SGTs are connected, via the contact holes 11b and 11c, to the first metal wiring layers 12c and 12d to which a reset ON voltage $V_{RH}$ is applied. The reset gate conductor layer 105a of the pixel is connected, via the contact hole 9b, to the first metal wiring layer 12e provided on the fourth interlayer insulating layer 14d and electrically connected to the source N⁺ region 3a of the N channel SGT 4cc and the source P⁺ region 3b of the P channel SGTs 4aa and 4bb. The first metal wiring layers 12c and 12d are connected, via contact holes 15a and 15b, to a second metal wiring layer 16 which is formed on a fifth interlayer insulating layer 14e and to which a reset ON voltage $V_{RH}$ is applied.

As shown in the cross-sectional structural diagram of FIG. 1C, the solid-state imaging device of this embodiment has following structural features.

A first feature is that semiconductor regions containing a donor or acceptor impurity such as the source N⁺ region 3a and P⁺ region 3b of the N channel and P channel SGTs 4aa, 4bb, and 4cc and a signal line N⁺ region 102a are formed directly on the substrate 1 and in the same layer.

A second feature is that the gate conductor layer 7a of the N channel and P channel SGTs 4aa, 4bb, and 4cc and the reset gate conductor layer 105a of the pixel are formed on the same first interlayer insulating layer 14a, and also on the outer peripheries of the gate insulating films 6a, 6b, 6c, and 6d connected to the bottom portions of the island-shaped semiconductors 4a, 4b, 4c, and P11 so that they are formed in the same layer.

A third feature is that the channel P region 5a or N regions 5b and 5c of the SGTs and the P region 5d of the reset MOS channel of the pixel are formed in the same layer.

A fourth feature is that the drain N⁺ region 8a of the N channel SGT 4cc and the drain P⁺ regions 8b and 8c of the P channel SGTs 4aa and 4bb in the upper portions of the island-shaped semiconductors 4a, 4b, and 4c constituting the SGTs are formed in the same layer as the N region 8d and the selection P⁺ region 10 constituting the photodiode in the upper portion of the island-shaped semiconductor P11 of the pixel.

Due to these structural features, the present embodiment has the following advantages.

A first advantage is that whereas island-shaped semiconductors 119a, 119b, and 119c constituting the SGTs are formed separately from the island-shaped semiconductor P11 constituting the pixel in the solid-state imaging device of a known example (FIG. 8D), the island-shaped semiconductors 4a, 4b, and 4c constituting the SGTs and the island-shaped semiconductor P11 constituting the pixel can be formed in the same step in this embodiment.

A second advantage is that because the N⁺ region 3a of the N channel SGT 4cc and the source P⁺ region 3b of the P channel SGTs 4aa and 4bb are directly formed on the substrate 1, the N well region 121b and the P well layer 121a of the known example of the solid-state imaging device (FIG. 8D) are no longer needed.

A third advantage is that the N⁺ region 3a of the N channel SGT 4cc separately formed in the known example of the solid-state imaging device (refer to FIG. 8D) can be formed in the same step as the signal line N⁺ region 102a.

A fourth advantages is that the gate conductor layer 7a of the N channel and P channel SGTs 4aa, 4bb, and 4cc and the reset gate conductor layer 105a separately formed in the known example of the solid-state imaging device (refer to FIG. 8D) can be formed in the same step.

A fifth advantage is that the contact holes 9a and 9b which have been formed on the gate conductor layers 7a and 105a separately according to the known example of the solid-state imaging device (refer to FIG. 8D) can be formed in the same step.

These advantages mean that the solid-state imaging device of the present invention can be fabricated through fewer steps than the known example of the solid-state imaging device. As a result, cost reduction is achieved in the solid-state imaging device.

A production method for forming the solid-state imaging device according to the first embodiment of the present invention is described and a production method for forming a cross-sectional structure of a pixel portion and a CMOS inverter circuit portion taken along line A-A' in FIG. 1B is described with reference to FIGS. 2A to 2Q.

Figure 2A:
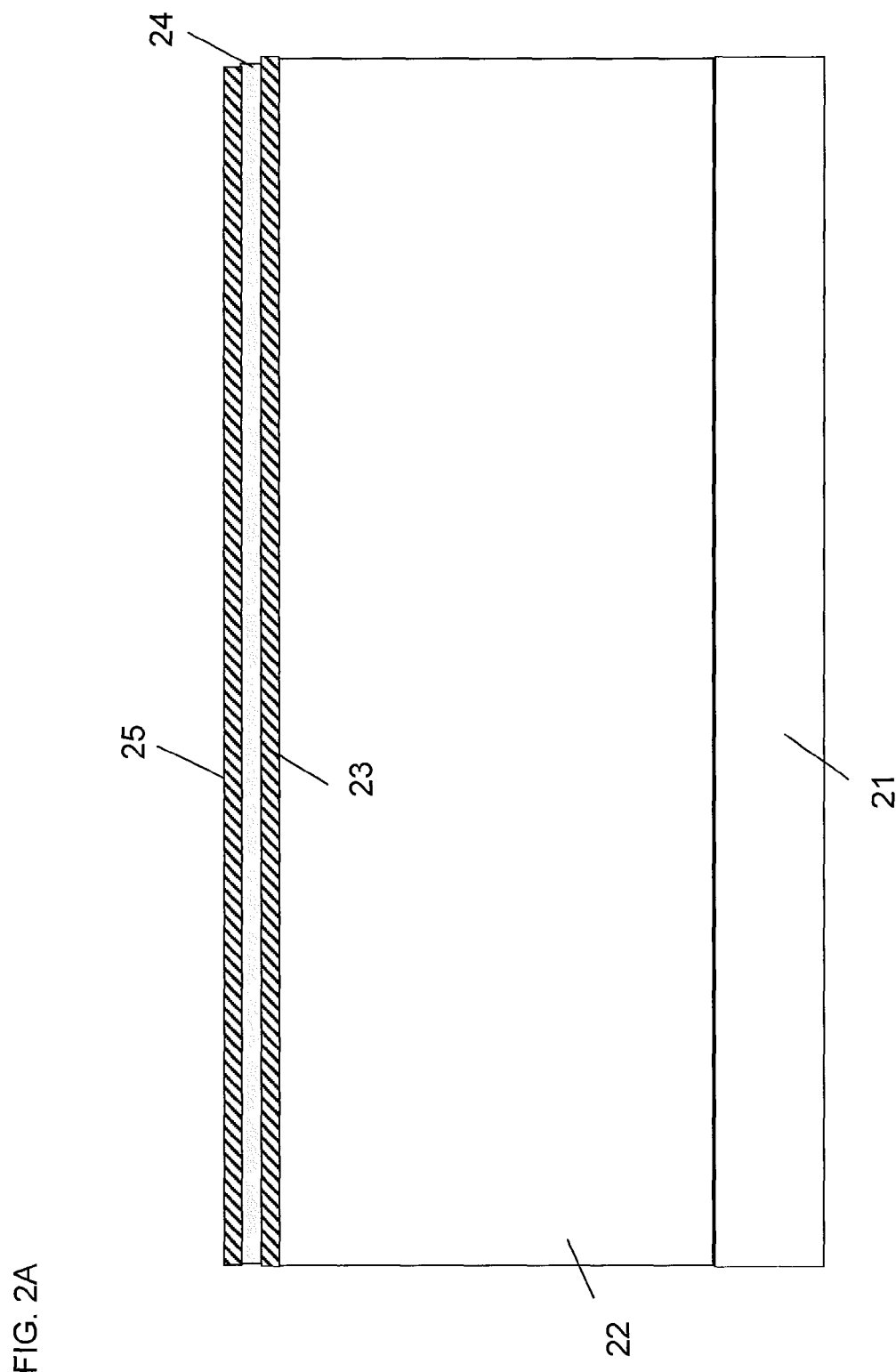
FIG. 2A is a cross-sectional structural diagram illustrating a production method for a pixel and a CMOS inverter circuit of a solid-state imaging device according to the first embodiment.

As shown in FIG. 2A, a single crystal semiconductor silicon layer (hereinafter simply referred to as "Si layer") 22 is formed on a $SiO_2$ substrate 21. The surface of the Si layer 22 is oxidized to form a $SiO_2$ layer 23, and a silicon nitride layer (hereinafter referred to as "SiN layer") 24 and a $SiO_2$ layer 25 prepared by a CVD (chemical vapor deposition) method are formed on the $SiO_2$ layer 23.

The $SiO_2$ layer 25 prepared by a CVD method serves as an etching mask in etching the Si layer 22 by a RIE (reactive ion etching) method. The SiN layer 24 serves as a stopper layer in planarization of the $SiO_2$ film by CMP (chemical mechanical polishing) in the subsequent step. The $SiO_2$ layer 23 on the Si layer 22 serves as a buffer layer for moderating the stresses with the Si layer 22 and the SiN layer 24.

Figure 2B:
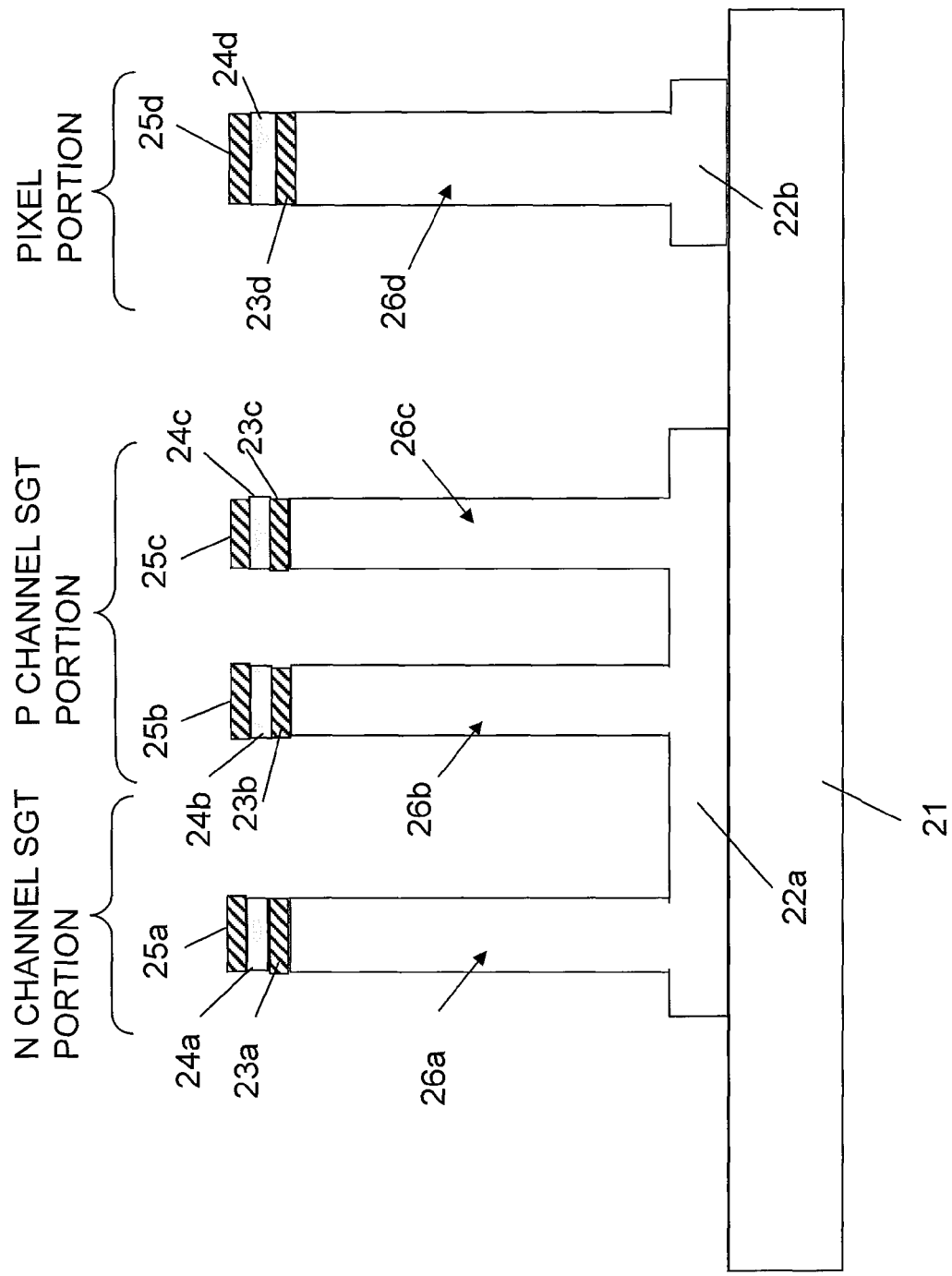
FIG. 2B is a cross-sectional structural diagram illustrating a production method for a pixel and a CMOS inverter circuit of a solid-state imaging device according to the first embodiment.

Next, as shown in FIG. 2B, the Si layer 22 of the N channel SGT portion, the P channel SGT portion, and the pixel portion is etched through the $SiO_2$ layer 25 serving as an etching mask so as to form a silicon pillar (hereinafter "silicon pillar" is referred to as "Si pillar") 26a constituting the N channel SGT, Si pillars 26b and 26c constituting P channel SGTs, and a Si pillar 26d constituting a pixel, and plate-shaped Si layers 22a and 22b are allowed to remain at the bottom of the Si layer 22.

Here, the Si layer 22 in the regions of the plate-shaped Si layers 22a and 22b is etched down to the surface of the $SiO_2$ substrate 21, and then the Si pillars 26a, 26b, 26c, and 26d are formed to form a structure shown in FIG. 2B.

Figure 2C:
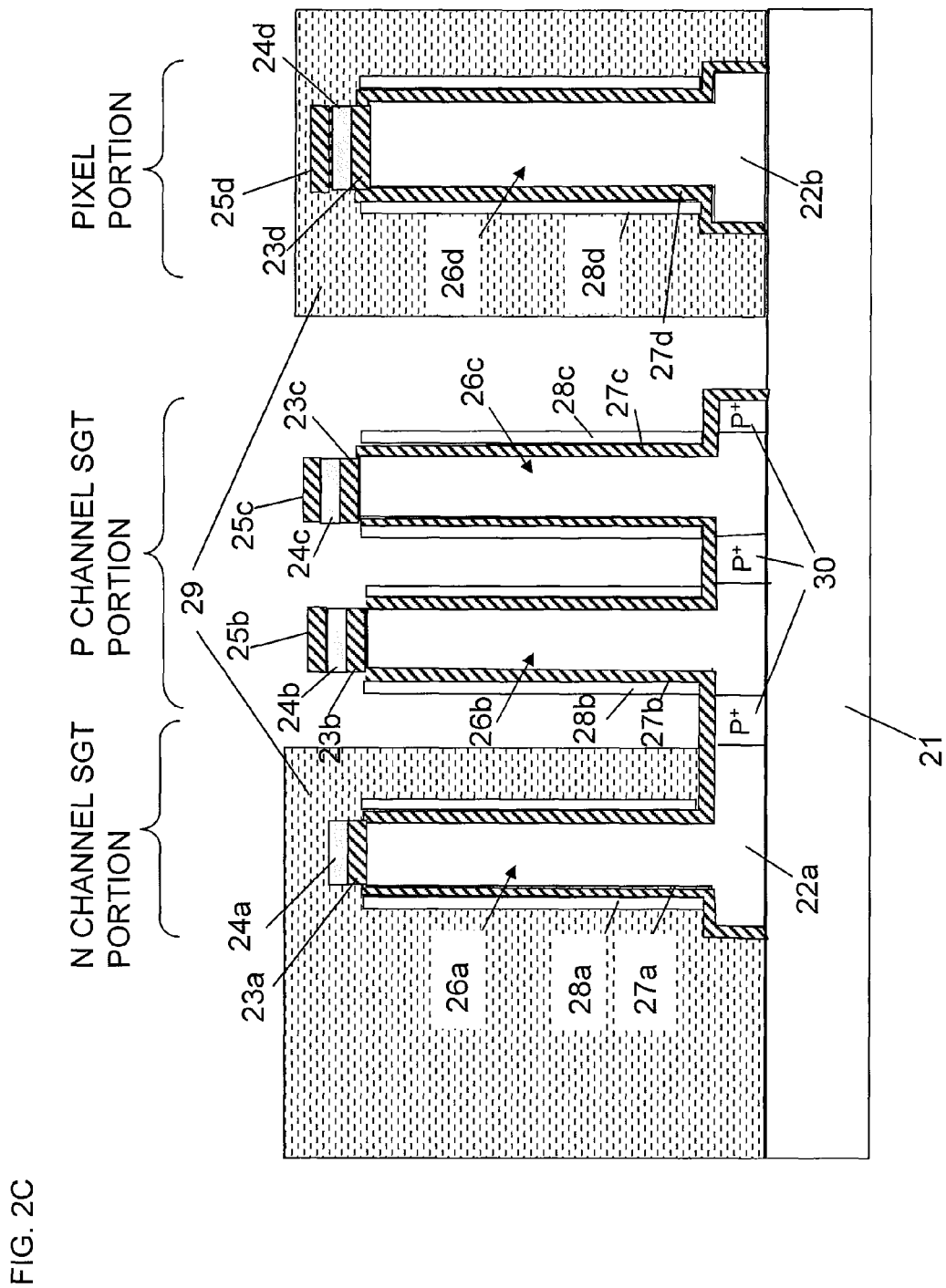
FIG. 2C is a cross-sectional structural diagram illustrating a production method for a pixel and a CMOS inverter circuit of a solid-state imaging device according to the first embodiment.

Next, as shown in FIG. 2C, $SiO_2$ layers 27a, 27b, 27c, and 27d are formed on the outer peripheries of the Si pillars 26a, 26b, 26c, and 26d and the plate-shaped Si layers 22a and 22b. Next, P$^+$ regions 30 are formed in the plate-shaped Si layer 22a by forming polycrystal Si layers 28a, 28b, 28c, and 28d so as to surround the SiO$_2$ layers 27a, 27b, 27c, and 27d of the Si pillars 26a, 26b, 26c, and 26d, covering regions other than the P channel SGT portion with a photoresist layer 29, and implanting ions of boron (B) which is an acceptor impurity from above. Note that formation of the photoresist layer 29 is conducted by using a photolithography technique. The polycrystal Si layers 28a, 28b, 28c, and 28d are stopper layers for preventing implantation of boron ions into the Si pillars 26a, 26b, 26c, and 26d during boron ion implantation.

Then the photoresist layer 29 is removed and N$^+$ regions are formed in the plate-shaped Si layer 22a of the N channel SGT portion and the plate-shaped Si layer 22b for the pixel similarly by a photolithography technique and implantation of ions of a donor impurity such as phosphorus (P) or arsenic (As).

Figure 2D:
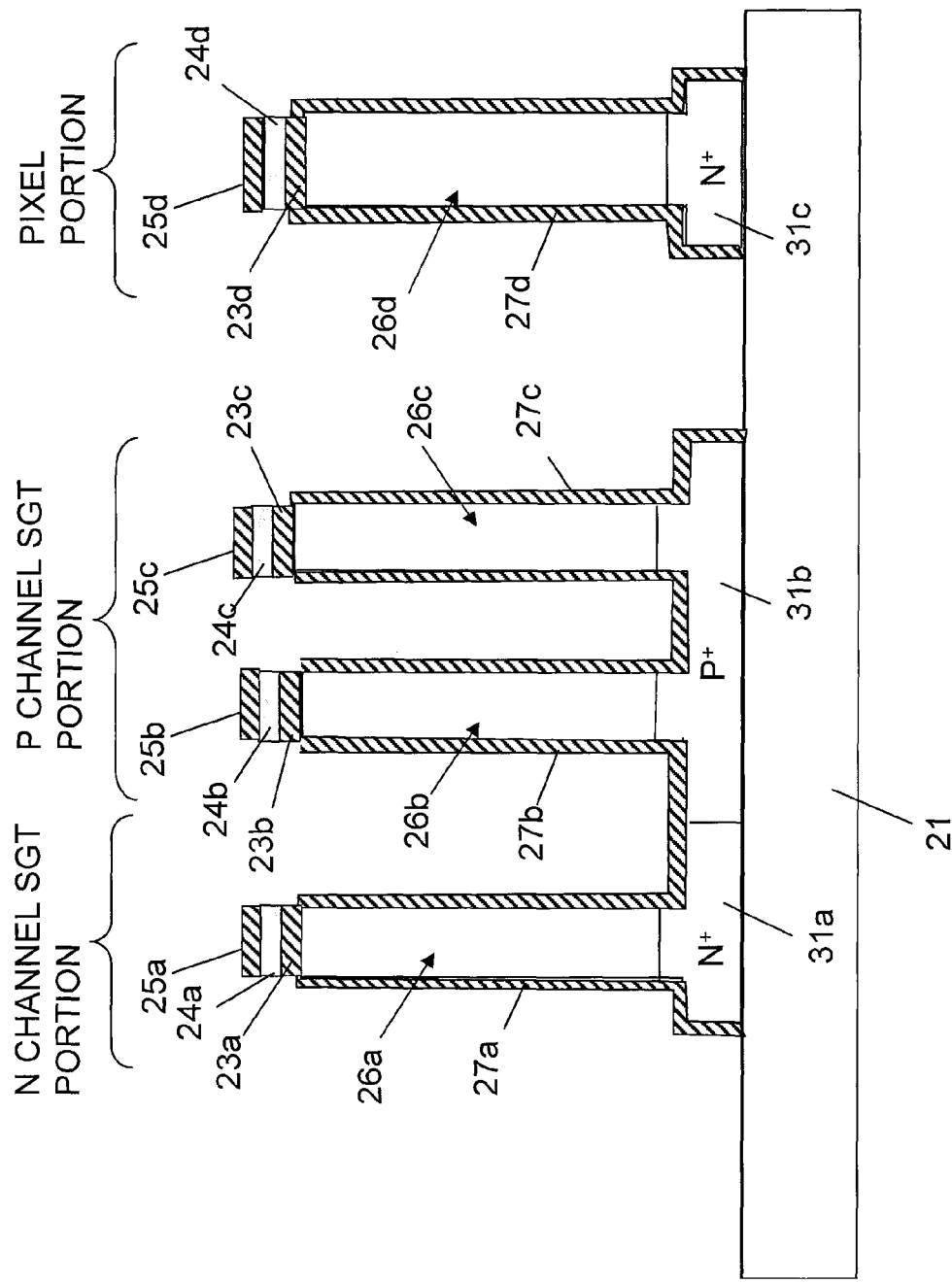
FIG. 2D is a cross-sectional structural diagram illustrating a production method for a pixel and a CMOS inverter circuit of a solid-state imaging device according to the first embodiment.

Next, as shown in FIG. 2D, the polycrystal Si layers 28a, 28b, 28c, and 28d are removed and a heat treatment is conducted to form, by thermal diffusion, N$^+$ regions 31a and 31c and a P$^+$ region 31b connected to lower portions of the Si pillars 26a, 26b, 26c, and 26d, from the plate-shaped Si layers 22a and 22b.

Figure 2E:
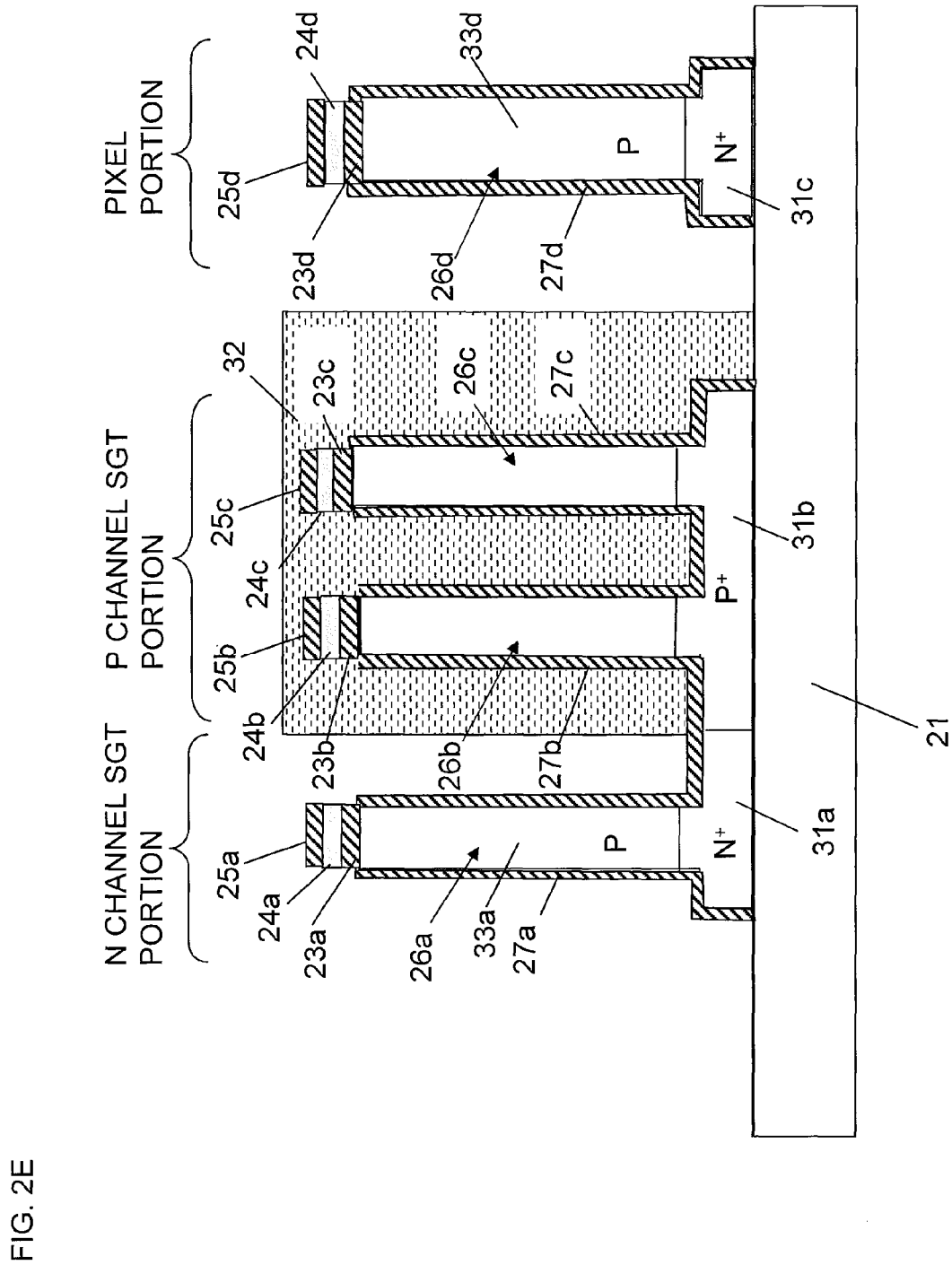
FIG. 2E is a cross-sectional structural diagram illustrating a production method for a pixel and a CMOS inverter circuit of a solid-state imaging device according to the first embodiment.

Then as shown in FIG. 2E, a photoresist layer 32 is formed by a photolithography technique so as to cover the Si pillars 26b and 26c constituting the P channel SGTs and ion implantation of an acceptor impurity such as boron (B) is conducted so as to form P regions 33a and 33d in the Si pillar 26a constituting the N channel SGT and the Si pillar 26d constituting the pixel. Then the photoresist layer 32 is removed.

Figure 2F:
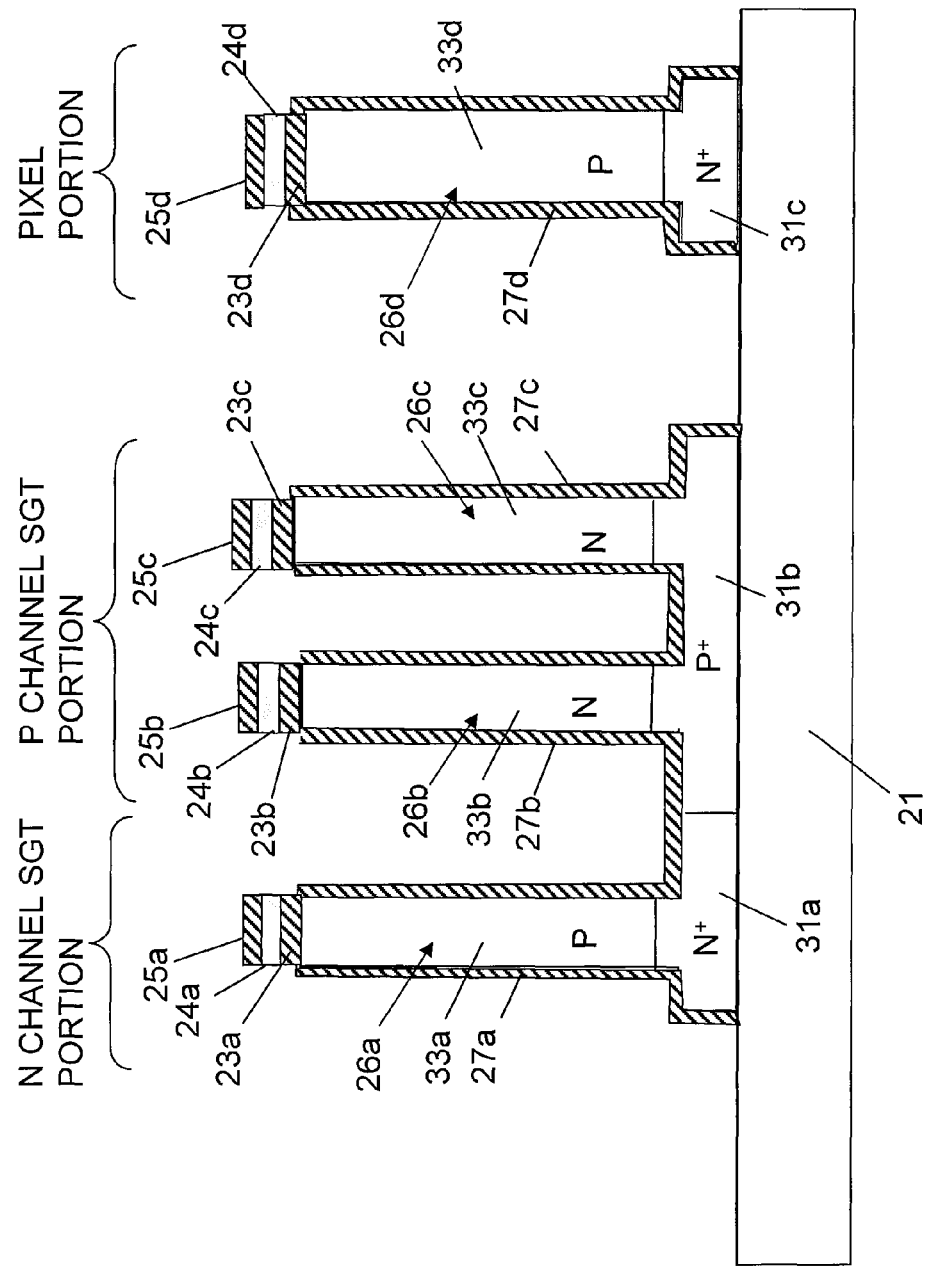
FIG. 2F is a cross-sectional structural diagram illustrating a production method for a pixel and a CMOS inverter circuit of a solid-state imaging device according to the first embodiment.

Next, similarly, a photoresist layer is formed by a photolithography technique so as to cover the Si pillar 26a constituting the N channel SGT and the Si pillar 26d constituting the pixel, ion implantation of a dolor impurity such as arsenic (As) or phosphorus (P) is conducted, the photoresist layer is removed, and a heat treatment is conducted to form N regions 33b and 33c in the Si pillars 26b and 26c constituting the P channel SGTs as shown in FIG. 2F.

Figure 2G:
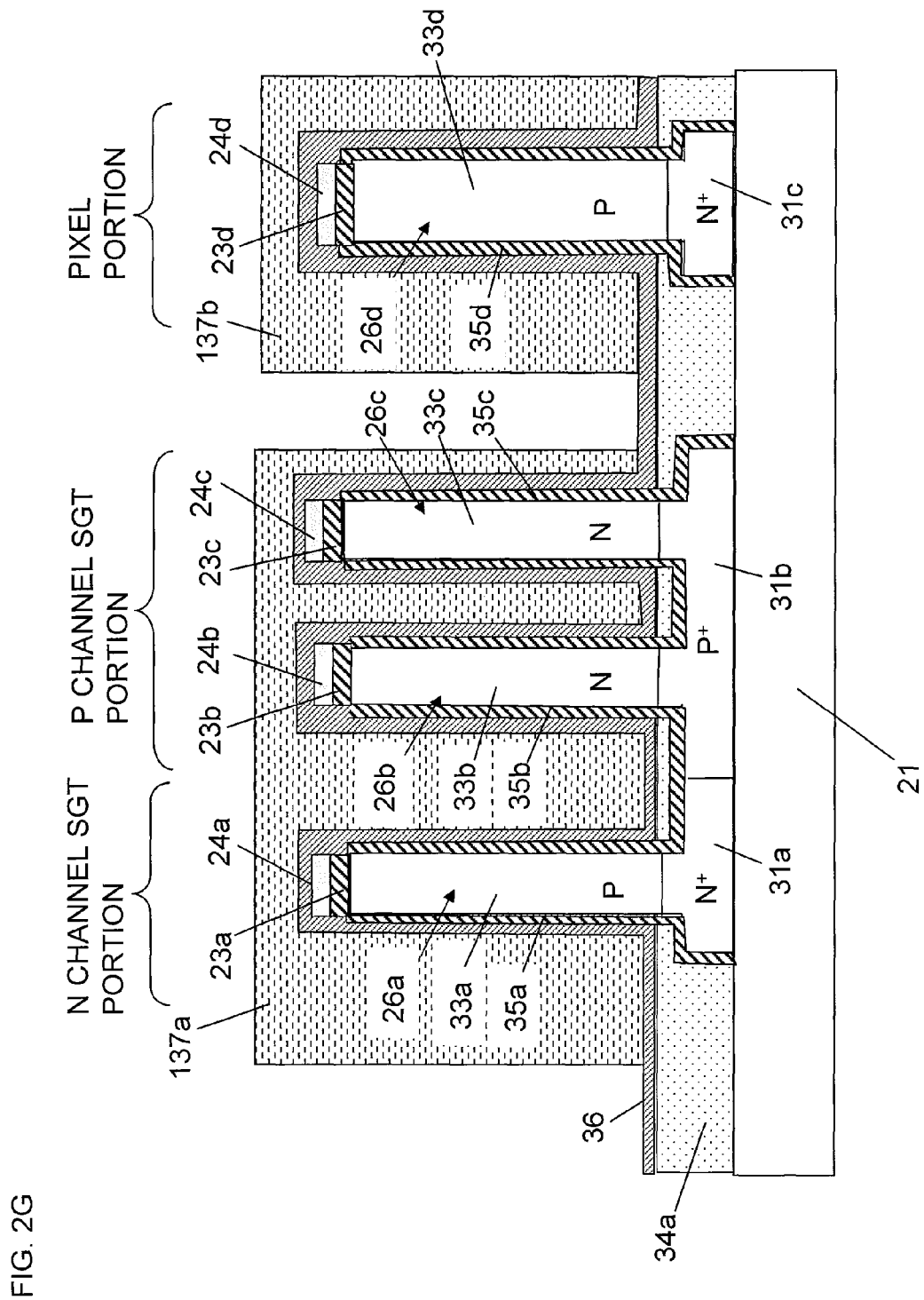
FIG. 2G is a cross-sectional structural diagram illustrating a production method for a pixel and a CMOS inverter circuit of a solid-state imaging device according to the first embodiment.
Figure 21:
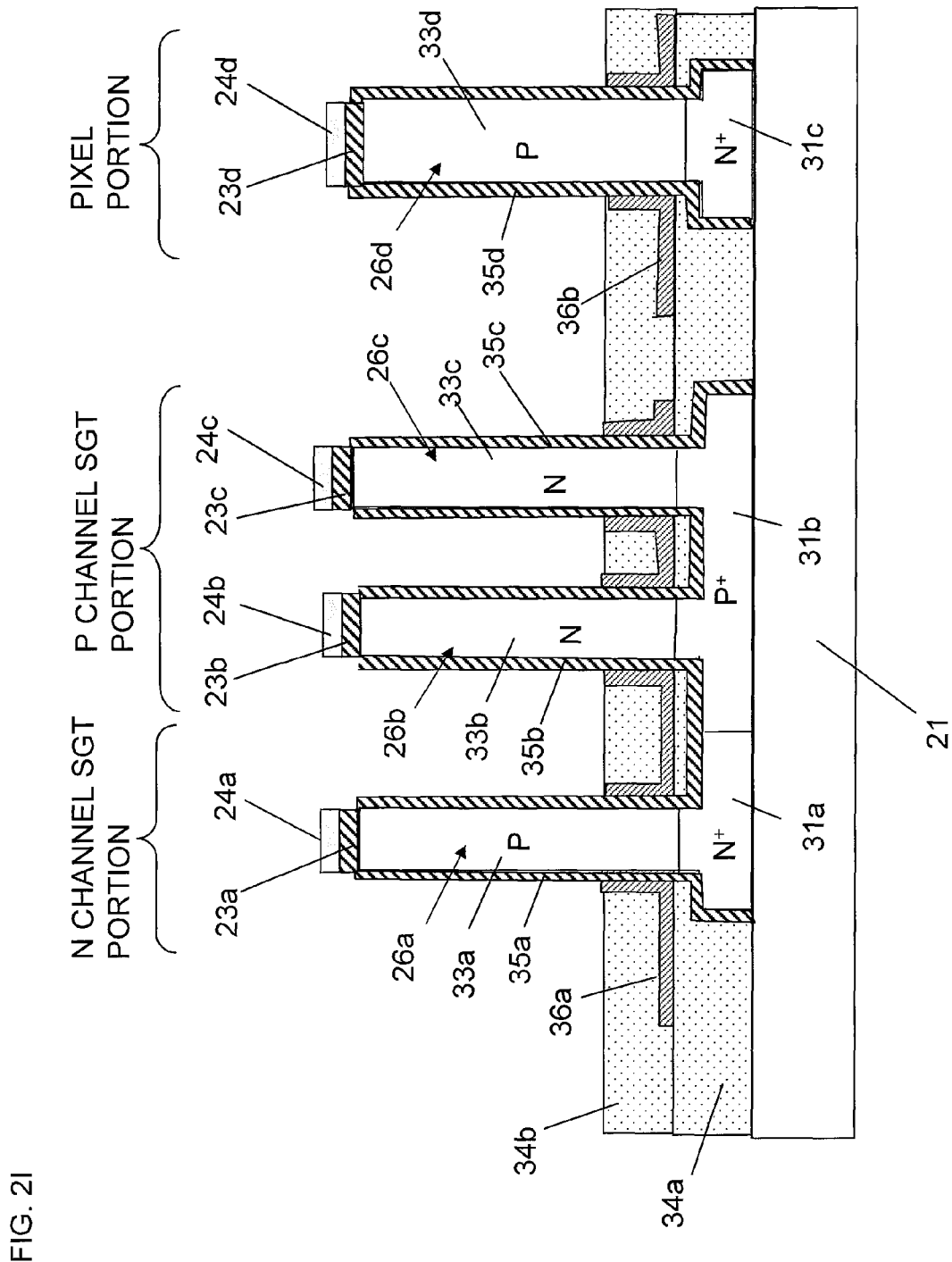

Next, as shown in FIG. 2G, a first interlayer insulating layer 34a is formed, the SiO$_2$ layers 27a, 27b, 27c, and 27d are removed (the SiO$_2$ layers 25a, 25b, 25c, and 25d are also removed at this time), gate insulating layers 35a, 35b, 35c, and 35d are formed on the outer peripheries of the Si pillars 26a, 26b, 26c, and 26d by using a high-dielectric-constant-insulating material such as SiO$_2$ or hafnium oxide (HfO$_2$), a conductor layer 36 is formed by CVD (chemical vapor deposition) on the first interlayer insulating layer 34a so as to surround the Si pillars 26a, 26b, 26c, and 26d by using, for example, polycrystal Si, tungsten (W), cobalt (Co), platinum (Pt), or a silicide material, and a photoresist layer 137a is formed on the gate regions of the N channel and P channel SGTs and a photoresist layer 137b is formed in the pixel reset gate region.

The first interlayer insulating layer 34a is formed by depositing a SiO$_2$ film by a CVD method to a position higher than the Si pillars 26a, 26b, 26c, and 26d, polishing and planarizing the SiO$_2$ film by a CMP (chemical mechanical polishing) method to the height of the Si pillars 26a, 26b, 26c, and 26d, and then performing etching (hereinafter referred to as etch back) by a RIE method. Here, prior to depositing the SiO$_2$ film by the CVD method, a SiN film may be deposited on the SiO$_2$ substrate 1 so as to surround the plate-shaped N$^+$ regions 31a and 31c, the plate-shaped P$^+$ region 31b, and the Si pillars 26a, 26b, 26c, and 26d and the SiN film surrounding the Si pillars 26a, 26b, 26c, and 26d may be removed after etch back of the SiO$_2$ film. In such a case, the SiN film serves as a protective film for preventing the Si pillars 26a, 26b, 26c, and 26d from being etched during the etch back.

Next, the conductor layer 36 is etched by using the photoresist layers 137a and 137b as a mask. Then the photoresist layers 137a and 137b are removed.

Then, as shown in FIG. 2H, a second interlayer insulating layer 34b is formed. As with the first interlayer insulating layer 34a, this second interlayer insulating layer 34b is also formed by SiO$_2$ film deposition by CVD, SiO$_2$ film polishing by CMP, and etch back by RIE.

Then as shown in FIG. 2I, gate conductor layers 36a and 36b not covered by the second interlayer insulating layer 34b and exposed to surround the Si pillars 26a, 26b, 26c, and 26d are etched. As a result, a N channel/P channel SGT gate conductor layer 36a and a pixel reset gate conductor layer 36b are formed.

Here, the N channel/P channel SGT gate conductor layer 36a is formed so as to surround the outer peripheries of the lower portions of the Si pillars 26a, 26b, and 26c constituting the SGTs and continuously formed on the first interlayer insulating layer 34a.

Figure 2J:
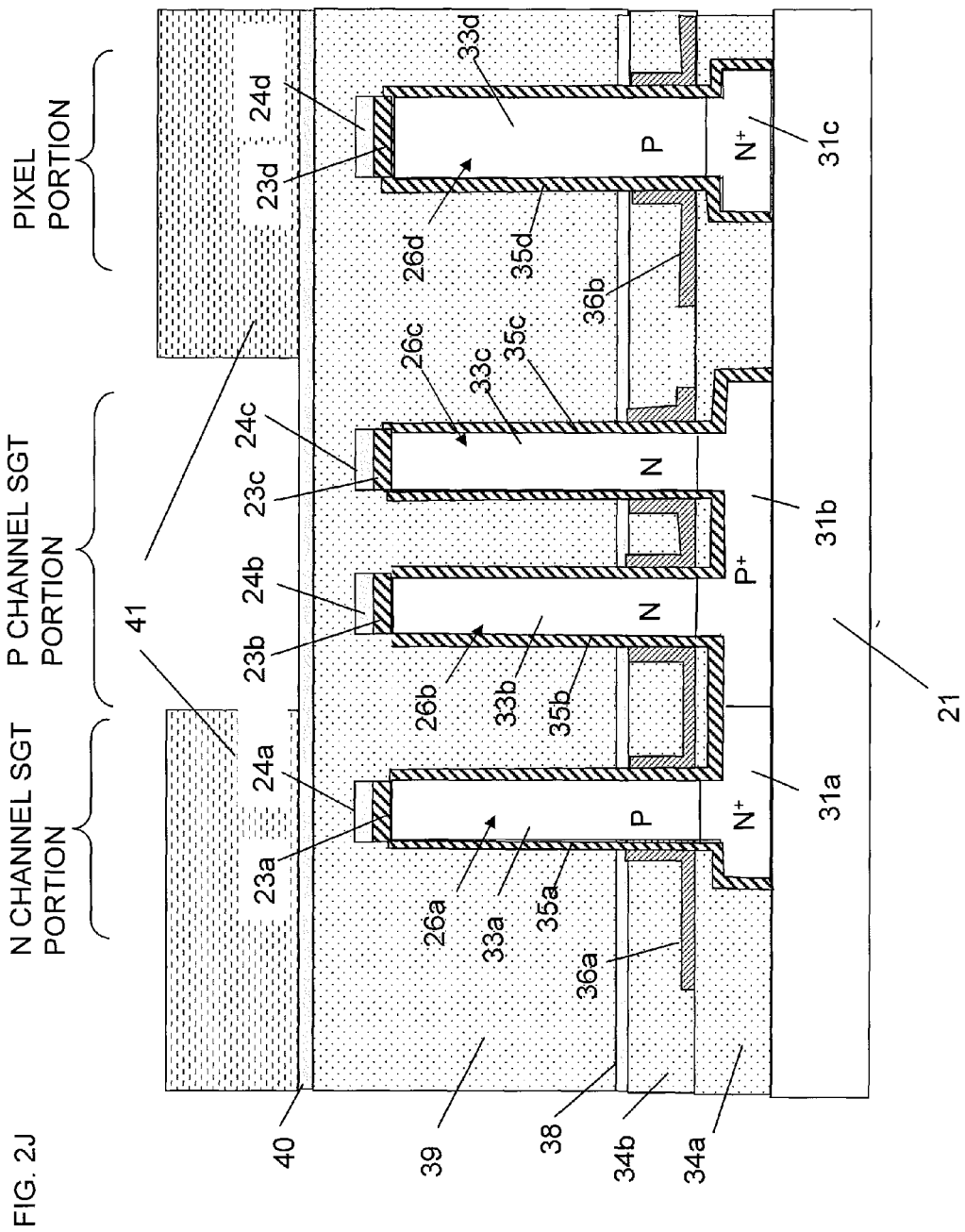
FIG. 2J is a cross-sectional structural diagram illustrating a production method for a pixel and a CMOS inverter circuit of a solid-state imaging device according to the first embodiment.

Next, as shown in FIG. 2J, a SiN layer 38 is formed on the second interlayer insulating layer 34b, a SiO$_2$ layer 39 is formed by a CVD method so as to cover the second interlayer insulating layer 34b and the Si pillars, a SiN layer 40 is formed on the planarized SiO$_2$ layer 39, and a photoresist layer 41 having holes corresponding to the Si pillar 26b and 26c constituting the P channel SGTs is formed by a photolithography technique.

Here, the SiN layer 38 serves as an etching stopper layer for the SiO$_2$ layer 39, and the SiN layer 40 on the SiO$_2$ layer 39 serves as an etching mask layer for the SiO$_2$ layer 39.

Next, the SiN layer 40 on the Si pillars 26b and 26c constituting the P channel SGTs are etched by using the photoresist layer 41 as a mask, and after the photoresist layer 41 is removed, the SiO$_2$ layer 39 is etched by a RIE method up to the surface of the SiN layer 38 by using the SiN layer 40 as an etching mask. Then the gate insulating layers 35b and 35c on the outer peripheries of the Si pillars 26b and 26c are removed.

Figure 2K:
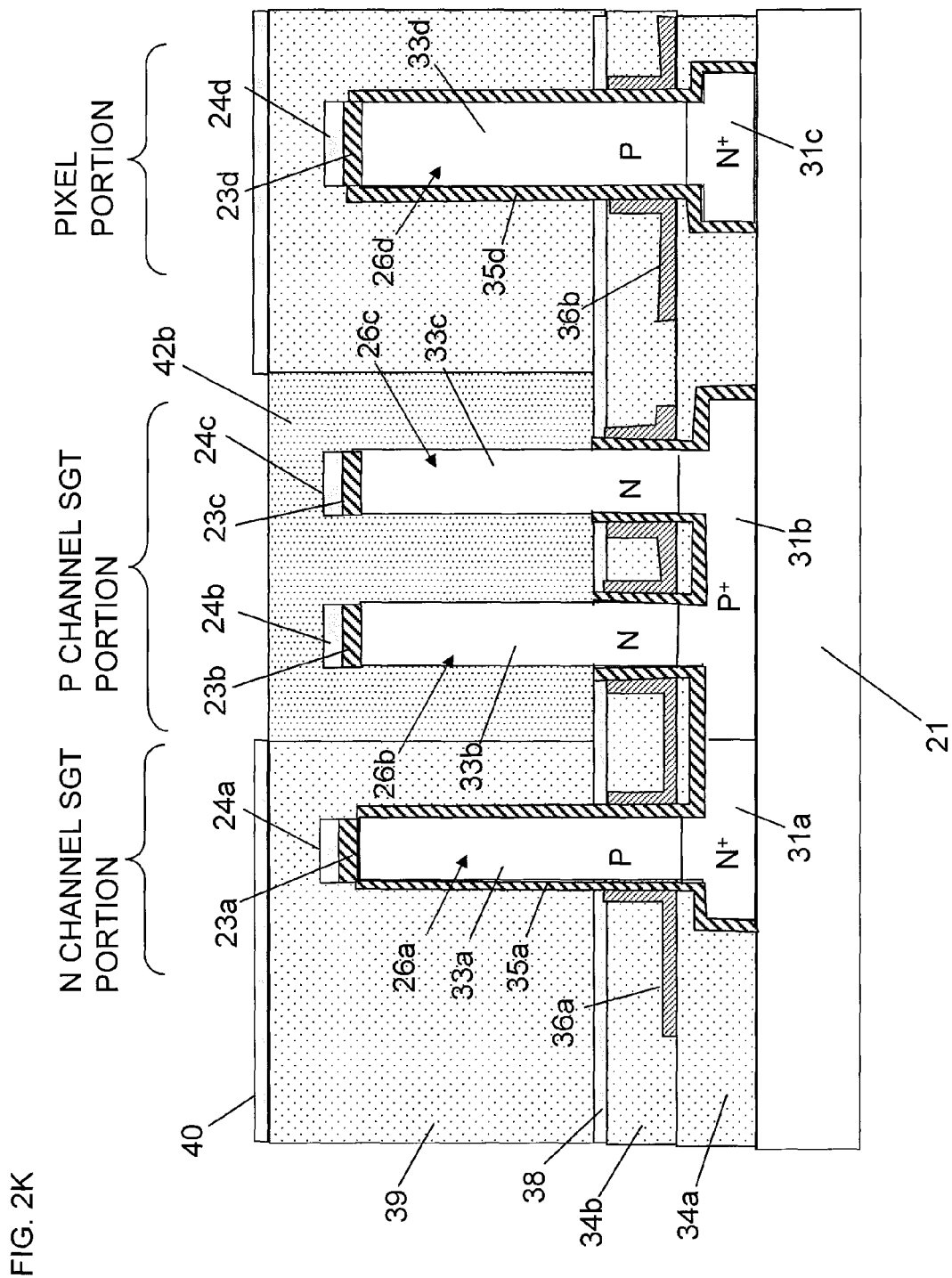
FIG. 2K is a cross-sectional structural diagram illustrating a production method for a pixel and a CMOS inverter circuit of a solid-state imaging device according to the first embodiment.

Then, as shown in FIG. 2K, a SiO$_2$ layer 42b containing an acceptor impurity such as boron (B) is formed by a CVD method.

Here, the SiO$_2$ layer 42b containing the acceptor impurity is formed by initially depositing SiO$_2$ up to above the SiN layer 40 and then polishing SiO$_2$ to the SiN layer 40 by a CMP method so as to conduct planarization.

Then the SiN layer 40 is removed, a new SiN layer 43 is deposited, and a hole is formed in the SiN layer 43 on the Si pillar 26a constituting the N channel SGT by conducting a resist layer formation through a photolithography method and SiN etching. The SiO$_2$ layer 39 is etched to the surface of the conductor layer 36 by using the SiN layer 43 as a mask.

Figure 2L:
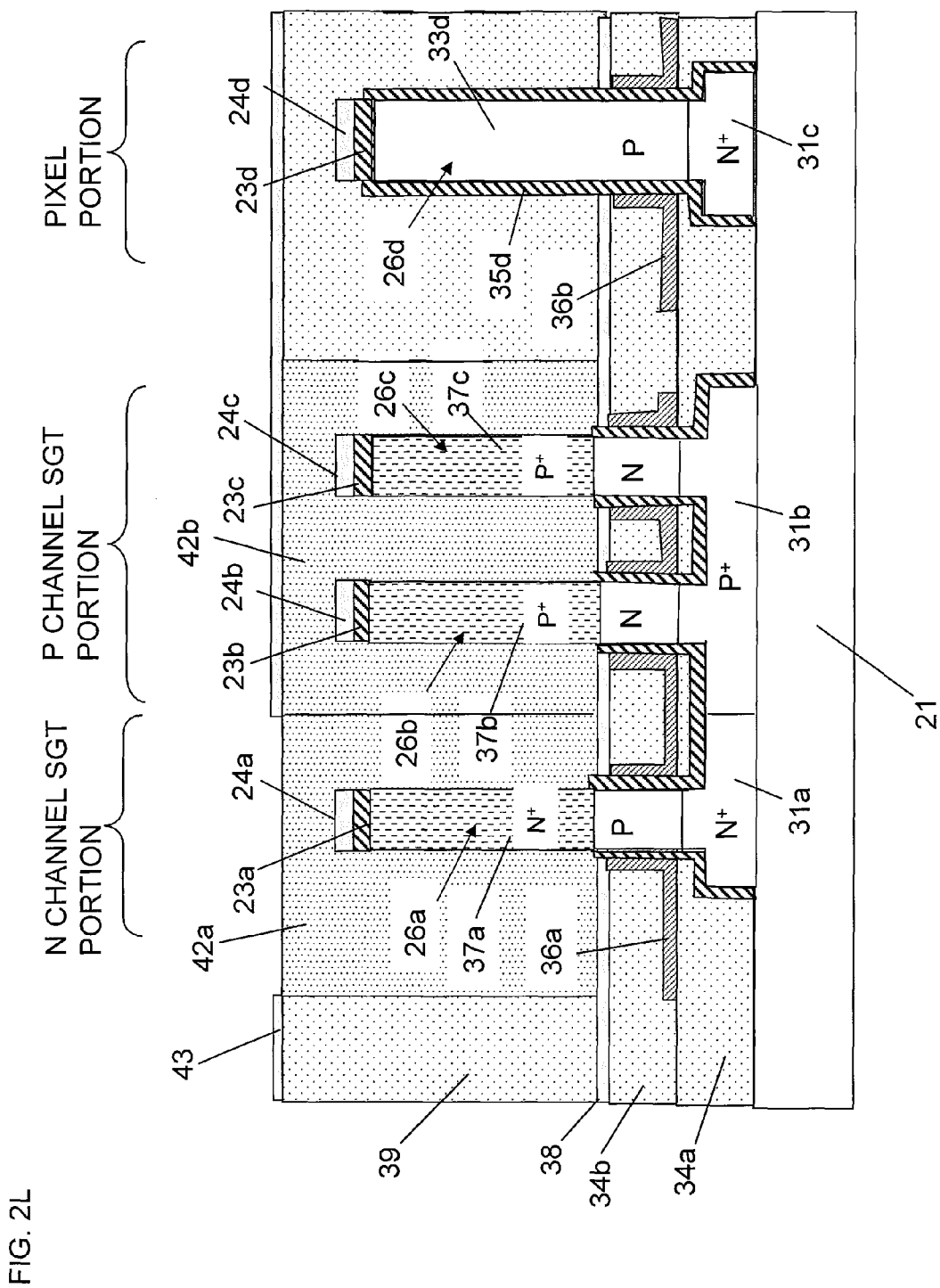
FIG. 2L is a cross-sectional structural diagram illustrating a production method for a pixel and a CMOS inverter circuit of a solid-state imaging device according to the first embodiment.

Then, as shown in FIG. 2L, after the gate insulating film 35a of the Si pillar is removed, an SiO$_2$ layer 42a containing a donor impurity such as phosphorus (P) or arsenic (As) is formed.

Then a heat treatment is conducted to diffuse the donor impurity and the acceptor impurity from the SiO$_2$ layers 42a and 42b formed in the Si pillars 26a, 26b, and 26c by a CVD method so as to form an N$^+$ region 37a and P$^+$ regions 37b and 37c in the Si pillars 26a, 26b, and 26c.

Next, as shown in FIG. 2M, as with the method for forming the N$^+$ region 37a and the P$^+$ regions 37b and 37c, a SiO$_2$ layer 42c containing a donor impurity is formed on the SiN layer 38 in the Si pillar 26d region constituting the pixel, and a heat treatment is conducted to form an N region 43 in the outer peripheral portion of the Si pillar 26d.

Here, the amount of the donor impurity contained in the SiO$_2$ layer 42c is smaller than that in the SiO$_2$ layer 42a for forming the N$^+$ region 37a.

Figure 2N:
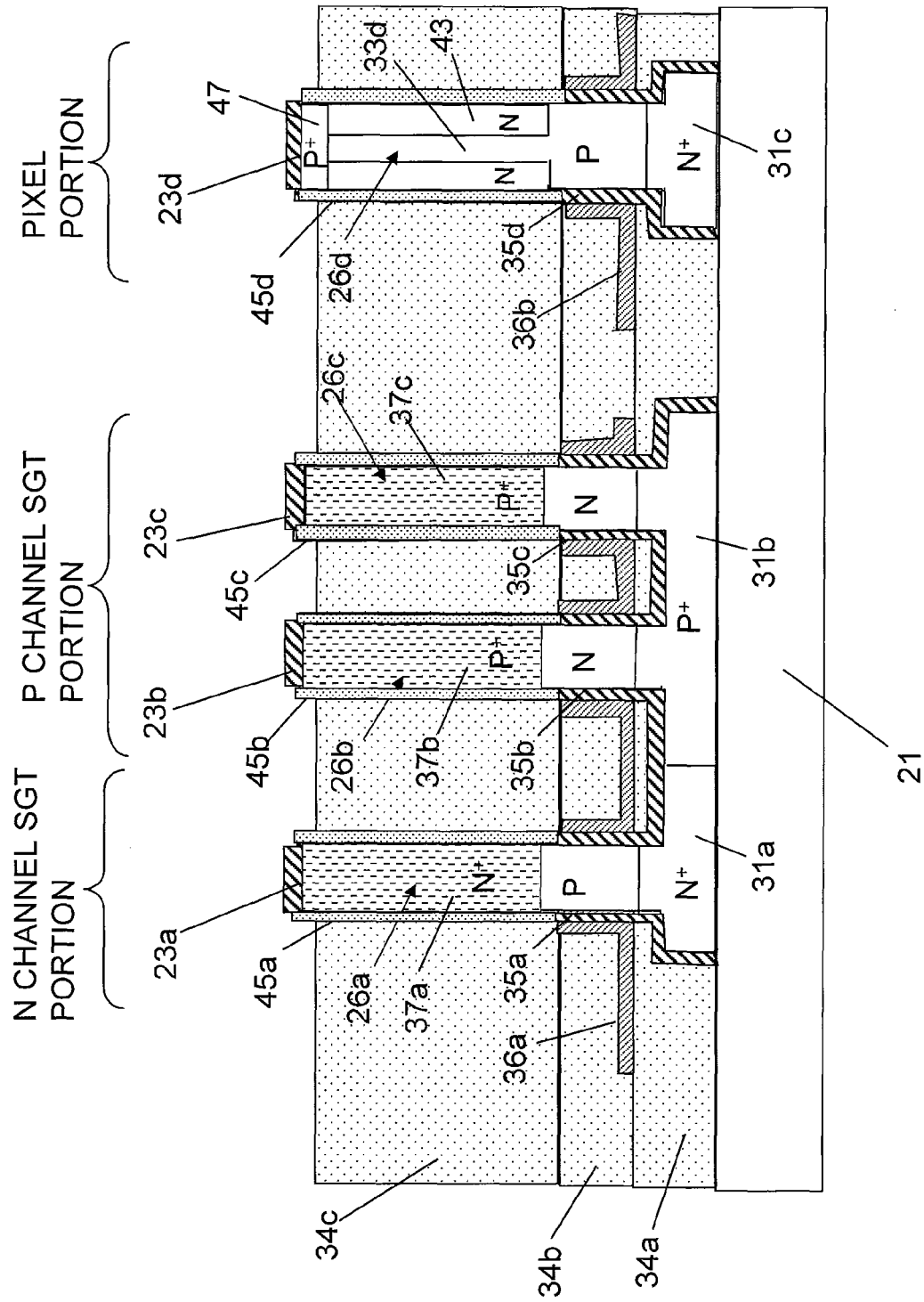
FIG. 2N is a cross-sectional structural diagram illustrating a production method for a pixel and a CMOS inverter circuit of a solid-state imaging device according to the first embodiment.

Then, the SiO$_2$ layers 39, 42a, 42b, and 42c are removed. Next, as shown in FIG. 2N, the surfaces of the Si pillars 26a, 26b, 26c, and 26d having Si surfaces exposed are oxidized to form SiO$_2$ layers 45a, 45b, 45c, and 45d.

Next, the SiN layers 24a, 24b, 24c, 24d, and 38 are removed, a third interlayer insulating layer 34c is formed, and a P$^+$ region 47 is formed, by ion implantation of an acceptor impurity such as boron (B) through the photoresist layer as a mask prepared by a photolithography technique, in an upper portion of the Si pillar 26d constituting the pixel.

Figure 2P:
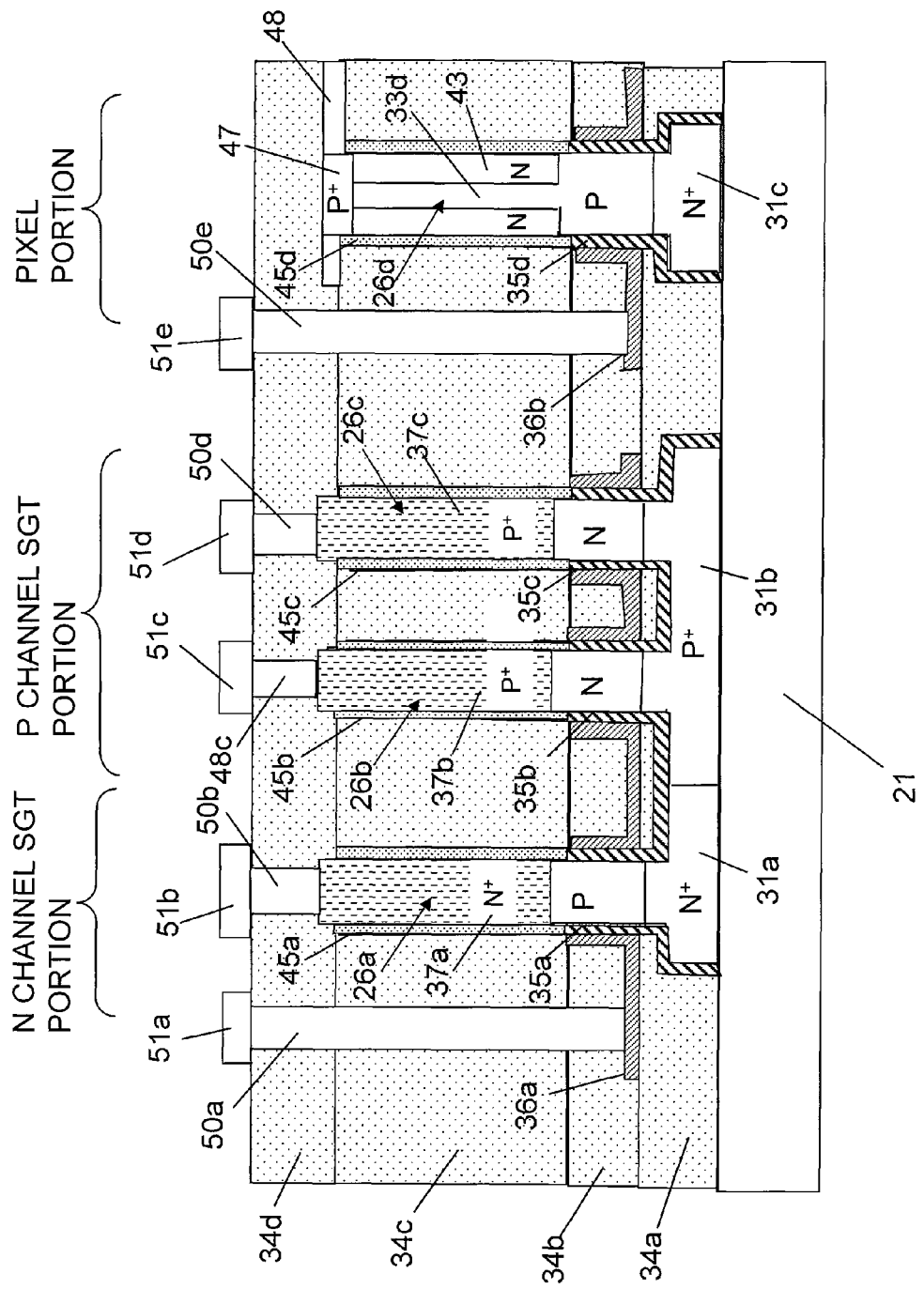
FIG. 2P is a cross-sectional structural diagram illustrating a production method for a pixel and a CMOS inverter circuit of a solid-state imaging device according to the first embodiment.

Next, as shown in FIG. 2P, the SiO$_2$ layers 23a, 23b, 23c, and 23d on the Si pillars 26a, 26b, 26c, and 26d and the SiO$_2$ layer above the third interlayer insulating layer 34c are removed, a pixel selection line conductor layer 48 composed of aluminum (Al), tungsten (W), titanium nitride (TiN), tantalum nitride (TaN), or the like is formed, a fourth interlayer insulating layer 34d is formed thereon, a contact hole 50a is formed on the gate conductor layer 36a, contact holes 50b, 50c, and 50d are formed on the Si pillars 26a, 26b, and 26c constituting the SGTs, a contact hole 50e is formed on the pixel reset gate conductor layer 36b; and, via these contact holes 50a, 50b, 50c, 50d, and 50e, the SGT gate conductor layer 36a is connected to a first metal wiring layer 51a, the N$^+$ region 37a and the P$^+$ regions 37b and 37c of the Si pillars 26a, 26n, and 26c constituting the SGTs are connected to first metal wiring layers 51b, 51c, and 51d, and the pixel reset gate conductor layer 36b is connected to a first metal wiring layer 51e.

Then, as shown in FIG. 2Q, a fifth interlayer insulating layer 34e is formed, contact holes 151a and 151b are formed, and the first metal wiring layers 51c and 51d are connected to the second metal wiring layer 52 via these contact holes 151a and 151b.

Second Embodiment

A solid-state imaging device according to a second embodiment of the present invention is described below with reference to FIGS. 3A to 3E.

Figure 3B:
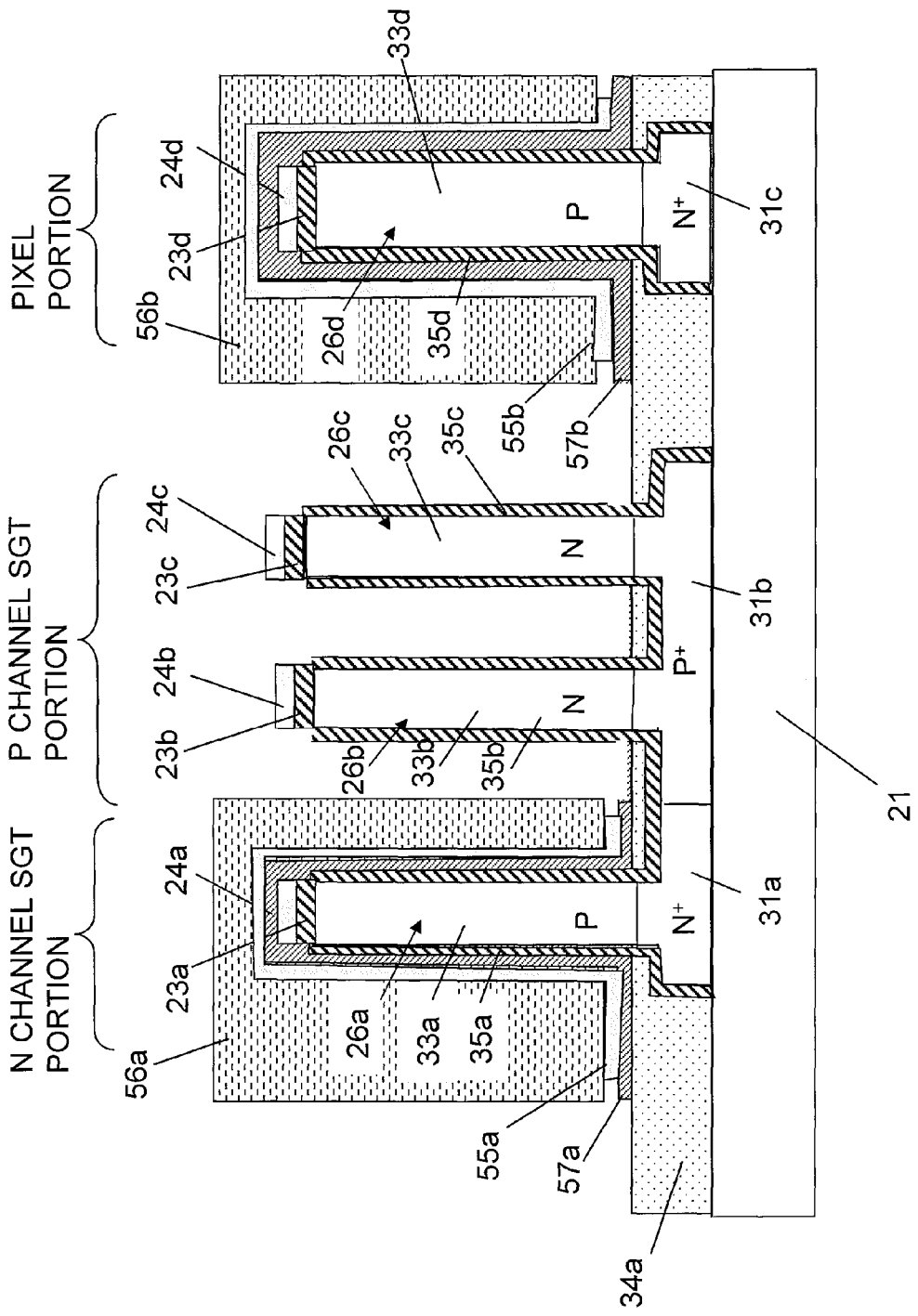
FIG. 3B is a cross-sectional structural diagram illustrating a production method for a pixel and a CMOS inverter circuit of a solid-state imaging device according to the second embodiment.
Figure 3C:
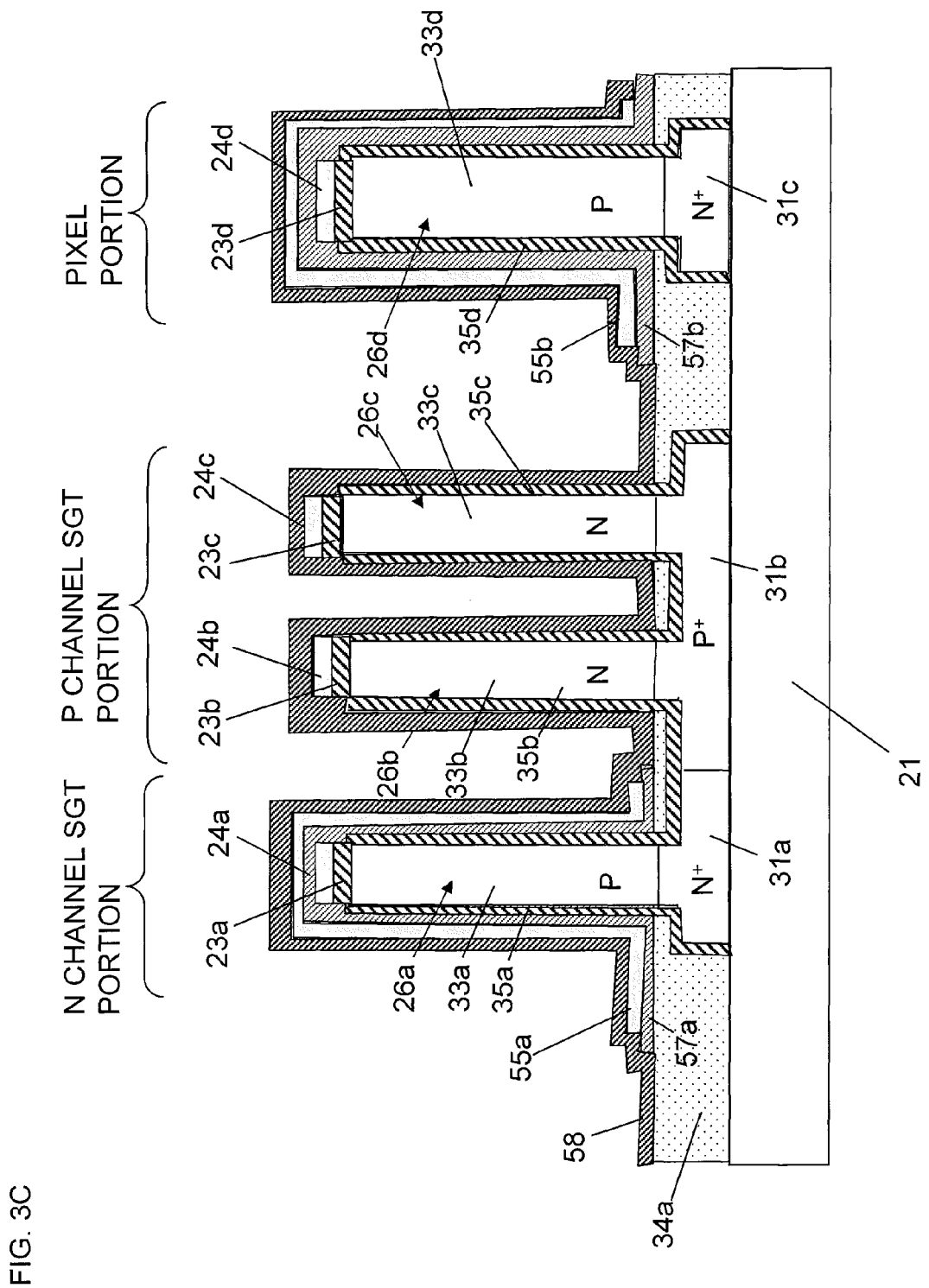
FIG. 3C is a cross-sectional structural diagram illustrating a production method for a pixel and a CMOS inverter circuit of a solid-state imaging device according to the second embodiment.
Figure 3E:
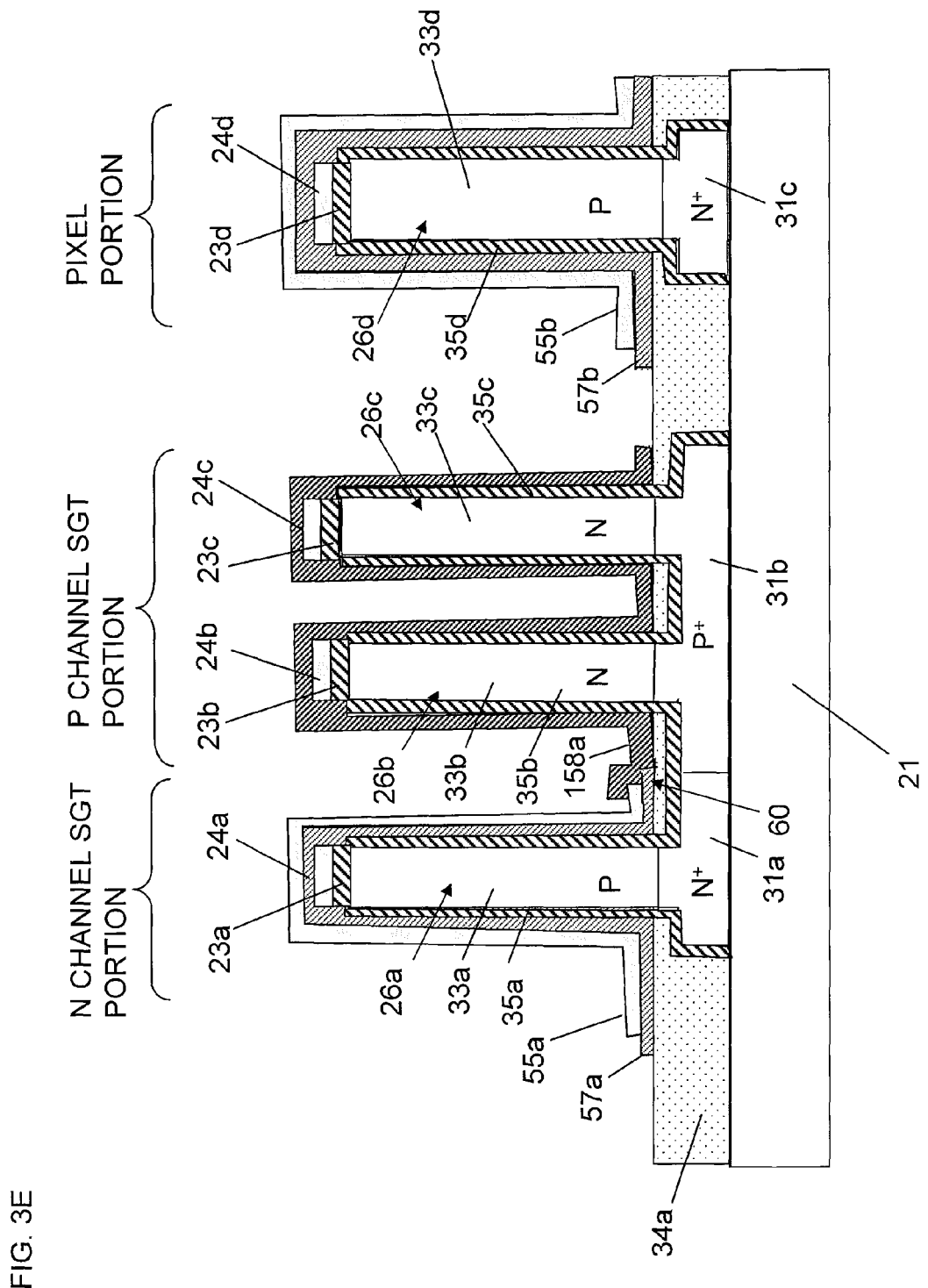
FIG. 3E is a cross-sectional structural diagram illustrating a production method for a pixel and a CMOS inverter circuit of a solid-state imaging device according to the second embodiment.

FIG. 3E shows a cross-sectional structure of a solid-state imaging device according to this embodiment and FIGS. 3A to 3D shows the production method therefor. As with FIGS. 2A to 2Q, FIGS. 3A to 3E show a cross-sectional structure taken along line A-A' in the plan view of the pixel portion and the CMOS inverter circuit portion in FIG. 1B. Whereas the N channel/P channel SGT gate conductor layer 7a is continuously formed by the same material by being connected in the first embodiment, the solid-state imaging device of this embodiment features that a plurality of gate conductor layers formed by different materials are used. For example, the technical idea of the present invention is applied to a solid-state imaging device in which the gate conductor layer of the N channel SGT and the gate conductor layer of the pixel are formed of the same material and the P channel SGT gate conductor layer is formed of a different material.

As in the case of FIG. 2G, in FIG. 3A, gate insulating layers 35a, 35b, 35c, and 35d are formed on the outer peripheral portions of the Si pillars 26a, 26b, 26c, and 26d by using a high-dielectric-constant insulating material such as SiO$_2$ or hafnium oxide (HfO$_2$), and a conductor layer 36 is formed by a CVD (chemical vapor deposition) method by using polycrystal Si, tungsten (W), cobalt (Co), platinum (Pt), a silicide material, or the like so as to surround the Si pillars 26a, 26b, 26c, and 26d on the first interlayer insulating layer 34a. The steps preceding this are the same as those described with reference to FIGS. 2A to 2F. Then a SiN layer 55 is deposited over the entirety. Thereafter, photoresist layers 56a and 56b are formed by using a photolithography technique so as to cover the N channel SGT portion and the pixel portion.

Next, as shown in FIG. 3B, the SiN layer 55 and the conductor layer 36 are etched by using the photoresist layers 56a and 56b as a mask. In this case, in etching the SiN layer 55, etching is conducted so that side etching is performed on the inner side of the regions covered with the photoresist layers 56a and 56b so as to form SiN layers 55a and 55b.

Then the photoresist layers 56a and 56b are removed. As a result, an N channel SGT portion conductor layer 57a that covers the N channel SGT portion and a pixel portion conductor layer 57b covering the pixel portion are formed.

Next, as shown in FIG. 3C, a second conductor layer 58 is formed to cover the entire structure.

Next, as shown in FIG. 3D, a photoresist layer 59 is formed by a photolithography technique so as to cover the P channel SGT portion.

Then the second conductor layer 58 is etched by using the photoresist layer 59 as a mask so as to form a P channel SGT portion conductor layer 58a. Subsequently, the photoresist layer 59 is removed. The SiN layers 55a and 55b serve as etching protection films for the N channel SGT portion conductor layer 57a and the pixel portion conductor layer 57b during etching of the conductor layer 58.

As a result, as shown in FIG. 3E, the N channel SGT portion conductor layer 57a covering the N channel SGT portion, the P channel SGT portion conductor layer 158a covering the P channel SGT portion, and the pixel portion conductor layer 57b covering the pixel portion are formed. The N channel SGT portion conductor layer 57a and the P channel SGT portion conductor layer 158a overlap each other in a border portion 60 between the two conductor layers 57a and 158a and are electrically connected to each other. Then the SiN layers 55a and 55b are removed.

The same steps as those shown in FIGS. 2H to 2Q are subsequently performed to form a cross-sectional structure shown in FIG. 3F. The N channel SGT portion conductor layer 57a, the P channel SGT portion conductor layer 58a, and the pixel portion conductor layer 57b are etched by using the first interlayer insulating layer 34a as a mask so as to form an N channel SGT portion gate conductor layer 57aa, a P channel SGT portion gate conductor layer 158bb, and a pixel portion reset gate conductor layer 57bb. As a result, the N channel SGT portion gate conductor layer 57aa, the P channel SGT portion gate conductor layer 158bb, and the pixel portion reset gate conductor layer 57bb surround the gate insulating layer 35a on the outer periphery of the Si pillar 26a constituting the N channel SGT, the gate insulating layers 35b and 35c on the outer peripheries of the Si pillars 26b and 26c constituting the P channel SGTs, and the gate insulating layer 35d of the Si pillar constituting the pixel are formed and wired on the same first interlayer insulating layer 34a.

Figure 3F:
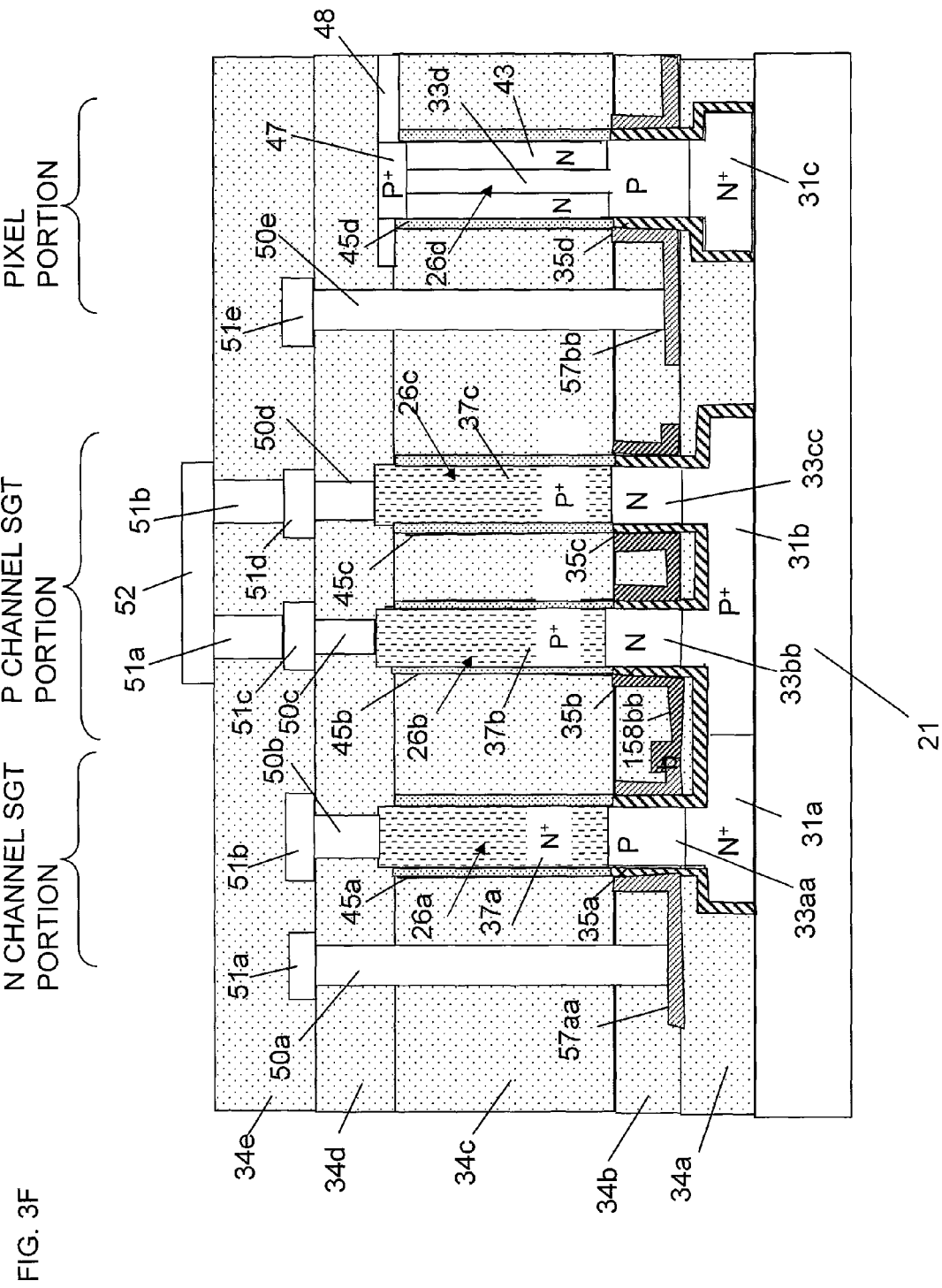
FIG. 3F is a cross-sectional structural diagram illustrating a production method for a pixel and a CMOS inverter circuit of a solid-state imaging device according to the second embodiment.

The cross-sectional structural diagram of FIG. 3F is the same as that of FIG. 2Q except that the P channel SGT portion gate conductor layer 58bb is composed of a different material from the N channel SGT portion gate conductor layer 57aa and the pixel portion reset gate conductor layer 57bb. Accordingly, the second embodiment has the same features as those of the first embodiment.

A P region 33aa of the Si pillar 26a constituting the N channel. SGT, the N regions 33b and 33c of the Si pillars 26b and 26c constituting the P channel SGTs, and the P region 33d of the Si pillar constituting the pixel may be of an intrinsic type. In this case, the threshold voltages of the N channel and P channel SGTs and the pixel reset transistor are set according to the difference in work function of the gate conductor layers 57aa, 58bb, and 57bb. Here, the photolithography step for forming the P regions 33a and 33d and the N region 33b and 33c described in the first embodiment with reference to FIGS. 2E and 2F and the step of implanting ions of the acceptor impurity and the donor impurity are no longer needed.

Third Embodiment

Figure 4A:
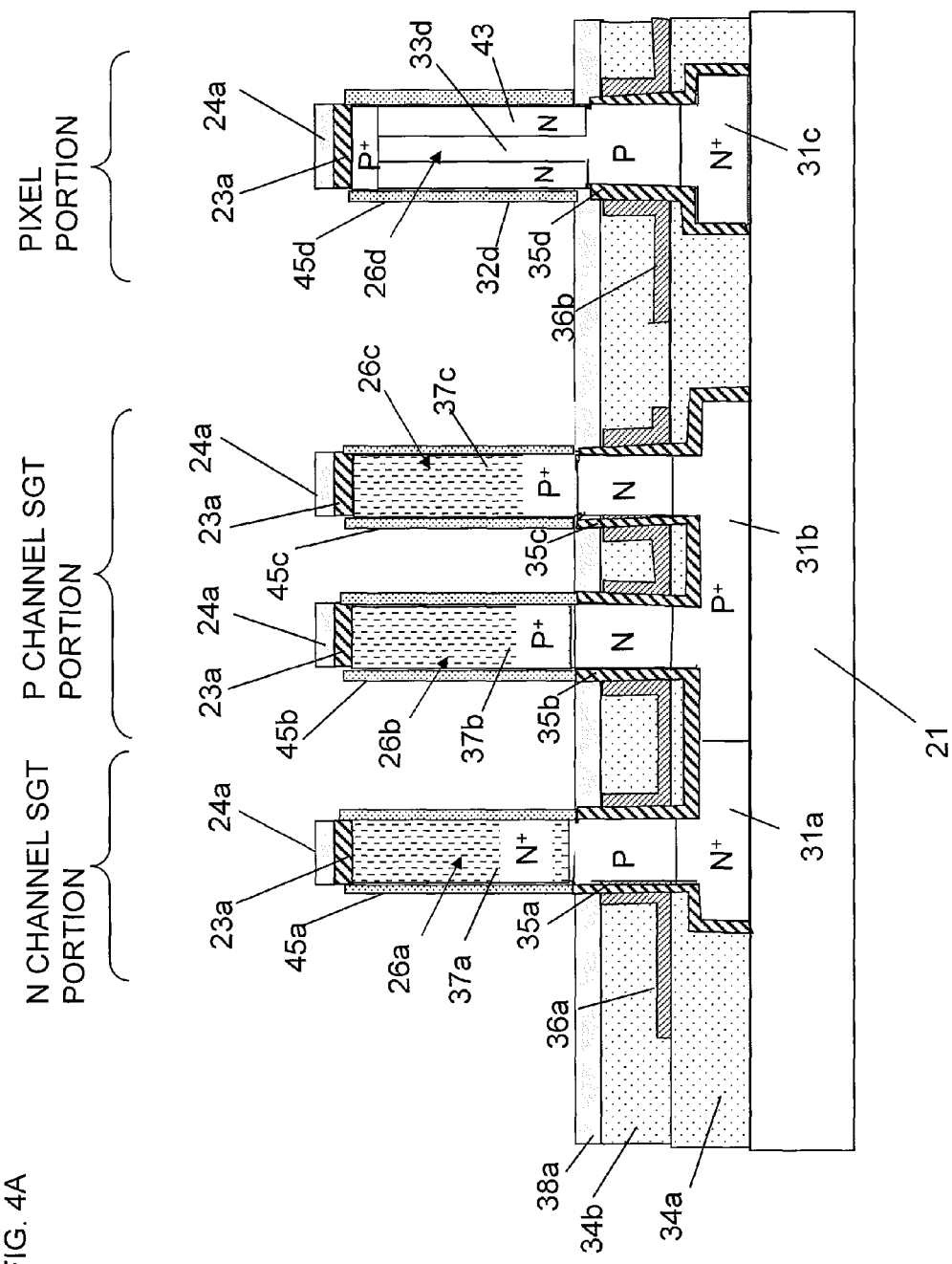
FIG. 4A is a cross-sectional structural diagram illustrating a production method for a pixel and a CMOS inverter circuit of a solid-state imaging device according to a third embodiment of the present invention.
Figure 4B:
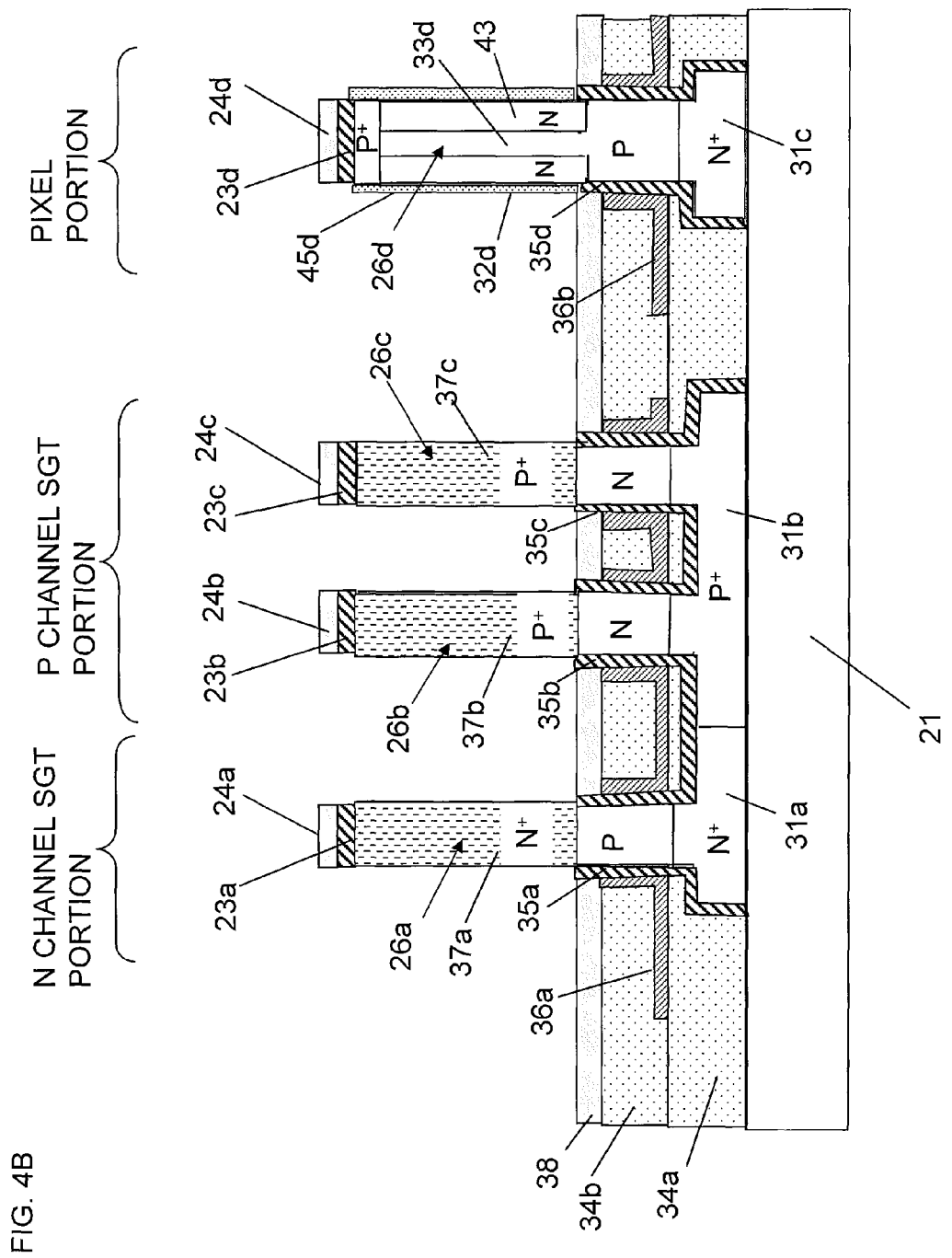
FIG. 4B is a cross-sectional structural diagram illustrating a production method for a pixel and a CMOS inverter circuit of a solid-state imaging device according to the third embodiment.
Figure 4D:
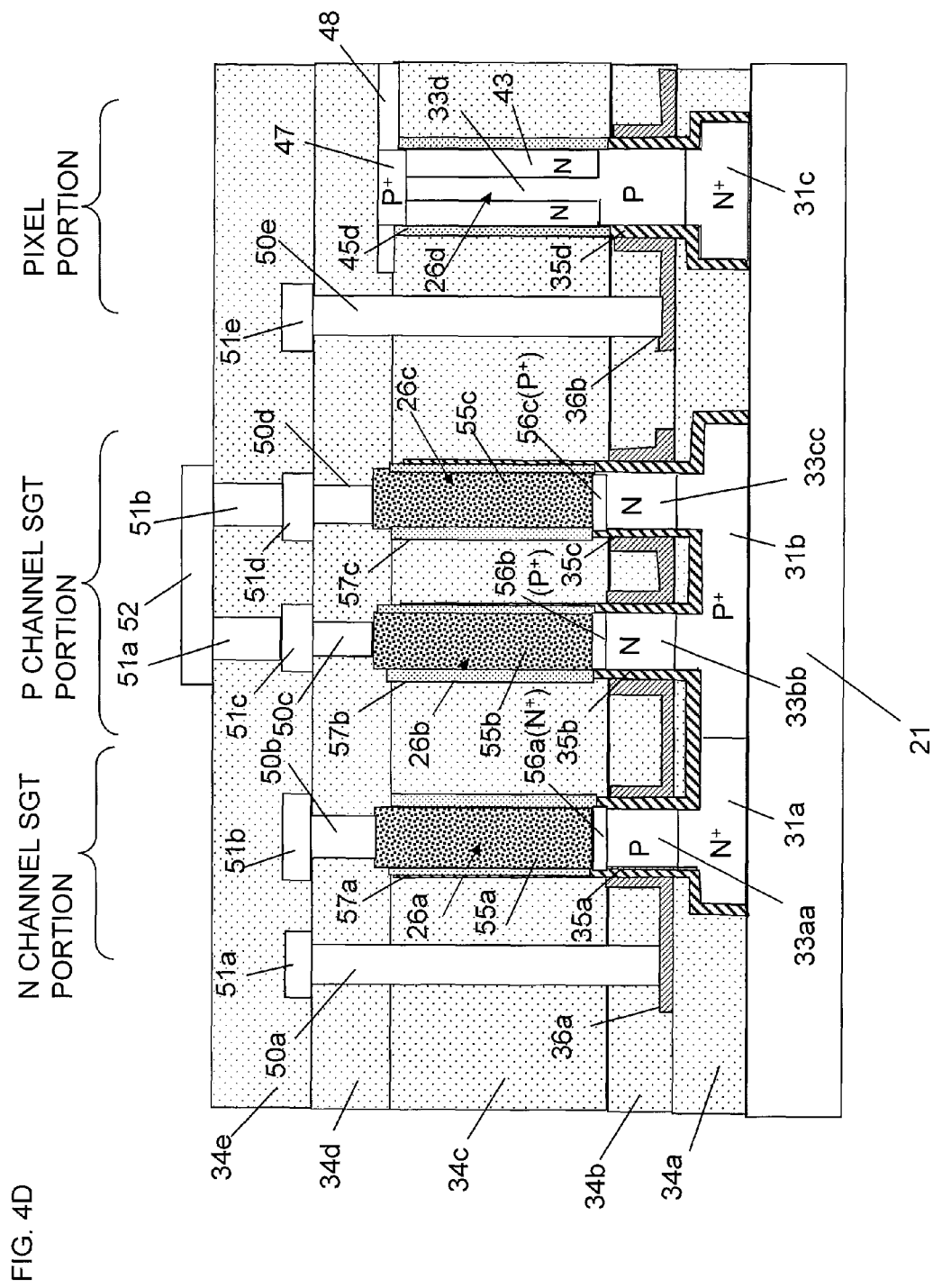
FIG. 4D is a cross-sectional structural diagram illustrating a production method for a pixel and a CMOS inverter circuit of a solid-state imaging device according to the third embodiment.

A solid-state imaging device according to a third embodiment of the present invention is described below with reference to FIGS. 4A to 4D. FIG. 4D shows a cross-sectional structure of the solid-state imaging device according to this embodiment and FIGS. 4A to 4C show a production method up to FIG. 4D. As with FIGS. 2A to 2Q, FIGS. 4A to 4D show a cross-sectional structure of the pixel portion and the CMOS inverter circuit portion taken along line A-A' in the plan view of FIG. 1B.

In FIG. 1C illustrating the first embodiment, the drain $N^+$ region 8a which is a drain of the N channel SGT and the $P^+$ regions 8b and 8c which are drains of the P channel SGTs in the upper portions of the Si pillars 4a, 4b, and 4c constituting the SGTs are connected from the upper surfaces of the Si pillars 4a, 4b, and 4c to the first metal wiring layers 12b, 12c, and 12d via the contact holes 11a, 11b, and 11c. In this case, the drain resistance of the N channel and P channel SGTs is determined by the resistance value of the $N^+$ region 8a and the $P^+$ regions 8b and 8c. The resistance value is preferably as low as possible. In this embodiment, the upper portions of the $N^+$ region 8a and the $P^+$ regions 8b and 8c are composed of a silicide layers to decrease the electrical resistance.

FIG. 4A shows a cross-sectional structure obtained by performing the same steps as those shown in FIGS. 2A to 2L up to formation of the SiN layer 38 on the first interlayer insulating layer 34a in FIG. 2M, forming a new SiN layer 38a on the first interlayer insulating layer 34a, and performing the same steps as those shown in FIGS. 2M and 2N to form the $N^+$ region 37a in the upper portion of the Si pillar 26a constituting the N channel SGT, form $P^+$ regions 37b and 37c in the upper portions of the Si pillars 26b and 26c constituting the P channel SGTs, form the N region 43 in the outer peripheral portion in the upper portion of the Si pillar 26d constituting the pixel, form the $P^+$ region 47 on the upper surface of the Si pillar 26d constituting the pixel, and form the insulating layers 45a, 45b, 45c, and 45d on the outer peripheral portions of the Si pillars 26a, 26b, 26c, and 26d.

Next, as shown in FIG. 4B, the insulating layers 45a, 45b, and 45c on the outer peripheries of the Si pillars 26a, 26b, and 26c constituting the N channel and P channel SGTs are removed.

Then, as shown in FIG. 4C, the entire structure is covered with a metal layer 54 containing, for example, tungsten (W), platinum (Pt), nickel (Ni), or cobalt (Co) while performing a heat treatment so as to form silicide layers 55a, 55b, and 55c in the Si pillars 26a, 26b, and 26c constituting the N channel and P channel SGTs. During this process, the difference in segregation coefficient between the acceptor and donor impurities in silicide and Si causes a snow-plow effect and thereby forms an $N^+$ region 56a and $P^+$ regions 56b and 56c in the lower portions of the silicide layers 55a, 55b, and 55c. Then the metal layer 54 is removed.

Next, the same steps as those shown in FIGS. 2N to 2Q are performed to obtain the cross-sectional structure shown in FIG. 4D.

As a result, the $N^+$ region 56a and the $P^+$ regions 56b and 56c function as drains of the N channel and P channel SGTs and the connection between the $N^+$ region 56a and the $P^+$ regions 56b and 56c and the first metal wiring layers 51b, 51c, and 51d is established via the silicide layers 55a, 55b, and 55c having lower electrical resistance values.

Fourth Embodiment

A solid-state imaging device according to a fourth embodiment of the present invention is described below with reference to FIG. 5.

Figure 5:
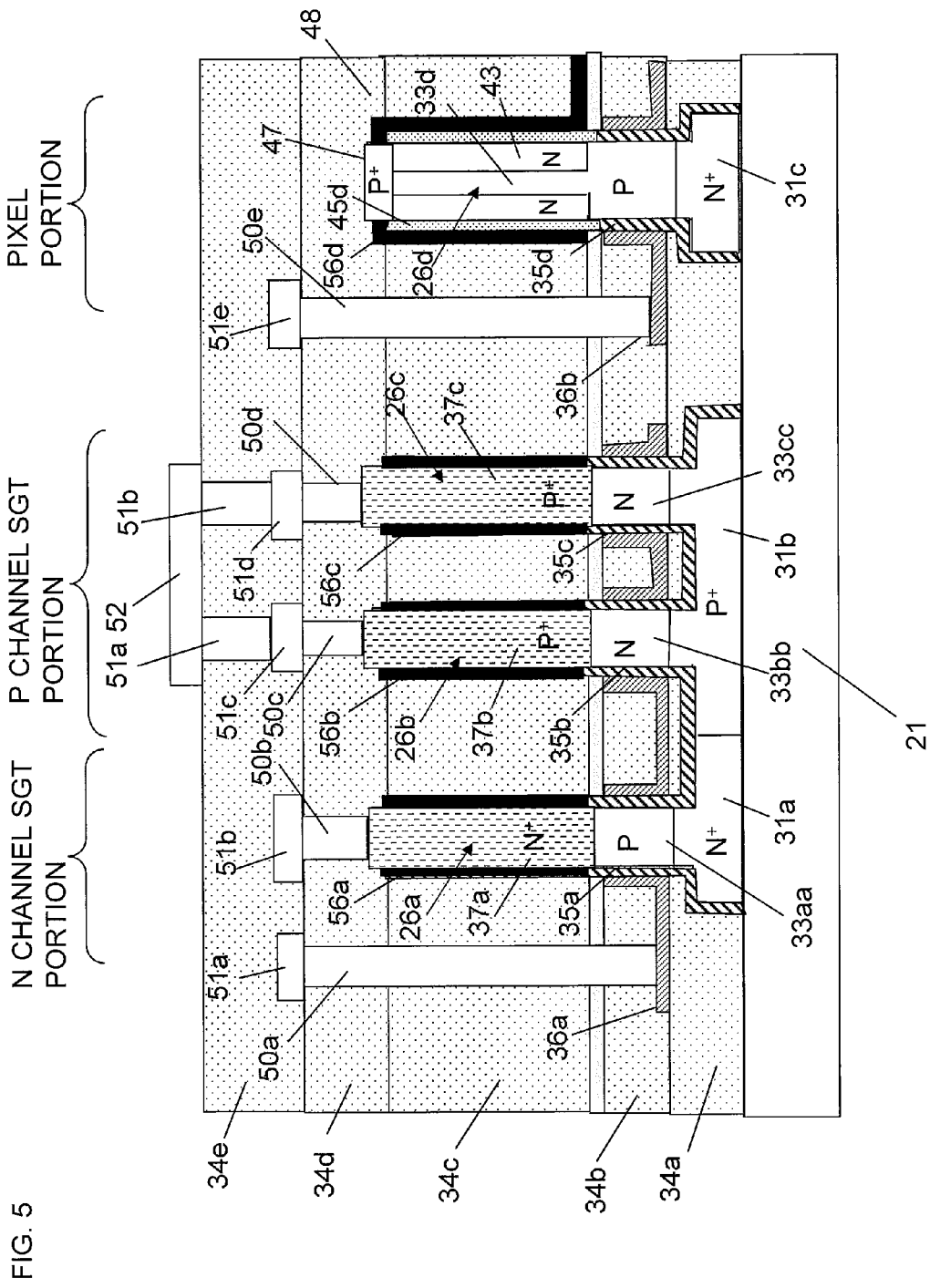
FIG. 5 is a cross-sectional structural diagram of a pixel and a CMOS inverter circuit of a solid-state imaging device according to a fourth embodiment of the present invention.

In this embodiment, as shown in FIG. 5, metal layers 56a, 56b, and 56c containing, for example, tungsten (W), platinum (Pt), nickel (Ni), or cobalt (Co) are formed so as to surround an N+ region 37a, a P+ region 37b, and a P+ region 37c. As a result, the connection between the upper ends of the channels 33aa, 33bb, and 33cc and the first metal wiring layers 51b, 51c, and 51d is established through the metal layers 56a, 56b, and 56c having lower electrical resistance values. Accordingly, the same effects as in the third embodiment are achieved.

When a pixel selection line metal layer 56d that connects to the $P^+$ region on the upper surface of the Si pillar 26d constituting the pixel and surrounds the $SiO_2$ layer 45d formed on the outer periphery of the Si pillar 26d constituting the pixel is formed simultaneously with the metal layers 56a, 56b, and 56c, there is no need to separately form the pixel selection line conductor layer 108a in FIG. 1C. Moreover, since the pixel selection line metal layer 56d here is formed so as to surround the N region 43 of the photodiode portion which is a photoelectric conversion region, it becomes possible to prevent color mixing in the color imaging that occurs when a beam obliquely incident on the Si pillar 26d constituting the pixel enters a Si pillar constituting an adjacent pixel, and the decrease in resolution.

Fifth Embodiment

Figure 6:
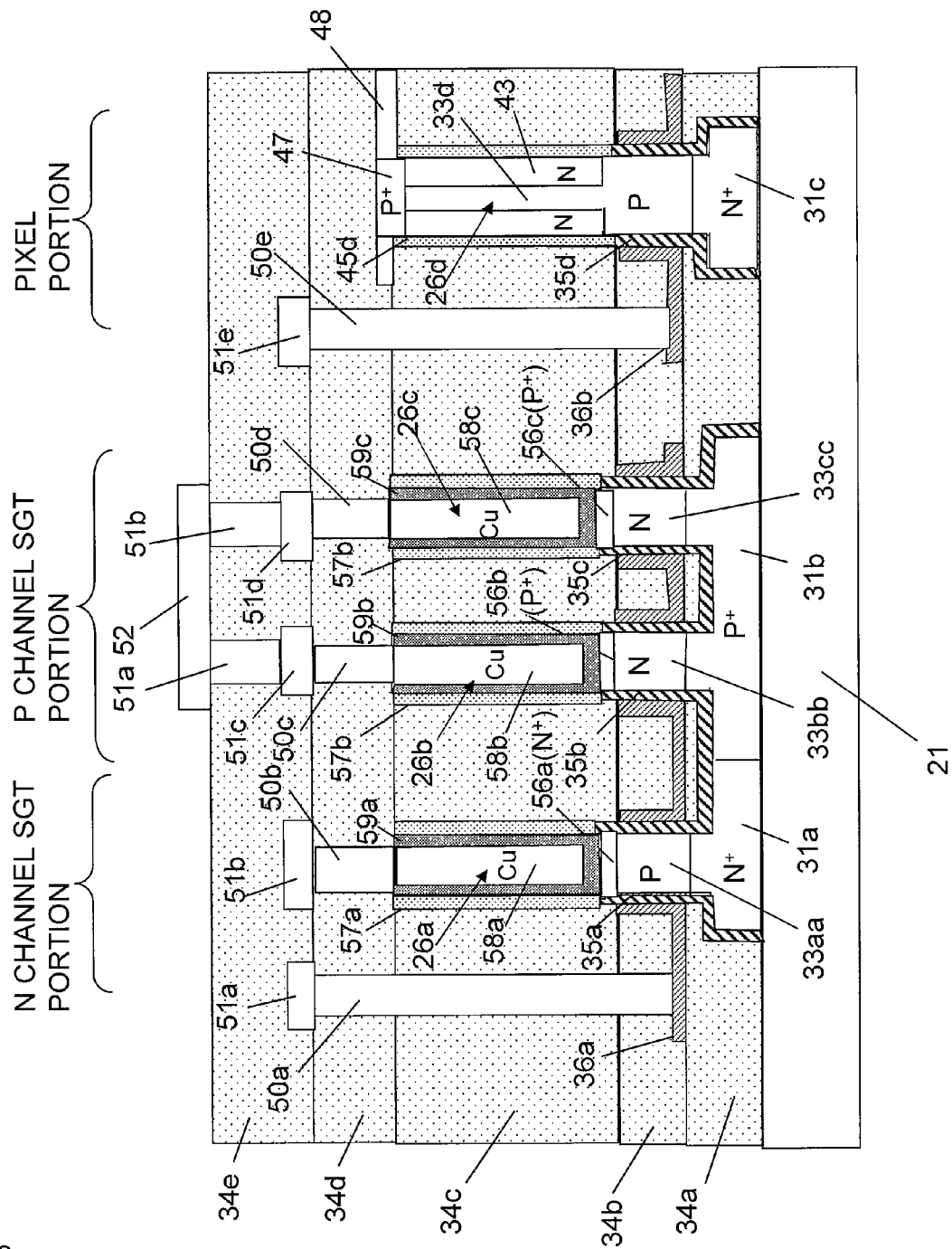
FIG. 6 is a cross-sectional structural diagram of a pixel and a CMOS inverter circuit of a solid-state imaging device according to a fifth embodiment of the present invention.

A solid-state imaging device according to a fifth embodiment of the present invention is described below with reference to FIG. 6.

In the third embodiment shown in FIG. 4D, the electrical resistance values between the $N^+$ region 56a and the $P^+$ regions 56b and 56c of the drains and the first metal wiring layers 51b, 51c, and 51d are lowered by providing the silicide layers 55a, 55b, and 55c on the $N^+$ region 56a of the drain of the N channel SGT and the $P^+$ regions 56b and 56c of the drains of the P channel SGTs. In contrast, in this embodiment, as shown in FIG. 6, metal layers 58a, 58b, and 58c of copper (Cu) are formed instead of the silicide layers 55a, 55b, and 55c. This can further lower the electrical resistance values between the $N^+$ region 56a and the $P^+$ regions 56b and 56c of the drains and the first metal wiring layers 51b, 51c, and 51d. Note that when the Cu metal layers 58a, 58b, and 58c are formed by a Damascene technique, barrier seed layers 59a, 59b, and 59c that are formed of material layers such as TiN TaN, or Cu, prevent the reaction and diffusion with the Cu metal layers 58a, 58b, and 58c, and maintain adhesion to the Cu metal layers 58a, 58b, and 58c are formed between the Cu metal layers 58a, 58b, and 58c and the insulating layers 57a, 57b, and 57c and on the upper surfaces of the $N^+$ region 56a and the $P^+$ regions 56b and 56c.

Sixth Embodiment

Figure 7A:
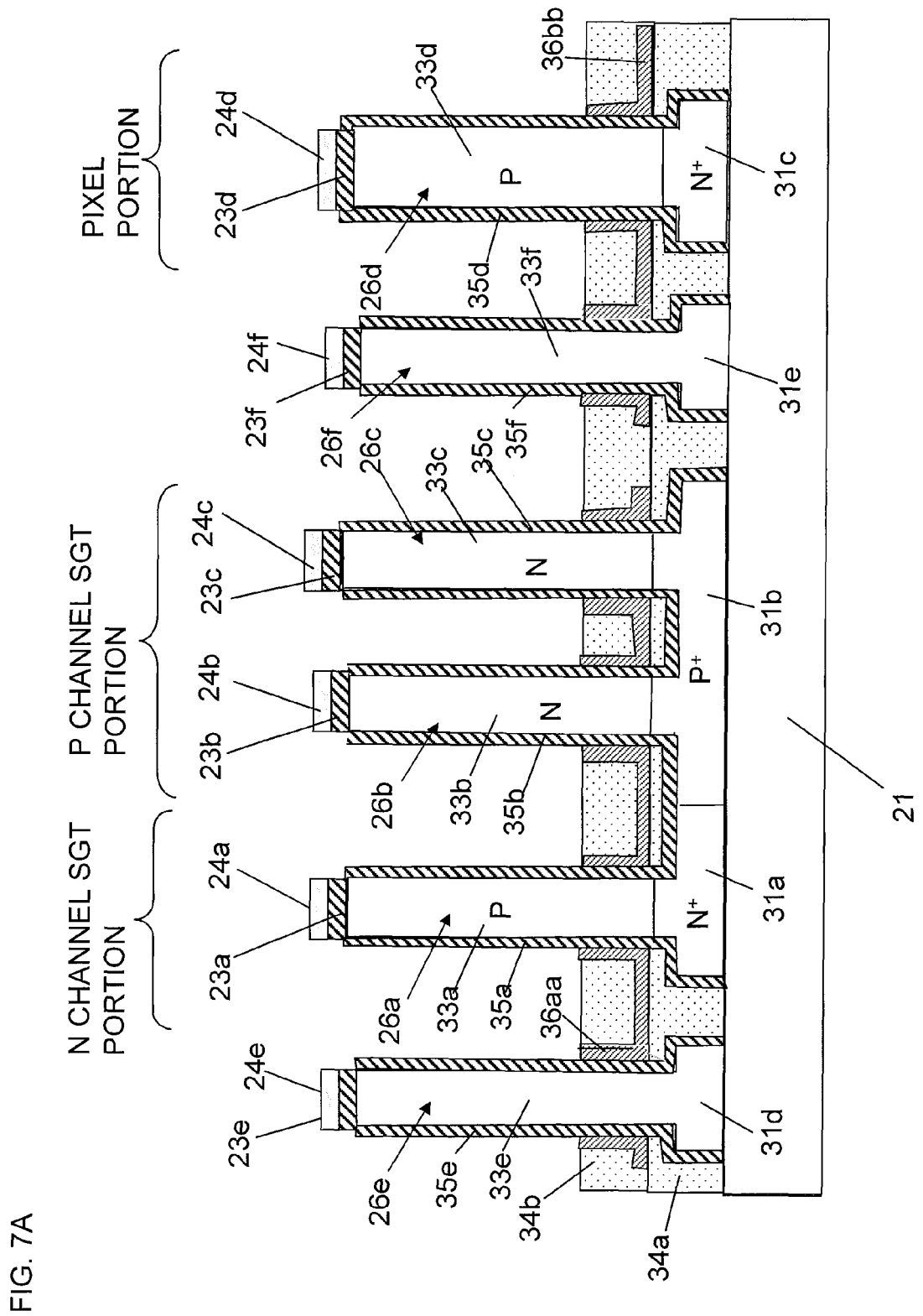
FIG. 7A is a cross-sectional structural diagram of a pixel and a CMOS inverter circuit of a solid-state imaging device according to a sixth embodiment of the present invention.
Figure 7B:
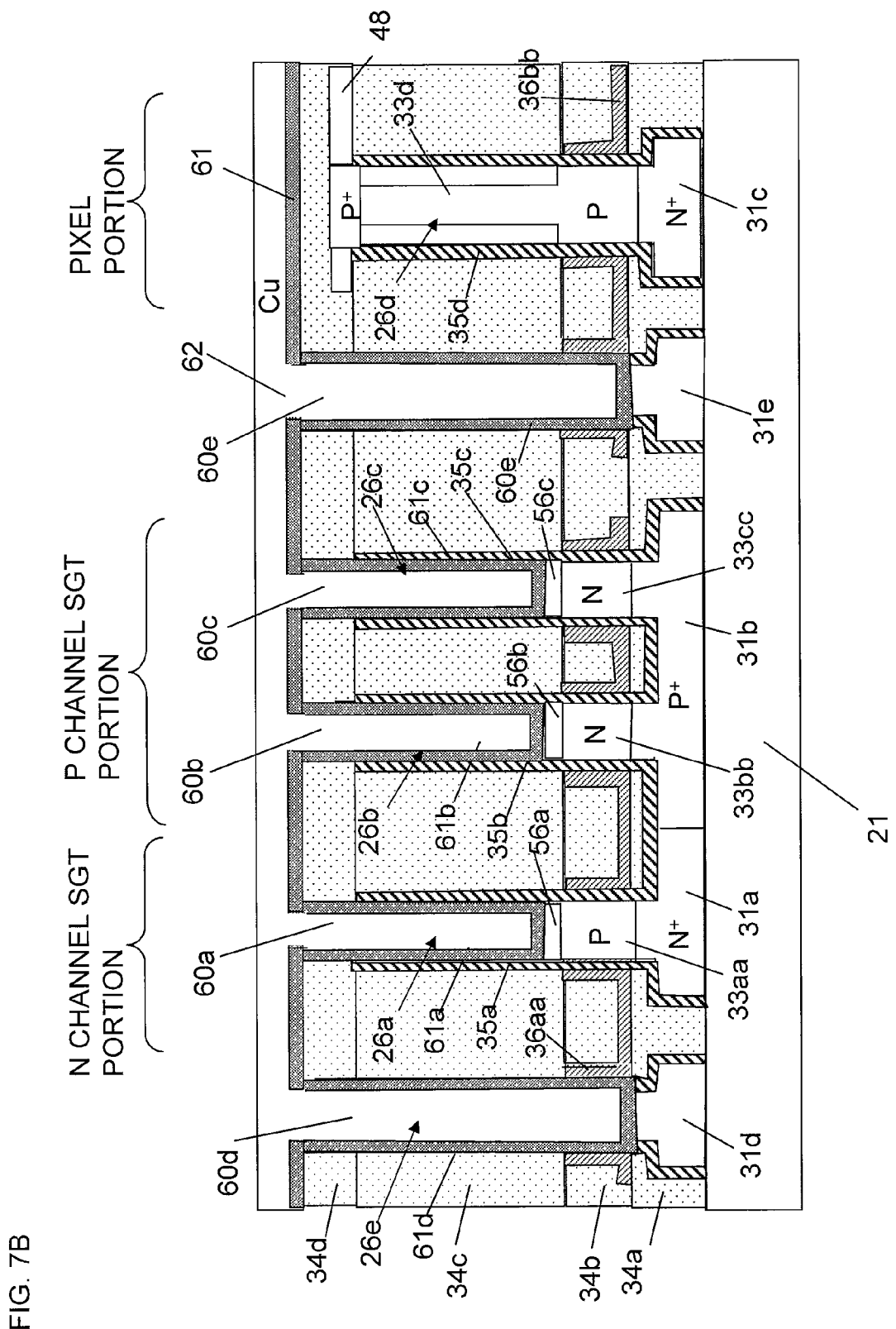
FIG. 7B is a cross-sectional structural diagram of a pixel and a CMOS inverter circuit of a solid-state imaging device according to the sixth embodiment.
Figure 7C:
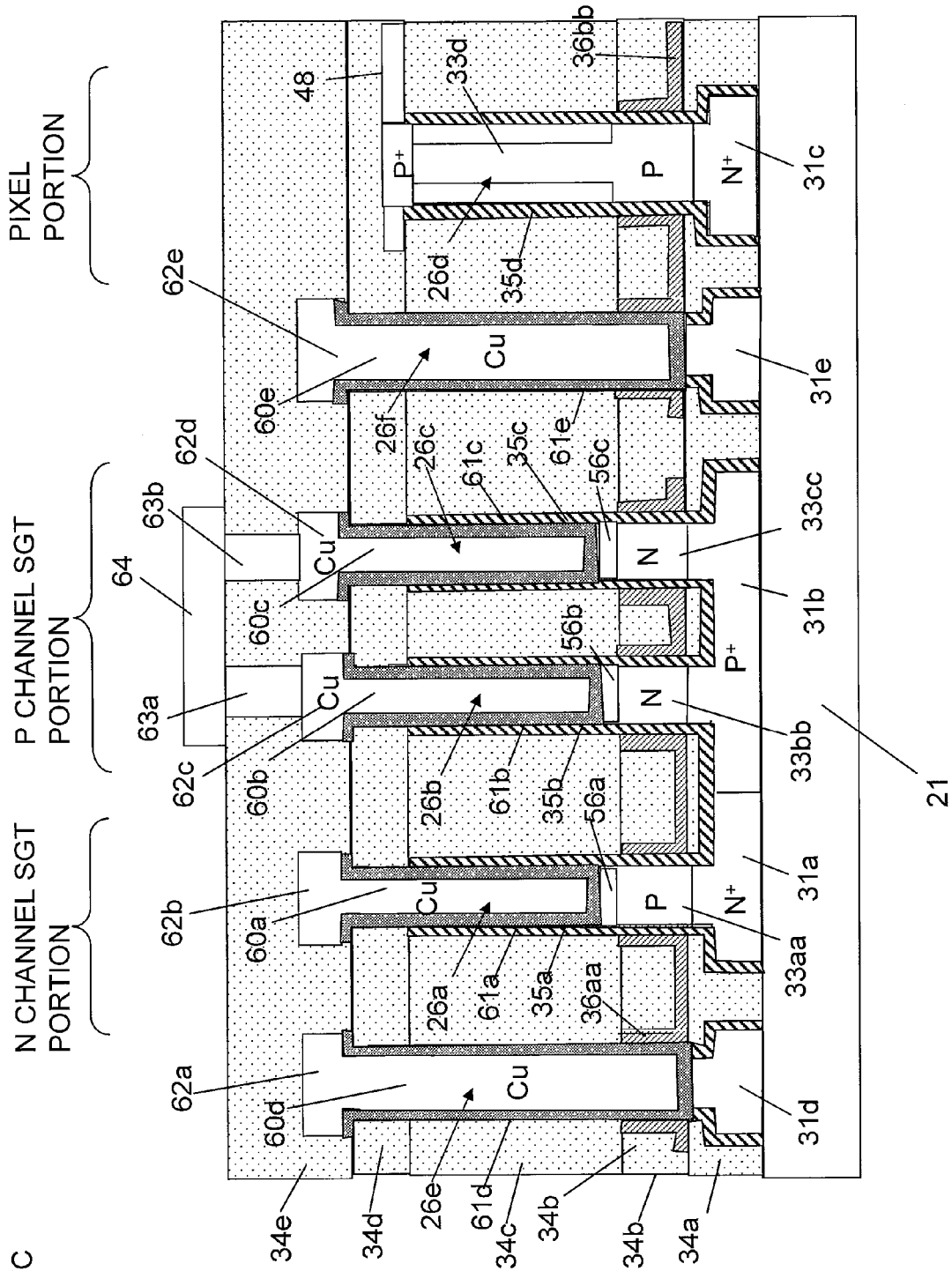
FIG. 7C is a cross-sectional structural diagram of a pixel and a CMOS inverter circuit of a solid-state imaging device according to the sixth embodiment.

A solid-state imaging device according to a sixth embodiment of the present invention is described below with reference to FIGS. 7A to 7C. FIG. 7C is a cross-sectional structural diagram of the solid-state imaging device of this embodiment and FIGS. 7A and 7B show the production method therefor.

In the first embodiment shown in FIG. 1C, the N channel/P channel SGT gate conductor layer 7a and the reset gate conductor layer 105a of the pixel are connected to the first metal wiring layers 12a and 12e via the deep contact holes 9a and 9b. These contact holes 9a and 9b are formed by etching the first, second, and third interlayer insulating layers 14a, 14b, and 14c on the N channel/P channel SGT gate conductor layer 7a and the reset gate conductor layer 105a of the pixel. In such a case, etching for forming the deep contact holes 9a and 9b needs to be stopped with good controllability on the N channel/P channel SGT gate conductor layer 7a and the reset gate conductor layer 105a of the pixel. Moreover, in order not to remove the N channel/P channel SGT gate conductor layer 7a and the reset gate conductor layer 105a of the pixel by overetching, the thickness of the N channel/P channel SGT gate conductor layer 7a and the reset gate conductor layer 105a of the pixel needs to be increased. Such a difficulty in production can be overcome by this embodiment.

The pixel signal line N$^+$ region 31c, the N$^+$ region 31a and the P$^+$ region 31b of the SGT portions, the Si pillar 26d constituting the pixel, the Si pillars 26a, 26b, and 26c constituting the SGTs, and, simultaneously, Si pillars 31d and 31e and Si pillars 26e and 26f constituting gate conductor layer contacts are formed on a SiO$_2$ substrate 21 (Si layers 33e and 33f inside the Si pillars 26e and 26f constituting the gate conductor layer contacts may be of a P type, an N type, or an intrinsic type).

Next, simultaneously with the gate insulating layers 35a, 35b, 35c, and 35d, insulating layers 35e and 35f are formed on the outer peripheral portions of the Si pillars 26e and 26f constituting the gate conductor layer contacts.

Next, the first interlayer insulating layer 34a is formed and a SGT gate conductor layer 36aa is formed so as to surround the Si pillars 26a, 26b, and 26c constituting the SGTs and the Si pillar 26e constituting the gate conductor layer contact, and, similarly, a pixel reset gate conductor layer 36bb is formed so as to surround the Si pillar 26d constituting the pixel and the Si pillar 26f constituting the gate conductor layer contact. The gate conductor layer 36aa and the reset gate conductor layer 36bb are wired on the first interlayer insulating layer 34a and formed to have the same height as the second interlayer insulating layer 34b so as to surround the Si pillars 26a, 26b, 26c, 26d, 26e, and 26f. The steps preceding this are basically the same as the steps shown in FIGS. 2A to 2I.

Then, through the same step as that shown in FIG. 4D, the silicide layers 55a, 55b, and 55c, and the N$^+$ region 56a and the P$^+$ regions 56b and 56c of the drains of the SGTs are formed in the Si pillars 26a, 26b, and 26c constituting the SGTs, and then the silicide layers 55a, 55b, and 55c are removed.

As a result, as shown in FIG. 7B, holes 60a, 60b, and 60c are formed on the N$^+$ region 56a and the P$^+$ regions 56b and 56c of the drains of the Si pillars 26a, 26b, and 26c constituting the SGTs.

Next, the Si layers 33e and 33f of the Si pillars 26e and 26f constituting the gate conductor layer contacts are etched to a position lower than the upper ends of the gate conductor layer 36aa and the pixel reset gate conductor layer 36bb.

Then the SiO$_2$ layers 35e and 35f exposed by the etching are removed to form holes 60d and 60e.

Then a barrier seed layer 61 that is formed of a conductor material layer such as TiN, TaN, or Cu, is needed for forming the Cu layer 62 by a Damascene technique, prevents reaction and diffusion with Cu, and maintains adhesion to the Cu metal layer 62 is formed on the inside surfaces of the holes 60a, 60b, 60c, 60d, and 60e and on the fourth interlayer insulating layer 34d.

Then the Cu layer 62 is formed inside the holes 60a, 60b, 60c, 60d, and 60e and on the fourth interlayer insulating layer 34d by a plating method. As a result, the SGT gate conductor layer 33aa and the pixel reset gate conductor layer 36bb electrically connect to the Cu layer 62 via the barrier seed layer 61 which is a conductor material layer.

Next, as shown in FIG. 7C, the Cu layer 62 and the barrier seed layer 61 are etched to form first metal wiring layers 62a, 62b, 62c, 62d, and 62e.

Then the entire structure is covered with the fifth interlayer insulating layer 34e, contact holes 63a and 63b are formed on the P channel SGT first metal wiring layers 62c and 62d, and the P channel SGT first metal wiring layers 62c and 62d are connected, via the contact holes 63a and 63b, to a second metal wiring layer 64 formed on the fifth interlayer insulating layer 34e.

In the solid-state imaging device of this embodiment, the Si layers 33e and 33f of the Si pillars 26e and 26f constituting the gate conductor layer contacts may be etched to a position lower than the position of the upper ends of the gate conductor layer 36aa and the pixel reset gate conductor layer 36bb and may be etched to the upper surface of the SiO$_2$ substrate 21. Accordingly, the etching step is facilitated. During etching, the SGT gate conductor layer 36aa and the reset gate conductor layer 36bb are protected with the SiO$_2$ layers 35e and 35f; hence, there is no need to increase the thickness of the gate conductor layer 36aa and the pixel reset gate conductor layer 36bb unlike the case shown in FIG. 1C.

The features of this embodiment are as follows:

The Si pillars 26e and 26f constituting the SGT gate conductor layer 36aa and the reset gate conductor layer 36bb of the pixel and having the same height as the Si pillar 26d constituting the pixel and the Si pillars 26a, 26b, and 26c constituting the SGTs are formed simultaneously with the Si pillar 26d constituting the pixel and the Si pillars 26a, 26b, and 26c constituting the SGTs;

The SGT gate conductor layer 36aa and the reset gate conductor layer 36bb are directly connected to the second metal wiring layers 62a and 62e formed of Cu by replacing the Si layers 33e and 33f inside the Si pillars 26e and 26f; and The SGT gate conductor layer 36aa and the reset gate conductor layer 36bb are formed simultaneously and at the same height so as to surround the Si pillars 26e and 26f constituting the gate conductor layer contacts, the Si pillar 26d constituting the pixel, and the Si pillars 26a, 26b, and 26c constituting the SGTs.

As a result, production can be facilitated as described above.

In the steps shown in FIGS. 7A to 7C, all of the silicide layers 55a, 55b, and 55c are removed; alternatively, part of silicide on the drain N$^+$ region 56a and P$^+$ regions 56b and 56c may be left unremoved.

The silicide layers 55a, 55b, and 55c may instead be the N$^+$ region 8a and P$^+$ regions 8b and 8c shown in FIG. 1C.

The metal material formed inside the holes 60a, 60b, 60c, 60d, and 60e may be a conductor material layer containing W, Co, Ni, or Ti instead of Cu.

In the first to sixth embodiments, the case in which island-shaped semiconductors P11 to P33 constituting pixels are present in the pixel region and SGTs are present in the drive output circuit is described. However, the technical idea of the present invention can naturally be applied to the cases in which SGTs are formed so as to be next to the pixels of in the pixel region.

In the island-shaped semiconductor P11 constituting the pixel in the first to sixth embodiment, the N regions 8d and 43 constituting the photodiode are formed in the surface layer of the outer peripheral portion of the Si pillar P11 constituting the island-shaped semiconductor constituting the pixel; however, in order to reduce dark current and noise, P+ regions for accumulating charges (holes) having a polarity opposite to the signal charges (free electrons) may be formed in the surface layer of the island-shaped semiconductor P11 constituting the pixel, and in the outer peripheral portions of the N regions 8d and 43.

The pixel reset gate conductor layers 105a, 36b, and 36bb formed simultaneously with and at the same height as the SGT gate conductor layers 7a, 36a, and 36aa may be provided as light-shielding layers and not for discharging signal charges accumulated in the photodiode to the pixel signal line N+ region 2 or 31c.

The case in which the SGT gate conductor layer 36aa and the reset gate conductor layer 36bb are connected to the first metal wiring layers 62a and 62e via the Cu layer 62 formed in the Si pillars 26e and 26f constituting the gate conductor layer contacts has been described with reference to FIGS. 7A to 7C; however, the technical idea of the present invention can be applied to the case in which, for example, in the schematic plan view of FIG. 1B, the pixel reset gate conductor layer 105a (the reset gate conductor layer 36bb in FIG. 7C), the SGT source N+ region 3a (N+ region 31a in FIG. 7C), and the source P+ region 3b (the P+ region 31bb in FIG. 7C) are connected via the contact hole 9 and the first metal wiring layer 12e. In such a case, a Si pillar constituting a contact is formed on the contact hole 9 portion and the same method as that shown in FIGS. 7A to 7C is conducted so as to establish a connection between the pixel reset gate conductor layer 7b (gate conductor layer 36bb in FIG. 7C), the SGT source N+ region 3a (N+ region 31a in FIG. 7C), and the source P+ region 3b (P+ region 31bb in FIG. 7C).

In the description of the schematic plan view and the cross-sectional view of FIGS. 1B and 1C, the silicon oxide substrate 1 (SiO$_2$ substrate) is used as a substrate. Alternatively, this substrate may be a layer composed of another insulating material or a semiconductor layer. In the case where a semiconductor layer is used, the semiconductor layer can be used as a substrate by forming a diffusion layer with which a solid-state imaging device can operate, the diffusion layer containing a donor or an acceptor, so as to be connected to all of or part of the N+ layer 3a, 102a, and P+ region 3b. This also applies to solid-state imaging devices or semiconductor devices of the other embodiments.

Note that the present invention allows various embodiments and modifications without departing from the broad spirit and scope of the present invention. The embodiments described above are merely illustrative and do not limit the scope of the invention.

The preset invention is widely applicable to semiconductor devices such as solid-state imaging devices in which circuit elements are formed for pillar-shaped semiconductors such as SGTs.

What is claimed is:

1. A solid-state imaging device comprising pixels arranged in a two-dimensional array and a drive output circuit that drives the pixels and reads out signals from the pixels,
the pixels including a first island-shaped semiconductor formed on a substrate,
the drive output circuit including at least one second island-shaped semiconductor formed on the substrate so as to be at the same height as the first island-shaped semiconductor,
the first island-shaped semiconductor including
a first semiconductor region formed in a bottom portion of the first island-shaped semiconductor,
a second semiconductor region formed on the first semiconductor region and composed of a semiconductor having a conductivity type opposite to that of the first semiconductor region or an intrinsic semiconductor,
a first gate insulating layer formed on an outer periphery of and on a lower portion of the second semiconductor region,
a first gate conductor layer formed so as to surround the first gate insulating layer,
a third semiconductor region formed in an outer peripheral portion of the second semiconductor region adjacent to the first gate conductor layer, the third semiconductor region being formed of a semiconductor having the same conductivity type as the first semiconductor region, and
a fourth semiconductor region formed on the third semiconductor region and the second semiconductor region and composed of a semiconductor having a conductivity type opposite to that of the first semiconductor region,
the second island-shaped semiconductor including
a fifth semiconductor region formed in a lower portion of the second island-shaped semiconductor,
a sixth semiconductor region formed on the fifth semiconductor region and composed of a semiconductor having a conductivity type opposite to that of the fifth semiconductor region or an intrinsic semiconductor,
a second gate conductor layer formed so as to surround a second gate insulating layer formed on an outer periphery of the sixth semiconductor region, and
a seventh semiconductor region formed on the sixth semiconductor region so as to be adjacent to the second gate conductor layer and be positioned above the second semiconductor region,
wherein the first gate conductor layer and the second gate conductor layer have bottom portions located on the same plane.

2. The solid-state imaging device according to claim 1, wherein the first gate conductor layer and the second gate conductor layer have the same height.

3. The solid-state imaging device according to claim 1, wherein the second gate conductor layer includes a third gate conductor layer formed so as to surround some of the second island-shaped semiconductors among a plurality of the second island-shaped semiconductors described above and a fourth gate conductor layer that is composed of a material different from that of the third gate conductor layer and formed so as to surround the second island-shaped semiconductors different from the second island-shaped semiconductors surrounded by the third gate conductor layer among the plurality of the second island-shaped semiconductors.

4. The solid-state imaging device according to claim 3, wherein the third gate conductor layer and the fourth gate conductor layer have heights different from each other.

5. The solid-state imaging device according to claim 3, wherein the third gate conductor layer and the fourth gate conductor layer have the same height.

6. The solid-state imaging device according to claim 1, wherein, in the second island-shaped semiconductor, the seventh semiconductor region is formed on the sixth semiconductor region and a conductor layer formed of a silicide layer or a metal layer is formed on the seventh semiconductor region.

7. The solid-state imaging device according to claim 1, wherein, in the second island-shaped semiconductor, a metal layer is provided so as to surround the sixth semiconductor region.

8. The solid-state imaging device according to claim 1, including the first island-shaped semiconductor, the second island-shaped semiconductor, and a third island-shaped semiconductor formed at the same height as the first and second island-shaped semiconductors,
  wherein at least one of the first gate conductor layer formed so as to surround the first island-shaped semiconductor and the second gate conductor layer formed so as to surround the second island-shaped semiconductor extends so as to surround the third island-shaped semiconductor, and
  at least one of the first gate conductor layer and the second gate conductor layer is electrically connected to a conductor layer formed inside the third island-shaped semiconductor and at a lower portion of the third island-shaped semiconductor.

9. The solid-state imaging device according to claim 8, wherein the conductor layer formed inside the third island-shaped semiconductor is connected, at a lower portion of the third island-shaped semiconductor, to at least one of the first semiconductor region and the fifth semiconductor region.

* * * * *